US008964470B2

(12) United States Patent
Lee

(10) Patent No.: US 8,964,470 B2
(45) Date of Patent: Feb. 24, 2015

(54) METHOD AND ARCHITECTURE FOR IMPROVING DEFECT DETECTABILITY, COUPLING AREA, AND FLEXIBILITY OF NVSRAM CELLS AND ARRAYS

(71) Applicant: Peter Wung Lee, Saratoga, CA (US)

(72) Inventor: Peter Wung Lee, Saratoga, CA (US)

(73) Assignee: Aplus Flash Technology, Inc., Fremont, CA (US)

( * ) Notice: Subject to any disclaimer, the term of this patent is extended or adjusted under 35 U.S.C. 154(b) by 0 days.

(21) Appl. No.: 14/037,356

(22) Filed: Sep. 25, 2013

(65) Prior Publication Data

US 2014/0085978 A1 Mar. 27, 2014

Related U.S. Application Data

(60) Provisional application No. 61/705,597, filed on Sep. 25, 2012, provisional application No. 61/710,573, filed on Oct. 5, 2012.

(51) Int. Cl.

| G11C 16/04 | (2006.01) |
|---|---|
| G11C 14/00 | (2006.01) |
| G11C 11/00 | (2006.01) |
| H01L 21/02 | (2006.01) |

(52) U.S. Cl.
CPC ......... *G11C 14/0063* (2013.01); *H01L 21/0262* (2013.01); *G11C 11/005* (2013.01)
USPC ............. 365/185.08; 365/185.07; 365/189.17

(58) Field of Classification Search
CPC .......................... G11C 11/005; G11C 14/0063
USPC ...................................... 365/185.08
See application file for complete search history.

(56) References Cited

U.S. PATENT DOCUMENTS

| 4,703,456 A | 10/1987 | Arakawa |
|---|---|---|
| 5,065,362 A | 11/1991 | Herdt et al. |
| 5,563,839 A | 10/1996 | Herdt et al. |
| 5,602,776 A | 2/1997 | Herdt et al. |
| 5,828,599 A | 10/1998 | Herdt |
| 5,903,561 A | 5/1999 | Kwon |
| 6,026,018 A | 2/2000 | Herdt et al. |
| 6,097,629 A | 8/2000 | Dietrich et al. |
| 6,285,586 B1 | 9/2001 | Lung et al. |
| 6,414,873 B1 | 7/2002 | Herdt |
| 7,110,293 B2 | 9/2006 | Jung |
| 7,164,608 B2 | 1/2007 | Lee |
| 7,269,054 B2 | 9/2007 | Kang et al. |
| 7,280,397 B2 | 10/2007 | Scheuerlein |
| 7,408,801 B2 | 8/2008 | Kang et al. |

(Continued)

*Primary Examiner* — Son Mai
(74) *Attorney, Agent, or Firm* — Raywell Group, LLC

(57) ABSTRACT

Several preferred embodiments of 1S1F 16T NVSRAM, 1S1F 20T NVSRAM, 1S2F 22T NVSRAM, 1S2F 14T NVSRAM cells are proposed, regardless of 1-poly, 2-poly, PMOS or NOS flash cell structures. Two separate sourcelines for the paired flash Strings are also proposed for easy adding ability for the NVSRAM circuit to detect the marginally erased Vt0 and marginally programmed Vt1 of the paired flash cell. By increasing an resistance added to common SRAM power line, the pull-down current through flash Strings to grounding source line can be made much larger than the pull-up current to improve SFwrite program operation. Simple method by increasing flash cell channel length to effectively enhance coupling area is applied to secure SRAM-to-Flash store operation under self-boost-program-inhibit scheme. 1S2F architecture also provide flexibility for alternate erasing and programming during both a recall and store operation.

47 Claims, 19 Drawing Sheets

(56) References Cited

U.S. PATENT DOCUMENTS

| | | |
|---|---|---|
| 7,505,303 B2 | 3/2009 | Ashokkumar et al. |
| 7,518,916 B2 | 4/2009 | Ashokkumar et al. |
| 7,539,054 B2 | 5/2009 | Ashokkumar et al. |
| 7,663,917 B2 | 2/2010 | Cuppens et al. |
| 7,688,612 B2 | 3/2010 | Lee et al. |
| 7,710,776 B2 | 5/2010 | Johal et al. |
| 7,760,540 B2 | 7/2010 | Still |
| 7,830,713 B2 | 11/2010 | Lee et al. |
| 7,859,899 B1 | 12/2010 | Shakeri et al. |
| 7,890,804 B2 | 2/2011 | Mann et al. |
| 8,018,768 B2 | 9/2011 | Shih et al. |
| 8,036,032 B2 | 10/2011 | Scade et al. |
| 8,072,811 B2 | 12/2011 | Lee et al. |
| 8,120,959 B2 | 2/2012 | Lee et al. |
| 8,120,966 B2 | 2/2012 | Lee |
| 8,149,622 B2 | 4/2012 | Lee et al. |
| 8,331,134 B2 | 12/2012 | Chiu et al. |
| 8,331,150 B2 * | 12/2012 | Hsu et al. .................. 365/185.08 |
| 8,861,271 B1 * | 10/2014 | Zain et al. ................. 365/185.07 |

* cited by examiner

CAM Logic State

| MC1 | MC2 | Logic |
|---|---|---|
| Vt0 | Vt1 | '0' |
| Vt1 | Vt0 | '1' |
| Vt1 | Vt1 | 'X' |

NVSRAM Operation Table

| MC1 | MC2 | Logic | SQ | SQB | SRAM Vdd | SWL | FSwrite | SG1 | FWL | SG2 | FSL/ML |
|---|---|---|---|---|---|---|---|---|---|---|---|
| Vt0 | Vt1 | '0' | 0 | 1 | VDD | VSS | VSS | VDD | VDD | VDD | VSS |
| Vt1 | Vt0 | '1' | 1 | 0 | VDD | VSS | VSS | VDD | VDD | VDD | VSS |
| Vt0 | Vt1 | '0' | 1 | 0 | VDD | VSS | VDD | VDD | VDD | VDD | VSS |
| Vt1 | Vt0 | '1' | 0 | 1 | VDD | VSS | VDD | VDD | VDD | VDD | VSS |

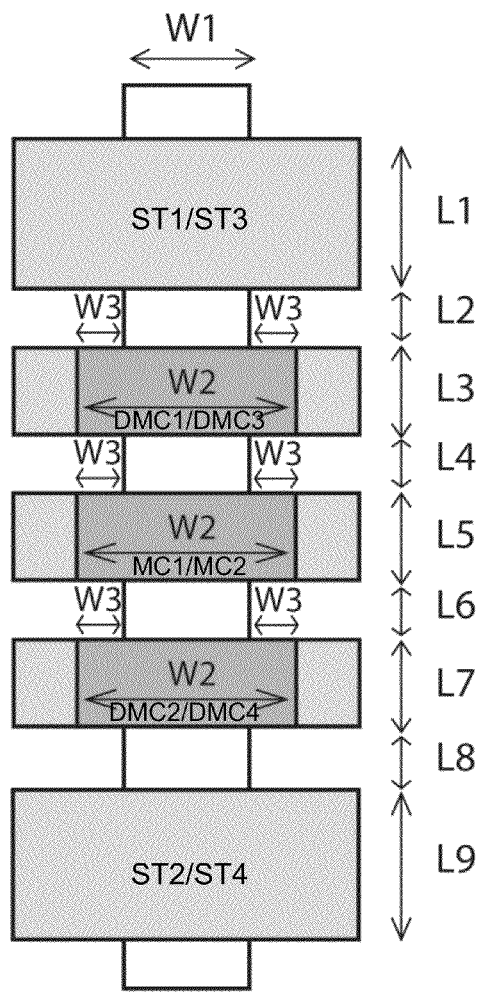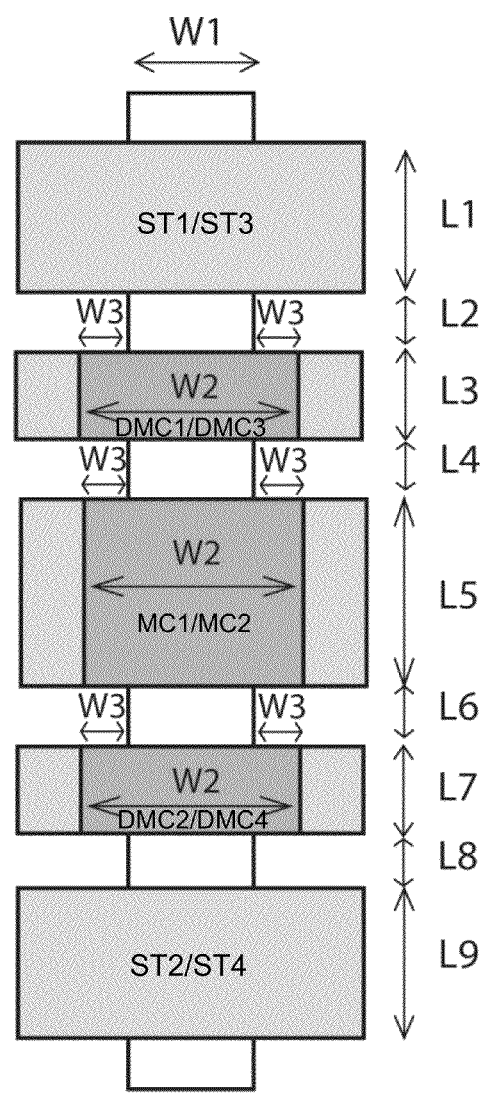
FIG. 10A
Prior Art
FIG. 10B

METHOD AND ARCHITECTURE FOR IMPROVING DEFECT DETECTABILITY, COUPLING AREA, AND FLEXIBILITY OF NVSRAM CELLS AND ARRAYS

CROSS-REFERENCES TO RELATED APPLICATIONS

This application claims priority to U.S. Provisional Patent Application No. 61/705,597, filed on Sep. 25, 2012 and U.S. Provisional Patent Application No. 61/710,573, filed on Oct. 5, 2012, commonly assigned, and hereby incorporated by reference in its entirety herein for all purposes.

Additionally, this application is related to U.S. Pat. Nos. 8,120,966, 8,120,959, 8,072,811, 7,688,612, 7,830,713, 8,233,320, 8,149,622, and U.S. patent applications Ser. No. 13/135,220, 13/199,785, 13/199,527, 13/888,134, 12/807,997, 61/275,148, 61/277,208, 61/574,632, and 61/687,227, commonly assigned, which are incorporated by reference herein for all purposes.

Furthermore, this application is related to U.S. Pat. Nos. 5,065,362, 7,164,608, and 7,760,540.

TECHNICAL FIELD OF THE INVENTION

The present invention relates to several improved techniques and methods for operating the next-generation low-power Non-Volatile Static Random-Access Memory (NVSRAM) cells and arrays. More particularly, the present invention provides a NVSRAM memory having a flash cell marginal-Vt detector for a fast screening out defective bits existed or hide in the extremely high-density NVSRAM array. By examples, the present invention also provides a method for increasing coupling area for self-boosting program-inhibit cell operation and a NVSRAM cell structure having at least two flash paired cells associated with each SRAM cell for cell recall/store flexibility, but it would be recognized that the invention may have other applications.

Today, most of three fundamental NVSRAM operations include FSwrite (Write from Flash into SRAM), SFwrite (Write from SRAM into Flash), and SRAM operations. But due to this unique differential-type paired-cell structure can be flexibly configured into both identical or opposite data polarity between each SRAM and each corresponding Flash cell, the least AC peak current and VDD noise, faster search of the failed or weak bits of whole NVSAM array can be done in a very reliable way even down to 1.2V VDD operation.

To improve the FN Self-Boosting-Program-Inhibit (SBPI) operation, Flash cell's channel length is substantially increased in layout in BL-direction so that the coupling gate area is increased to increase the coupling charges from Poly2-gate to its floating-channel, regardless PMOS or NMOS cell, or 2-poly or 1-poly flash cells. Accordingly, either the voltage drop across the tunnel oxide layer between flash's poly1 floating-gate layer and its channel region of a 2-poly flash cell or voltage drop across the tunnel oxide layer between the 1-poly flash's Nitride layer and its channel region is increased for the FN-channel program operation to meet the program time spec, irrespective of PMOS or NMOS cell structures. In this approach, the flash cell's channel width is preferably not increased. The whole program or erase high voltage then is shifted more heavily on single word line (WL) rather than the split voltage of both flash channel bit line and flash gate word line. In this manner, faster, more reliable and lower-power NVSRAM operations are achieved.

Additionally, the present invention provides a new NVSRAM's application to keep Flash old data and new updated data simultaneously before power-down period with a novel NVSRAM cell comprising one SRAM cell and at least two flash cells to solve the above issues.

BACKGROUND OF INVENTION

The present invention generally relates to NVSARM cell and array operations with improvements in defect detectabilities, coupling ratio for using SBPI scheme for Program and Program-Inhibit operations, and flexibility of flash data handling.

Using a typical 16T1b NVSRAM cell as an example, the issues about defective or weak bits exits in the extremely high density NVSRAM array with power voltage down to 1.2V VDD are presented here. The 16T1b NVSRAM cell includes one LV CMOS SRAM cell, one HV paired 3T Flash strings and one Bridge circuit sandwiched by above two circuits. The Flash's program and erase operations are preferably done by using the mainstream low-current, highly scalable, FN-channel tunneling scheme like NAND flash technology today.

The three key regular operations of the NVSRAM cell are explained below.

1) FSwrite operation: It is defined as "a write operation performed from each Flash cell into each corresponding SRAM cell of each NVSRAM cell simultaneously and collectively upon power up cycle.
2) SFwrite operation: It is defined as "a write operation performed from each SRAM cell into each corresponding Flash cell of each NVSRAM cell simultaneously and collectively upon the power loss cycle.
3) SRAM operations: The SRAM operations include the regular Read and Write operations of each SRAM cell with each Flash cell electrically un-present.

After whole NVSRAM memory chip erase operation via a FN-channel erasing scheme, all flash cells within the NVSRAM memory will be in an identical threshold voltage level $Vt0 \leq -2.0V$. But after the repeated stress of the long program and erase cycles, the Vt0 value might get harder below $-2.0V$. The Vt0 value will be getting higher to near or above 0V. Those cells correspond to so-called marginally erased cells. It is desired to have an extra function for the NVSRAM array, without having an overhead to add any extra transistors, to be able to detect those marginally erased cells in fast speed. In particular, the quick Vt0-check in unit of flexible sizes of Bit, Page and Chip is desired so that the addresses of the marginal-Vt0 NVSRAM cells can be quickly reported at I/O pins.

5) Similarly, after whole NVSRAM memory program operation via a FN-channel programming scheme, all paired flash cells in NVSRAM memory will be programmed to a desired logic states of "0" and "1". For either "0" or "1" logic states, the Vt of one bit of the paired flash cells, MC1 and MC2, would be programmed to a threshold voltage level $Vt1 \geq 2.0V$. And the other bit of the paired flash cells would remain at Vt0. But after the repeated stress of the long program and erase cycles, the Vt1 value might get harder above 2.0V. These cells are so-called marginally programmed cells, which Vt1 value will be getting lower to near 1.0V. Therefore, it is again very desirable, for production screen control and process yield improvement, to have another extra function for performing a quick Vt1-check in unit of flexible sizes of Bit, Page and Chip without having an overhead to add any extra transistors. This extra function should be able to provide a report of the addresses of the marginal-Vt1 cells at I/O pins.

In another aspect of NVSRAM cells and arrays, traditionally in order to improve FN Channel-Program and Channel-Erase operations for NVSRAM cell, Flash cell's Poly1-wing width is increased in layout in WL-direction to increase coupling ratio from poly2-gate to Poly1 -floating gate. Basically, it induces more HV charges by flash gate (WL) in the flash floating channel so that the SBPI HV is sufficient high for correcting NVSRAM operation. But increasing the flash cell's WL program voltage only results in the enhancement of the Program operation rather than Program-Inhibit operation. Higher WL voltage also results in higher WL stress and lower P/E endurance cycles for the NVSRAM cell. An alternative approach is to increase the overlapping area of Poly1-Poly2 in field region of each flash cell layout by keeping the flash cell channel length and width the same but increasing the Poly1-wing length to extend to field region between two adjacent BLs. But practically, this is not suitable for today's high-density NAND and other flash cells because there is no Poly1-wing extending over the field region in extremely high-density Flash design wherein the Poly1 layer is usually made self-aligned to active layer for cell size reduction. Therefore, more practical and economical approach is desired for increasing flash cell coupling ratio for those NVSRAM cell and the like using the SBPI scheme for Program and Program-Inhibit operations.

In yet another aspect of the NVSRAM cells and arrays, one drawback is lack of flexibility in association with a basic "store" operation followed by a "recall" operation to properly handle required erase operation on Flash part of the NVSRAM cell. In particular, typical NVSRAM cell has one Flash part per each SRAM part. After a regular power-on period and when VDD becomes stable, and during a regular SRAM operation, would the NVSRAM memory need to perform an erase operation on the Flash part so that they can be immediately ready for next auto-store or the software-store or hard-store commands can come in any time soon? Additionally, after a regular power-down or a sudden power loss, the final critical data stored in the SRAM part have to be stored into the Flash part with a very short time (e.g., 8 ms as specified in the regular NVSRAM spec). If the Flash part of the NNVSRAM was not being erased before the power-down, then it is forced to perform the erase first and then program second. The erase needs to an on-chip negative charge HV pump circuit to supply a VNN voltage and the program needs another on-chip positive charge pump to supply a VPP voltage. All these operations take time and have to be operated under the dropping VDD voltage, thus it makes the "store" operation very risky and unreliable. Besides, more NVSRAM system applications have a need to keep the flash data before the power-down happens. In view of this drawback, new NVSRAM cell with more built-in flexibility in store/recall handling is desired.

In view of above drawbacks in conventional NVSRAM operation and demand for new NVSRAM's applications to fast detect marginally erased/programmed cells, to enhance Program/Program-Inhibit operations, and to keep Flash old data and new updated data, the present invention of the preferred NVSRAM cell and array is aimed at providing one or more practical solutions or economic options over the prior arts.

SUMMARY OF THE INVENTION

The present invention relates to several improved techniques and methods for operating the next-generation low-power Non-Volatile Static Random-Access Memory (NVSRAM) cells and arrays. More particularly, the present invention provides a NVSRAM memory having a flash cell marginal-Vt detector for a fast screening out defective bits existed or hide in the extremely high-density NVSRAM array. By examples, the present invention also provides a method for increasing coupling area for self-boosting program-inhibit cell operation and a NVSRAM cell structure having at least two flash paired cells associated with each SRAM cell for cell recall/store flexibility, but it would be recognized that the invention may have other applications.

In an embodiment of the present invention, a preferred high-gain marginal-Vt or defective-Vt detection solution is provided for the desired operations of FSwrite and SFwrite of the 1S1F 16T NVSRAM cell and array, regardless of the cell types of 1-poly SONOS, or 2-poly floating-gate, or PMOS, or NMOS cell structures. The 1S1F 16T NVSRAM cell can be configured into a high-gain Differential Amplifier (DA) with a compact layout by flexibly adding one high-resistance Res-VDD per each VDD power line per row of SRAM cell array, or per few rows, or per whole chip. Each DA comprises one paired Driver devices in the paired FStrings and one paired Load devices in each SRAM cell. The paired Driver devices are the paired FStrings in series with one Bridge MOS device and with one common input of FWL. The paired FStrings preferably have two separate FSL lines for easy implementation for all operations including Vt0 and Vt1 marginal Vt detection. The paired Load devices comprise one paired PMOS-load (Pload) devices in I1 and I2 Inverters in each SRAM. The DA has one paired outputs, SQ and SQB, of each SRAM.

In another embodiment, the present invention provides a preferred high-gain marginal-Vt or defective-Vt detection solution for the preferred for the desired operations of FSwrite and SFwrite of 1S2F 22T NVSRAM cell and array, regardless of PMOS or NMOS cell, or 1-poly or 2-poly flash cell. Each 22T NVSRAM cell comprises one 6T SRAM cell with two 6T Flash cells and one Bridge circuit alternating connect to each SRAM. Again, the preferred 22T NVSRAM of the present invention comprises two DAs. The first DA is established between the shared SRAM with the first Flash cell, while the second DA is established between the shared SRAM cell and the second Flash cell; Two DAs are never working on the same time except the erased Vt0 can be done simultaneously on both flash cells.

In yet another embodiment, the present invention proposes a solution for flexibly detecting the marginally erased Vt0 cells for flash cells MC1 and MC2 in the forms of Bit-by-Bit, Page-by-Page, or whole 1S1F 16TNVSRAM chip, or 1S2F 22TNVSRAM chip. The marginal Vt0 detection procedure can be started from one of two SRAM logic states, "0" and "1", in first step with FWL starts from 0V and then reverse SRAM logic state in 2nd step to screen out whole chip's low marginal Vt0 cells with a location identified. It also provides a solution for flexibly detecting the marginally programmed Vt1 cells for MC1 and MC2 in the forms of Bit, Page-by-Page, or whole 1S1F 16TNVSRAM chip, or 1S2F 22TNVSRAM chip. The marginal Vt1 detection procedure can be started from the "X" Flash state with both MC1 and MC2 at Vt1 initially and one of two SRAM logic state, "0" and "1", in first step, and then by varying FWL voltage from 2V to screen out whole chip's low marginal Vt1 cells with a location identified.

In still another embodiment, the present invention provides a flexible Flash decoder of NVSRAM memory. The number of FWL lines of the Flash decoder for the 16T NVSRAM flash part can be just one FWL only or up to the maximum number of M FWLs as the total number of WLs of same-density SRAM in a 1S1F 16T NVSRAM memory. For a 1S2F 22T NVSRAM, at least two separate groups of FWLs, FWLo and FWLe, for two separate flash groups. Similarly, the number of FWL lines of each group can be flexibly varied from one to M.

In an alternative embodiment, the present invention proposes a preferred 16T NVSRAM cell or a 20T NVSRAM cell that uses a SBPI scheme for the FN-channel Program and Program-Inhibit operations, regardless of PMOS or NMOS cell, 2-poly floating-gate type or 1-poly charge-trapping cell.

In another alternative embodiment, the present invention is to configure each NVSRAM cell into a high-gain Differential Amplifier (DA) with a paired drivers made of a paired 3T or 5T FStrings and the paired load made of a paired PMOS devices in the paired Inverters of each SRAM plus a ResVDD resistor connected to the power supply lines of the paired Inverters of each SRAM. The gain of this DA is preferably increased during the FSwrite operation by making ResVDD higher resistance to the VDD line of each SRAM. Each FString comprises three or five transistors connected in series with one Flash cell, MC1 or MC2, being sandwiched in the middle of FString.

In yet another alternative embodiment, the present invention is to substantially increase flash cell's coupling ratio by increasing the width of the Poly1-wing extending into field by more than 1.5 folds. The substantial increase of the coupling ratio between Poly2 and Poly1 would substantially enhance both FN channel-erase and FN channel-program operations of the present invention so that a shorter time for the preferred NVSRAM's critical operations, Erase and Program (SF-Write) can be achieved without increasing HV stress by increasing FWL's+/−HV.

In still another alternative embodiment, the present invention is to substantially increase Flash cell's channel length in each FString of NVSRAM cell so that more SBPI charges can be generated during SBPI operation. As a result, a superior SBPI operation performed on the non-selected programmed flash cell can be achieved without any process changes.

In yet still another alternative embodiment, the present invention provides a method for substantially increasing the spacing between MC flash cell and two adjacent HV Selected transistors, ST1 and ST2, so that the GIDS-induced electrons would have less chance to be injected into MC flash cell's floating-gate layer. But the spacing increase between each ST and each MC flash cell needs to be compensated by the flash cell's channel length increase. As a result, the P/E cycles of Flash cell in each FString of each NVSRAM cell can be increased.

In a specific embodiment, the present invention is to insert one dummy flash cell, DMC, between Flash cell and the top ST1 and the bottom ST2 transistors so that the GIDS-induced hot electrons generated from ST transistors leaking into MC cells can be interrupted during the HV SBPI operation. The channel length of DMC1 is preferably made of 1λ channel length with a 1λ spacing between top DMC and ST1 and the 1λ spacing between DMC2 and the bottom ST2 transistor for size reduction. The biased conditions of the FN-channel program and FN channel erase operations of DMC1 and DMC2 are kept the same as the regular MC1 and MC2 cells.

In another specific embodiment, the present invention is to keep the Selected ST2 gate to VSS after SFwrite HV SBPI discharge operation to avoid the peak DC sink current happening between each SRAM paired nodes of SQ or SQB nodes and each paired source nodes of FSL1 or FSL2. The SBPI HV in one of paired non-selected program MC flash cell's channel is preferably discharged through the Bridge circuit to the paired nodes of SQ and SQB with the initial logic state of each SRAM prior to SFwrite operation.

In yet another specific embodiment, the present invention is to increase the channel lengths of ST1, ST2, ST3 and ST4 devices as VDD decrease. It is because the preferred biased condition for FSL1 and FSL2 is VDD during the SFwrite FN-channel program operation. In this operation, the non-selected programmed MC cell's channel would be coupled to SBPIz7V, then the $V_{DS}$ drop of above four ST devices follows the following equation.

$$V_{DS} = V_{SBPI} - VDD.$$

If VDD becomes smaller, then the $V_{DS}$ of each ST increases, thus the channel length of four ST have to be increased accordingly to avid punch-through to sure the success of SBPI operation.

In another embodiment, the present invention provides a 14T NMOS 2-poly NVSRAM cell structure that comprises one 6T SRAM cell with two 4T 2-poly Flash Strings. Each 2-poly Flash string comprises 4T transistors with two 1-poly Select HV transistors on top and bottom and two 2-poly NMOS flash transistors sandwiched in between. Two 2-poly NMOS flash cells are preferably programmed and erased alternatively for storing the old and new data from SRAM during both Recall and Store operations.

In yet another embodiment, the present invention provides another 14T NMOS 1-poly SONOS type NVSRAM cell structure that comprise one 6T SRAM cell with two 4T 1-poly Flash Strings. Each 1-poly NMOS Flash string comprises 4T transistors with two 1-poly Select HV transistors on top and bottom and two 1-poly NMOS flash transistors sandwiched in between. Two 1-poly NMOS flash cells are preferably programmed and erased alternatively for storing the old and new data from SRAM during both Recall and Store operations.

In still another embodiment, the present invention provides a 14T PMOS 2-poly NVSRAM cell structure that comprises one 6T SRAM cell with two 4T 2-poly PMOS Flash Strings. Each 2-poly PMOS Flash string comprises 4T transistors with two 1-poly Select HV transistors on top and bottom and two 2-poly NMOS flash transistors sandwiched in between. Two 2-poly PMOS flash cells are preferably programmed and erased alternatively for storing the old and new data from SRAM during both Recall and Store operations.

In an alternative embodiment, the present invention provides a preferable erase operation done on one of the flash cell of each NVSRAM cell during the Recall operation after automatic power-up cycle. Another flash cell of each NVSRAM cell still keeps the old SRAM data, which is saved during the last power-down cycle. By contrast, when the NVSRAM is powered down again, then the newly updated SRAM cells' data would be stored into the erased flash cells. In next power-up cycle, the erased operation would be done on another flash cell that stores the old SRAM data. And whole process would be repeated automatically, regardless of 14T PMOS or NMOS NVSRAM cells.

In another alternative embodiment, the present invention discloses a preferable erase and program operations of both flash cells in each 14T NVSRAM cell. These two flash cells are preferably programmed and erased with a same set of biased conditions and same FN channel tunneling program and SBPI schemes. The SBPI stands for the Self-Boosting-Program-Inhibit method.

In still another alternative embodiment, the present invention also discloses one Flash X-decoder that generates two separate WLs for FSL1 and FSL2 for two separate groups of flash bits in each NVSRAM cell. Each FSL1 and FSL2 can be further divided into a plurality of Nx FSL1 pages and Nx FSL2 pages for a small Flash page for independent program and erase in units of page.

In yet still another alternative embodiment, the present invention discloses an on-chip NVSRAM cell bit that is used to toggle "Recall and Store" operations between two flash bits of each NVSRAM cell during the repeat power-up and power-down cycles. The number of flash bits can be flexibly extended to N with one SRAM bits. The channel lengths of first and second flash bits can be flexibly increased more than 1λ so that the SBPI effect can be greatly increased for secure program-inhibit without degrading the program performance. The 1λ means the smallest layout design rule.

In a specific embodiment, the present invention provides a Nonvolatile SRAM (NVSRAM) cell with marginal threshold level detection. The NVSRAM cell includes a SRAM cell comprising a first inverter having a first output node and a second inverter having a second output node. The first output node and the second output node are coupled to a first word line and two bit lines respectively via a first access transistor and a second access transistor. The first inverter and the second inverter are respectively associated with a first current and a second current sharing a common power line configured to add an adjustable resistor. Additionally, the NVSRAM cell includes a first Flash cell having a first string having at least a first flash transistor sandwiched by a first select transistor and a second select transistor connected in series from a first drain terminal to a first source terminal, and also having a second string having a second flash transistor sandwiched by a third select transistor and a fourth select transistor connected in series from a second drain terminal to a second source terminal. The first select transistor and the third select transistor are commonly gated by a first select control signal. The second select transistor and the fourth select transistor are commonly gated by a second select control signal. The first flash transistor and the second flash transistor have their gates commonly coupled to a second word line signal to control a third current through the first string from the first drain terminal to the first source terminal and a fourth current through the second string from the second drain terminal to the second source terminal. The first source terminal and the second source terminal are respectively coupled to a first source line and a second source line.

The first drain terminal and the second drain terminal of the first Flash cell are coupled to either the first output node or the second output node of the SRAM cell to form a differential amplifier having one paired driver device made by the first string and the second string of the first Flash cell and one paired load device made by the first inverter and the second inverter of the SRAM cell. The second word line are configured to provide one paired input of the differential amplifier for yielding one paired output respectively to the first output node and the second output node. The adjustable resistor are configured to be substantially larger than an effective resistance of either the first string or the second string for providing a greater than 3:1 ratio between a largest one of the third current and the fourth current over a largest one of the first current and the second current when writing a first logic state associated with a combination of two threshold levels of the first flash transistor and the second flash transistor into a second logic state associated with a combination of either a VSS=0V or a low-voltage VDD level at the first output node and the second output node.

In another specific embodiment, the present invention provides a 14-transistor NVSRAM cell for flexible recall and store operations. The 14T NVSRAM cell includes a SRAM cell comprising a first inverter associated with a first data node and a second inverter associated with a second data nod. The first data node and the second data node being coupled to a first word line and two complementary bit lines respectively via a first access transistor and a second access transistor. The 14T NVSRAM cell further includes a Flash cell comprising a first string from a first drain terminal to a first source terminal and a second string from a second drain terminal to a second source terminal. The first string includes a first select transistor, a first flash transistor, a second flash transistor, and a second select transistor connected in series. The second string includes a third select transistor, a third flash transistor, a fourth flash transistor, and a fourth select transistor connected in series. The first flash transistor and the third flash transistor are commonly gated by a second word line signal. The second flash transistor and the fourth flash transistor are commonly gated by a third word line. The first select transistor and the third select transistor are commonly gated by a first select control signal. The second select transistor and the fourth select transistor are commonly gated by a second select control signal. The first source terminal and the second source terminal are respectively coupled to a first source line and a second source line.

The first drain terminal and the second drain terminal of the Flash cell are respectively coupled to the first data node or the second data node of the SRAM cell. A first pair of the first flash transistor and the third flash transistor and a second pair of the second flash transistor and the fourth flash transistor are alternatively erased and programmed for storing either an old logic data or an updated logic data associated with a combination of two voltage levels at the first data node and the second data node of the SRAM cell during both a Store operation and a Recall operation.

In an alternative embodiment, the present invention provides a NVSRAM chip capable of flexibly detecting defect bits in the unit of bit, page, and chip. The NVSRAM chip includes an NVSRAM memory array formed by M×N NVSRAM cells in a matrix of M rows and N columns. Each NVSRAM cell includes a SRAM cell coupled to a Flash cell having two flash strings corresponding to a pair of flash transistors. Each row forms a page commonly associated with a SRAM word line, a VSS ground line. a SRAM Vdd power line, a pair of select gate controls, a Flash word line, and a Flash source line dividable to connect respectively to the two flash strings in each Flash cell in each NVSRAM cell. Each column is coupled with a pair bit lines coupled respectively to a first output node and a second output node of each SRAM cell in each NVSRAM cell. The NVSRAM chip further includes a SRAM X-decoder coupled with the NVSRAM memory array from X-direction to provide per each row a decoding signal to the SRAM word line and a grounding line. Additionally, the NVSRAM chip includes a Flash X-decoder coupled with the NVSRAM memory array from X-direction to provide per each row a variable signal for the Flash word line, control signals for the pair of select gate controls, and one or two bias levels to the dividable Flash source line, and to provide an on-chip VDD power supply configured to couple with each SRAM Vdd power line via a PN-paired device as an adjustable resistor. The NVSRAM chip further includes a Match decoder coupled to the Flash X-decoder for further providing a match signal per each row sent through the Flash source line to each NVSRAM cell. Furthermore, the NVSRAM chip includes a Y-decoder configured to provide per column a pair of decoding bits for the pair of bit lines. Moreover, the NVSRAM chip includes a SRAM sense amplifier, an I/O buffer device, a CE buffer device, an OE buffer device, and an Address buffer. The NVSRAM memory array is subjected to a flash status verification operation configured for flexibly detecting and defect bits of one or more flash transistors and screening out low marginal threshold level cells in the whole NVSRAM memory array.

Many benefits can be achieved through applications of the present invention. Due to unique differential-type paired-cell structure the NVSRAM cell according to an embodiment of the present invention can be flexibly configured into both identical or opposite data polarity between each SRAM cell and each corresponding Flash cell. The least AC peak current and VDD noise is resulted. Faster search of the failed or weak bits of whole NVSRAM array can be done in a very reliable way even down to 1.2V VDD operation. Based on the method to increase flash cell's channel length in Y-direction according to another embodiment of the present invention, coupling ratio between Poly2 and Poly1 of the flash cell can be substantially enhanced more practically and economically for those NVSRAM cell using SBPI scheme for Program and Program-Inhibit operations. The novel SBPI method of larger flash channel length can be applied to the other memory cells such as the 12T NVSRAM cell, NAND-based 3T EEPROM cell, regardless of 1-poly charge-trapping SONOS or MONOS cell or 2-poly floating-gate cell, or PMOS cell or NMOS cell. In view of new NVSRAM's application for keeping Flash old data and new updated data simultaneously before power-down period, a novel NVSRAM cell structure comprising one SRAM associated with at least two flash cells is disclosed to provide more flexibilities and options for better operating fundamental functions of the next-generation NVSRAM memory system. These and other benefits may be described throughout the present specification and more particularly below.

BRIEF DESCRIPTION OF THE DRAWINGS

FIG. 10A is an exemplary 2-poly layout of a 5T FString cell with a normal flash channel length in a prior art;

FIG. 10B is an exemplary 2-poly channel-field layout of a 5T FString cell with an enlarged flash channel length and normal dummy flash channel lengths according to a specific embodiment of the present invention.

DETAILED DESCRIPTION OF THE INVENTION

Figure 1A:
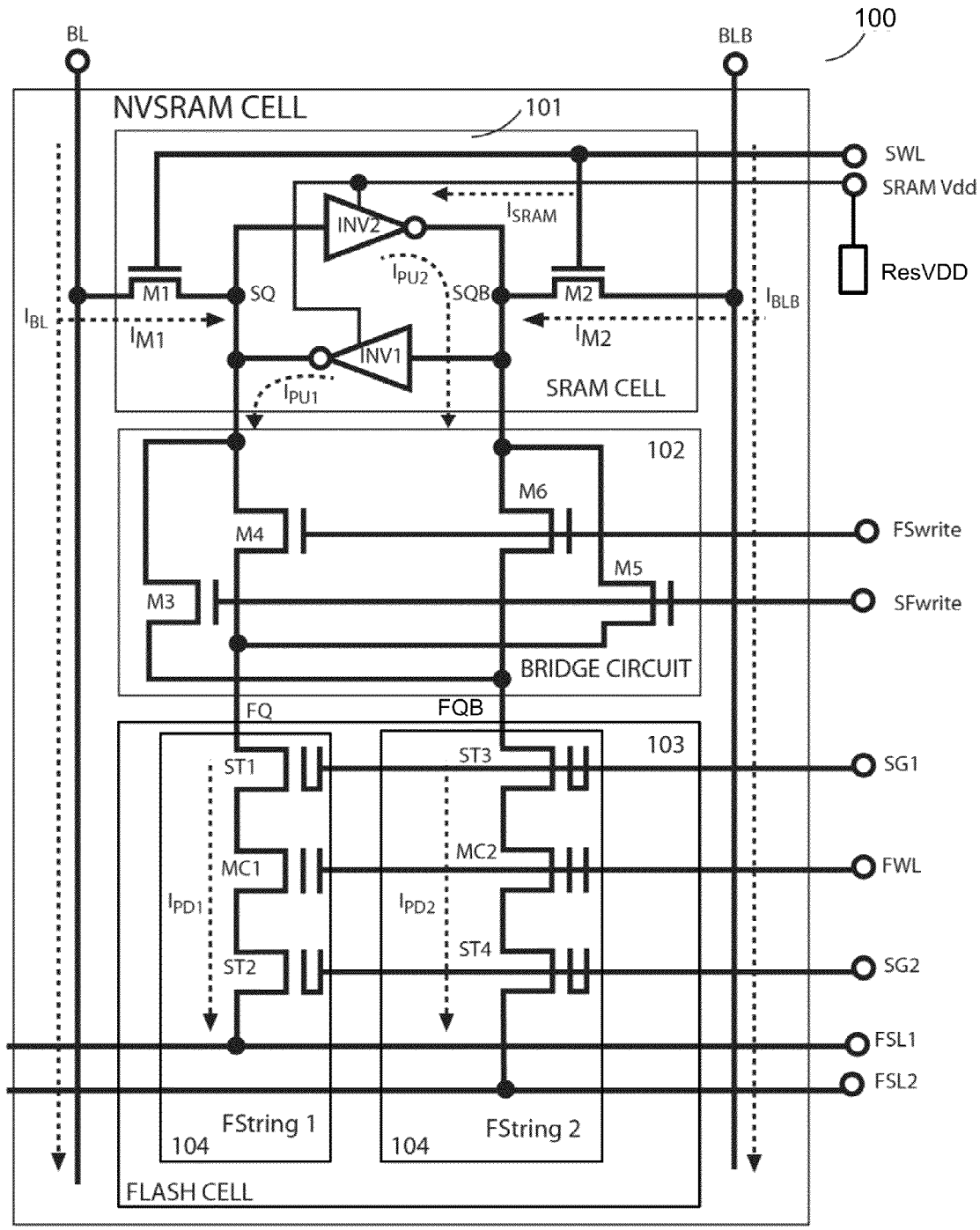
FIG. 1A is a circuit diagram of a 2-poly 16T NMOS NVSRAM cell with a high-resistance SRAM VDD line and a paired flash cells each with a separate source line according to an embodiment of the present invention.

FIG. 1A shows a 2-poly NMOS 16T NVSRAM cell circuit in accordance with an embodiment of the present invention. This diagram is merely an example, which should not unduly limit the scope of the claims herein. As shown, the 2-poly NMOS 16T NVSRAM cell 100 comprises one LV 6T SRAM cell 101 with a paired nodes SQ and SQB respectively coupled to one LV 4T NMOS Bridge circuit 102 along with one flash circuit 103. The SRAM cell 101 is configured to couple two drain nodes of PMOS transistors in respective two Inverters, INV1 and INV2, to a SRAM Vdd power line, which connects to a resistor ResVDD, proposed in this invention for improving pull-down current over pull-up current during FSwrite operation and fast detecting weak bits with marginal-Vt. The Flash circuit 103 comprises two 3T HV 2-poly NMOS Flash strings 104 which includes three NMOS transistors connected in series with three separate gate signals of SG1, FWL, and SG2 but with an independent source line FSL1 or FSL2. With a support of the Bridge circuit 102 and independent FSL (FSL1/FSL2) sensing line as a match line, a hidden "compare" function can be performed between each 6T SRAM cell 101 and each 6T Flash cell 103 without an overhead of adding any extra transistors.

As shown, the FString1 further comprises three HV NMOS devices: 1-poly select transistor ST1, 2-poly flash transistor MC1, and 1-poly select transistor ST2, with a top drain node of FQ connected to a LV NMOS M4 and another LV NMOS M5 of half of the Bridge circuit 102 and a source node connected to a separate source line termed as FSL1. Similarly, the FString2 further comprises another three HV NMOS devices: 1-poly select transistor ST3, 2-poly flash transistor MC2, and 1-poly select transistor ST4, with a top drain node of FQB connected to the other two sources nodes of LV NMOS M3 and M5 of another half of the Bridge circuit 102 and another source node connected to another source line termed as FSL2.

This is a preferred 1S1F NVSRAM cell in accordance with the present invention. The term of 1S1F means the circuit of each 16T NVSRAM cell comprises one LV CMOS 6T SRAM cell 101 and only one HV NMOS 6T Flash cell 103 joined by one LV NMOS 4T Bridge circuit 102. Like the 16T NVSRAM cell with one common FSL disclosed in U.S. patent application Ser. No. 13/888,134, programming any logic states to the paired flash cells MC1 or MC2, a HV of +18V is applied to the common FWL gate with one flash's channel held at 0V with another flash's channel coupled to an Inhibit voltage ≥7V. A low-current FN-channel tunneling effect would be induced between the poly2 control-gate tied to FWL and the poly1 floating-gate on the flash cell with channel held at 0V so that electrons will be injected into the cell's floating-gate from the cell's channel of one of MC1 and MC2. But for those MC1 and MC2 flash channel voltages being coupled to a value ≥7V, then the FN-tunneling effect will get inhibited, thus the flash cell threshold voltage Vt remains at its initial state of Vt0, which is the erased Vt with a preferred value ≤−2.0V.

This Program-Inhibit scheme is called the SBPI, Self-Boosted-Program-Inhibit. Before SFwrite Program operation, both flash cells MC1 and MC2 have to be erased simultaneously and will be ended with same value of Vt0≤−2.0V. The SFwrtie Program time is aimed at about 1 ms. In each SFwrite Program, two logic states of "1" and "0" of each SRAM cell can be performed on each paired flash cells, MC1 and MC2, as described below with four terminologies, SFwrite0 and SFwrtie1, SRAM0 and SRAM1. Under the SFwrite operation, the preferred set of the biased conditions of the present invention are SFwrite=VDD, FSwrite=VSS and SWL=VSS.

SFwrite0: It is defined to write each SRAM0 data into each Flash pair of MC1 and MC2. The SRAM0 is defined as a Logic "0" state of SRAM with SQ=VSS and SQB=VDD. After a successful SFwrite0 operation, MC1=Vt0 and MC2=Vt1 which shows the flash logic is identical to SRAM0 logic.

SFwrite1: It is defined to write each SRAM1 data into each Flash pair of MC1 and MC2. The SRAM1 is defined as a Logic "1" state of SRAM with SQ=VSS and SQB=VDD. After a successful SFwrite0 operation, MC1=Vt1 and MC2=Vt0 which shows the flash logic is opposite to SRAM0 logic.

Several current flow paths of each NMOS 16T NVSRAM cell 100 of the present invention are disclosed including $I_{SRAM}$, $I_{BL}$, $I_{BLB}$, $I_{PU1}$, $I_{PU2}$, $I_{PD1}$ and $I_{PD2}$. The current $I_{SRAM}$ is drawn from a SRAM Vdd power line that can be coupled to each SRAM cell in an NVSRAM array. The SRAM Vdd power line includes a resistor ResVDD which is adjustable to set at a sufficiently high value so that a pair of currents $I_{PU1}$, $I_{PU2}$, can be reduced when the paired Flash data is recalled to SRAM respectively into two nodes SQ and SQB. The resistor ResVDD value is at least larger than combined series resistance for the 3T FString1 or FString2 plus a LV bridge circuit transistor (one from M3 through M6) so that the pulling-down programming current $I_{PD1}$ or $I_{PD2}$ can be controlled by FWL gate to pass through FString1 or FString2 to the grounded FSL1 or FSL2 during FSwrite operation. The currents $I_{BL}$ and $I_{BLB}$ are associated with data reading for the SRAM cell.

Figure 1B:
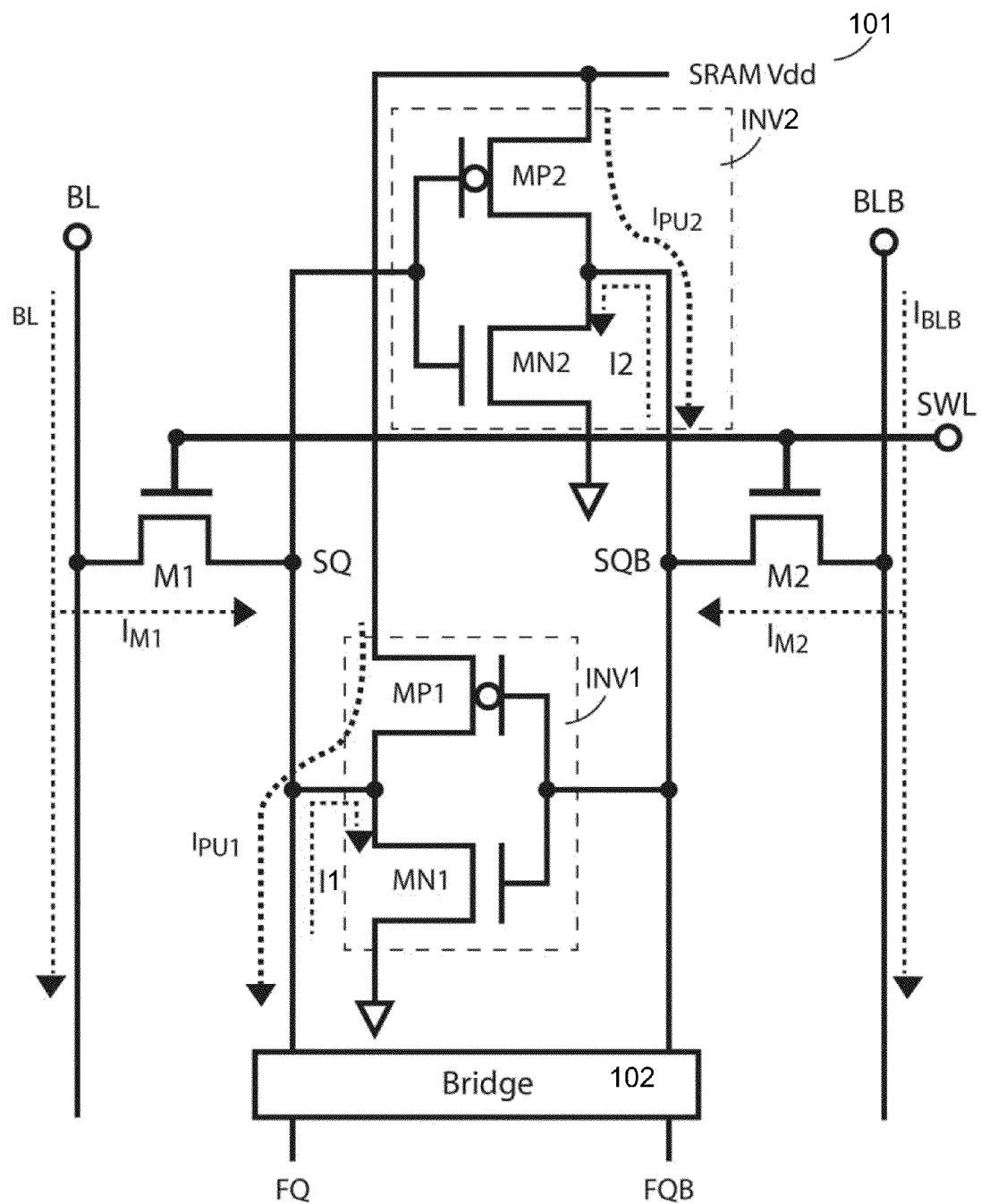
FIG. 1B is a detailed circuit of two Inverters with two NMOS WL-pass transistors in each SRAM cell of the NVSRAM cell in FIG. 1A.

FIG. 1B shows a detailed circuit of the LV 6T SRAM cell 101 shown in FIG. 1A. The LV 6T SRAM cell 101 comprises two Inverters, INV1 and INV2, coupled with two NMOS WL-pass transistors, M1 and M2. The paired storage nodes of each SRAM cell are denoted as SQ and SQB. The SQ is the output node of bottom Inverter, INV1, made of a P-type transistor MP1 and a N-type transistor MN1. The SQB is the output node of top Inverter, INV2, made of a P-type transistor MP2 and a N-type transistor MN2 respectively.

As shown, it also indicates the $I_{PU2}$ is generated by a MP2 of INV2 and $I_{PU1}$ comes from MP1 of INV1. Each paired nodes of SQ and SQB of each SRAM cell (in an NV SRAM array) are coupled to the paired nodes of FQ and FQB of each paired FStrings through the Bridge circuit 102 (see FIG. 1A). The $I_{M1}$ is the current flowing through M1 transistor, while the $I_{m2}$ flows through M2. The $I_{BL}$ is the current flowing from a bit line BL, while the $I_{BLB}$ is the current flowing from a complementary bit line BLB. The current flowing through MN1 to VSS is called I1, while the current flowing through MN2 to VSS is called I2.

The common VDD node of INV1 and INV2 are connected to a resistor, denoted as ResVDD, which runs as a SRAM Vdd power line in X-direction in parallel to other control lines such as FSwrite, SFwrite, SG1, FWL, SG2 and FSL. The current from node BL is denoted as $I_{BL}$, while the current from node BLB is denoted as $I_{BLB}$. Typically, three cases of current flows of $I_{PD}$ ($I_{PD1}$ and $I_{PD2}$, see FIG. 1A) are disclosed for detecting the marginal erased cell's Vt0 and marginal programmed cell's Vt1 cells as illustrated below.

1) Current flow case1: There are two current paths with a condition of $I_{M1}=I_{M2}=0$ by grounding SWL=0V and enabling SRAM Vdd power line through the resistor ResVDD.
    a) One current path flows from the SRAM Vdd power line through MP1, through the Bridge circuit 102 and FString1 to FSL1.
    b) Another path flows from the SRAM Vdd power line through MP2, through the Bridge circuit 102 and FString2 to FSL2.
2) Current flow case2: There are two current paths with a condition of $I_{PU1}=I_{PU2}=0$ by shutting off SRAM Vdd power line and turning on both M1 and M2 with SWL=VDD
    a) One current path flows from BL through M1, Bridge 102, and FString1 to FSL1.
    b) Another current path flows from BLB through M2, Bridge 102, and FString2 to FSL2.
3) Current flow case3: There are two current paths with a condition of $I_{M1}=I_{M2}=0$ by shutting off M1 and M2 transistors with SWL=0V.
    a) One current path flows from FSL1 through FString1, Bridge 102 and MN1 (I1) to VSS
    b) Another current path flows from FS2 through FString2, Bridge 102 and MN2 (I2) to VSS.

These current flow cases are adopted in one or more NVSRAM cell/array key operations for fast detection of weak bits, enhancement of couple ratio in Program and Program-Inhibit operation, and improvement in flexibility for store/recall operation will be explained below.

Figure 1C:
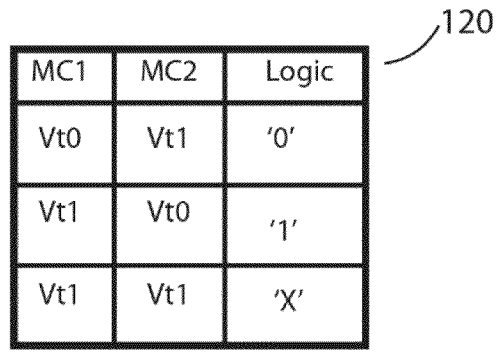
FIG. 1C shows a table that contains three preferred logic states of "0", "1" and "X" in accordance with three preferred assignments of combinational Vts for a paired NMOS flash cells in a paired strings as shown in FIG. 1A.

FIG. 1C shows a table that contains three logic states of "0", "1", and "X" in accordance with three assignments of combinational flash cell threshold voltages Vts according to an embodiment of the present invention. As shown, Table 120 contains three preferred logic states of "0", "1" and "X" in accordance with three preferred combinations of Vts for the paired NMOS flash cells, MC1 and MC2 in FIG. 1A. Three logic states of each NMOS 16T NVSRAM cell are defined below.
  a) Logic state "0": FString1 conducts more current than FString2 with $I_{PD1}>I_{PD2}$ to set SQ=VSS and SQB=VDD.
  b) Logic state "1": FString2 conducts more current than FString1 with $I_{PD2}>I_{PD1}$ to ser SQ=VDD and SQB=VSS.
  c) Logic state "X": Both FString1 and FString2 conduct the same current with $I_{PD1}=I_{PD2}$.
Therefore, it is uncertain to go "0" or "1" state.
In FSwrite operation, the logic "0" and "1" states of the paired FQ and FQB would be written into the SQ and SQB in same polarity by the biased condition of FSwrite=VDD and SFwrite=VSS. The logic state of "X" cannot be loaded onto SQ and SQB of the SRAM cell with certainty because $I_{PD1}=I_{PD2}$.

Figure 1D:
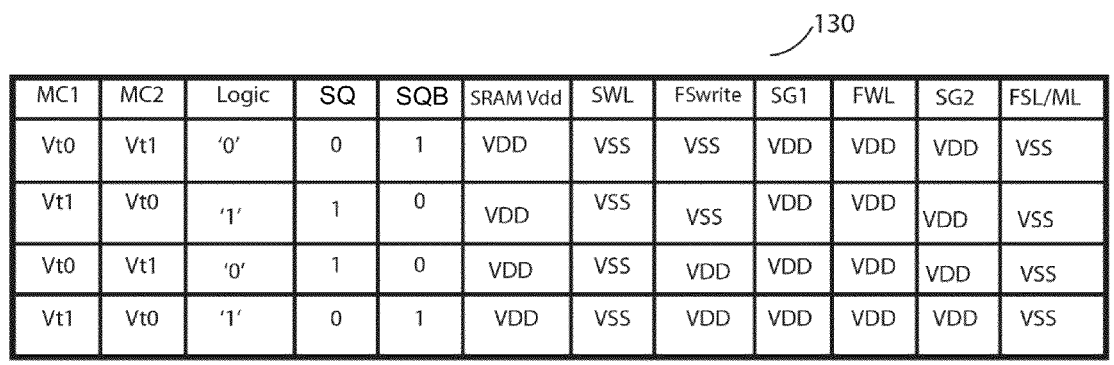
FIG. 1D shows a table of several preferred sets of bias conditions for key operations such as FSwrite and SFwrite in accordance with the 2-poly 16T NMOS NVSRAM cell circuit shown in FIG. 1A.

FIG. 1D shows a table that discloses several preferred sets of bias conditions for key operations in accordance with the NMOS 16T NVSRAM cell circuit shown in FIG. 1A of the present invention. In an embodiment, the table 130 includes preferred biased conditions to achieve the same polarity data loading between SRAM and Flash data during FSwrite operation. In order to achieve above goal, the logic Bridge circuit 102 has to be swapped to make a reverse-polarity data write during SFwrite operation. In other words, the VSS SQ and VDD SQB would write Vt1 and Vt0 into FQ of MC1 and FQB of MC2 respectively. Conversely, the VDD SQ and VSS SQB would write Vt0 and Vt1 into MC1 and MC2 through reverse paths of FQB and FQ respectively.

As a summary, the SFwrite operation would make the reverse polarity write between the Flash pairs and each SRAM paired node. In other word, SQ=FQB and SQB=FQ. By contrast, the FSwrite would make the same polarity write between the Flash pairs and each SRAM paired nodes. In other words, FQB=SQB and FQ=SQ.

Electrically, there are three kinds of Differential Amplifiers (DAs) of this preferred NVSRAM cell as shown in FIG. 1A:
  1) The first Differential Amplifier 1 (DA1): A hidden circuit between the paired FStrings and a paired PMOS Loads in each SRAM as shown in FIG. 1B.
     A) One paired Drivers: Fstring1 and Fstring2
     B) One paired PLoad devices, MP1 in INV1 and MP2 in INV2.
     C) One paired inputs: MC1 gate and MC2 gate.
  Unlike the traditional DA having two different inputs coupled to a pair of transistors with identical-Vt, the DA1 cell structure has one common input, FWL, coupled to a paired flash transistors stored with a ΔVt in MC1 and MC2.
     D) Two digital outputs: SQ and SQB
  The successful operation of DA1 task for FSwrite operation is only completed when each SRAM logic-state data is being set in accordance with the stored Flash logic-state data in same polarity, regardless of the initial SRAM state.
  The DA1 is comprised of a paired PMOS-load, MP1 and MP2 transistors in Inverters INV1 and INV2. The two drivers are the paired 3T Flash strings.
  The M4 and M6 transistors are connecting the SQ node to FString1 and SQB node to FString2 when FSwrite=VDD and SFwrite=VSS. Under this biased conditions, the M3 and M5 devices in Bridge are out of circuit for operating DA1 circuit.
  2) The second Differential Amplifier 1 (DA2): A hidden circuit between the paired FString-drivers and a paired pull-up PMOS Loads in each paired BL and BLB. The SRAM part would not be included in this operation. Thus, the resistor ResVDD has to be cut off from on-chip VDD line to result in the high-impedance state on SRAM's PLoad.
     A) One paired Driver: Fstring1 and Fstring2.
     B) One paired PLoad device, MP1 in INV1 and MP2 in INV2.
     C) One paired input: MC1 gate and MC2 gate.
  Unlike the traditional DA having two different inputs coupled to a pair of transistors with identical-Vt, the DA2 cell structure has one common input, FWL, coupled to a paired flash transistors stored with a ΔVt in MC1 and MC2.
     D) Two digital outputs: SQ and SQB
  The successful operation of DA2 task is to selectively pull the paired BL and BLB node to VSS for detecting the marginal-Vt cells. The marginal-Vt state is defined as either the marginal-Vt0 (Not erased enough) or the marginal-Vt1 (not programmed enough).
  3) The third Differential Amplifier 1 (DA3): A new circuit being constructed between FString pairs and a paired PMOS Load in FSL1 and FSL2. The SRAM cell is to provide the choice of nodes of FQ and FQB to VSS.
     A) One paired Driver: Fstring1 and Fstring2
     B) One paired PLoad device: MP1 in INV1 and MP2 in INV2.
     C) One paired inputs: MC1 gate and MC2 gate.
  Unlike the traditional DA, has two different inputs coupled to a pair of transistors with identical-Vt, the DA3 cell structure has one common input FWL, coupled to a paired flash transistors stored with a ΔVt in MC1 and MC2.
     D) Two digital outputs: FSL1 and FSL2.
  The successful operation of DA3 task is to selectively pull the sensing line of FSL1 node to VSS, or the sensing line of FSL2 node to VSS or both FSL1 and FSL2 nodes to VSS.

Now, the detailed operations of FSwrite and SFwrite of the preferred 1S1F 2-poly NMOS 16T NVSRAM cell shown in FIG. 1A will be explained below.
  1) FSwrite operation:
  Case1: FSwrite for writing Flash Logic "0" state into SRAM.
  The operation of Case1 is illustrated with reference to DA1 explained above. There are two ways to write each Flash stored logic state into each SRAM. One way is to write each Flash cell logic data into each corresponding SRAM cell with the same polarity in Logic state by setting FSwrite=VDD and SFwrite=VSS. The other way is to write each Flash cell logic data into each corresponding SRAM cell with opposite polarity in Logic state by setting FSwrite=VSS and SFwrite=VDD. The FSwrite operation is under LV (low voltage VDD) operation. All related control signals of SG1, FWL, FSL1, FSL2 and SWL are all coupled to LV VDD.
  In application, FSwrite operation is performed upon a power-on period. For a LV operation like 1.2V VDD, this operation is preferably done after VDD stabilizes at 1.2V for more reliable operation. The SRAM data can be any logic state such as "0" or "1" before performing the FSwrite for this invention. In other words, the SRAM initial states becomes don't-care and will be set into a logic state "X" in accordance with the stored states in each Flash cell.

Assume the paired Flash cells store the Logic "0" state, then MC1=Vt0 and MC2=Vt1 with the ΔVt=Vt1 −Vt0. Under this "0" logic state along with a voltage of FWL higher than Vt0 and Vt1, then a current flow will happen on both FStrings with $I_{PD1}>I_{PD2}$ because gate-to-source voltage drop $V_{GS1}$ of MC1 is greater than $V_{GS2}$ of MC2 where $V_{GS1}=V_{FWL}-Vt0$ and $V_{GS2}=V_{FWL}-Vt1$. But ΔI ($I_{PD1}>I_{PD2}$) can be reduced to hurt the gain (of DA1) because the resistance of the PLoad of MP1 and MP2 cannot be easily increased in traditional operation due to layout size limitation in NVSRAM cells of the prior art.

In view of above drawbacks and for achieving more accurate and reliable FSwrite operation, the power line of PLoads MP1 and MP2 are connected to a SRAM Vdd power line and then connected to a resistor ResVDD that is adjustable to give a very large resistance with only requiring a small device and without changing individual SRAM cell structure. In order to achieve that result, the most reliable way is to reduce the strength of $I_{PD1}$ because we cannot increase current $I_{PD1}$ without increasing the widths of ST1, MC1 and SG2 in FString1 104 and M4 in Bridge circuit 102. But for a compact NVSRAM design, the width increase of above said four NMOS devices is not practical. Similarly, to reduce the size of MP1 is not practical either. Even the minimum size of MP1 is used, the pull-up current $I_{PD1}$ is still too big. As a result, with the addition of resistor ResVDD with high resistance would make more margin ΔI by making $I_{PD1}>>I_{PU}$ than making $I_{PD1}>I_{PD2}$.

Now, it has been shown that it is desirable for NVSRAM operation to make ResVDD in high resistance value with a small device. In view of above consideration to increate the ratio of $I_{PD1}/I_{PU1}$=Ratio1, for a reliable FSwrite LV operation down to 1.2V VDD, the Ratio ≥10 is preferred in this NVSRAM design. In order to increase the Ratio above 10, a P-N paired device, PNM, is proposed to be used for connecting each SRAM Vdd power line in each row to an on-chip VDD line in a NVSRAM memory array (to be seen in FIG. 5). The channel width and channel length ratio is preferred to be made small as 1/10, for example, $(W/L)_P=(W/L)_N \leq 1/10$ so that the resistance of ResVDD can be much larger than the above said FString1 resistance associated with a larger $I_{PD1}$. But this may make the device too big of a larger area. One other preferred approach is to make the smaller PNM by connecting the P-gate=VDD−Vtp−ΔV and N-gate=VSS. This manner would bias the PMOS device in barely on-state ($V_{GS}=\Delta V \leq 0.5V$) and NMOS in off-state, thus the resistance of ResVDD becomes big for fast, low-power and reliable FSwrite operation.

Case2: FSwrite for writing Flash Logic "1" state into SRAM.

Assume the paired Flash cells store the Logic "1" state, then MC1=Vt1 and MC2=Vt0 with the ΔVt=Vt1−Vt0. Under this "1" logic state along with a voltage of FWL higher than Vt0 and Vt1, then a current flow will happen on both FStrings with $I_{PD1}<I_{PD2}$ because $V_{GS1}$ of MC1 is greater than $V_{GS2}$ of MC2 where $V_{GS1}=V_{FWL}-Vt0$ and $V_{GS2}=V_{FWL}-Vt1$.

But the current difference margin ΔI associated with $I_{PD1}<I_{PD2}$ can be secured for reliable setting by making resistor ResVDD a high-resistance as explained above. Thus the DA1 operation for the FSwrite for Logic "1" operation can be achieved reliably without a problem for LV operation even down to 1.2V VDD.

2) SFwrite operation:

This operation is illustrated without reference to DA1, DA2 as explained above because for SFwrite operation, it does not involve any current flows between SRAM and Flash. It is the FN-tunneling effect happens to either MC1 or MC2 during SFwrite operation. That means a Program operation and self-boosting Program-Inhibit operation. The first step involves of disconnecting SRAM Vdd power line from the ResVDD by turning off MOS transistor associated with the PN-paired device with a gate voltage. Thus any DC leakage from each SRAM cell's paired nodes SQ, SQB to two FStrings' paired nodes FSL1 and FSL2 through the Bridge circuit and FString1 and FString2. Of course, SG1 can also be set to VSS to cut off the leakage path.

There are two ways to write each SRAM stored logic states into each Flash cell. One way is to write each SRAM cell into each corresponding Flash cell with the same polarity in Logic state by setting Bridge circuit control FSwrite=VSS and SFwrite=VDD. The other way is to write each SRAM cell logic data into each corresponding Flash cell with opposite polarity in Logic state by setting Bridge circuit control FSwrite=VDD and SFwrite=VSS. The FSwrite operation is also under LV operation. All related control signals of SG1, FWL, FSL1, FSL2 and SWL are all coupled to LV. Set SG1=VSS, FWL=VSS and SG2=VSS, FSL1=FSL2=VDD, to initialize voltages on the channels of two Flash transistors MC1 and MC2 prior to stating the SFwrite FN-tunneling program.

In order to write the same Logic-state from SRAM SQ and SQB nodes into MC1 and MC2, the Bridge circuit conditions is set SFwrite=VDD and FSwrite=VSS. Totally, three logic states of "0", "1" and "X" will be explained below.

A) Write the Logic state "0" into Flash pairs with SRAM Logic state "0", SQ=VSS and SQB=VDD.

Under the condition of SQ=VSS and SQB=VDD and SFwrite=VDD, then SQ of VSS would be coupled to the drain node, FQB, of FString2. Conversely, the SQB of VDD would be coupled to the drain node, FQ, of FString1. The other biased conditions are SWL=VSS, FSwrite=VSS, SG1=VDD, FWL=VPP and SG2=VSS and FSL1=FSL2=VSS where VPP ramps from 0V to 20V to induce the Self-Boosting-Program-Inhibit (SBPI) for the selected cell. Since MC 1 channel initial voltage is VDD−Vt (about 1V) that would be changed to above 7V by SPBI coupling if the MC1 coupling charges are sufficient to be distributed among the top active drain node and source node plus its channel region. This is done by ramping up FWL from initial VDD to VPP, a positive HV (ranging from 15V to 20V), depending on the coupling ratio from the gates to channels of MC1 and MC2 flash cells. Thus the program is inhibited and MC1 Vt stays at its initial Vt which is the erased level of Vt0. Conversely, the MC2 channel initial voltage is VSS and will stay at VSS, thus creating a HV drop between MC2 cell channel and MC2 FWL. As a result, MC2 would get programmed and Vt is increased to Vt1 (which is preferably set to be ≥2.0V) within 1 ms cycle time.

After the completion of the FN-channel program operation, MC1=Vt0 and MC2=Vt1. Thus, the paired flash cells' logic state "0" matches SRAM's logic state of "0".

B) Write the Logic state "1" into Flash pairs with SRAM Logic state "1", SQ=VDD and SQB=VSS.

Under this condition, SQ=VDD and SQB=VSS. With SFwrite=VDD, then SQ of VDD would be coupled to the drain node, FQB, of FString2. Conversely, the SQB of VSS would be coupled to the drain node, FQ, of FString1. The other biased conditions are SWL=VSS, FSwrite=VSS, SG1=VDD, FWL=VPP and SG2=VSS and FSL1=FSL2=VSS where VPP ramps from 0V to 20V to induce the Self-Boosting-Program-Inhibit (SBPI). Since MC2 channel initial voltage is VDD−Vt that would be coupled to above 7V, thus the program is inhibited, thus MC2 Vt stays at its initial Vt which is the erased Vt of Vt0. Conversely, the MC1 channel initial voltage is VSS and will stay at VSS, thus creating a HV drop between MC1 cell channel and MC2 FWL. As a result, MC1 would get programmed and Vt is increased to Vt1 within 1 ms cycle time.

After the completion of the FN-channel program operation, MC1=Vt1 and MC2=Vt0.

Thus, the paired Flash cells' logic state "1" matches SRAM's logic state of "1".

C) Write "X" state into flash pairs with SRAM in either "0" or "1" state.

There are two cases to write X state for MC1 and MC2. That means to write same Vt into both flash cells, e.g., MC1=MC2=Vt1.

Case 1: Two steps to write flash cell into "X" state staring from writing "0" state first and then is followed by writing "1" state.

When SRAM "0" state (SQ=VSS and SQB=VDD) has been successfully written into Flash by first program to get MC1=Vt0 and MC1=Vt1 with Bridge circuit at biased conditions of SFwrite=VDD and FSwrite=VSS. Now, just change SFwrite=VSS but FSwrite=VDD, then the second program is performed again. This time only MC1 would get programmed because SQ=VSS is coupled to the MC1's channel while SQB=VDD is coupled to MC2 to get program-inhibited. As a result, MC1 will be programmed to Vt1 but MC2 would stay Vt1. Thus both MC1 and MC2 cells get programmed to same Vt1.

Case 2: Two steps to write flash cell into "X" state staring from writing "1" state first and then is followed by writing "0" state.

In this case, after SRAM logic "1" state (SQ=VDD and SQB=VSS) has been successfully written to make MC1=Vt1 and MC2=Vt0 in the first program, then also by similarly changing SFwrite=VSS and FSwrite=VDD, the second program can be performed again. After completion, the MC2=Vt1.

Conclusion: For a "X" state writing both MC1=MC2=Vt1, it can be achieved be performing two FN-channel program cycles by swapping the Bridge circuit, regardless from writing "0" or writing "1" state first.

The descriptions about DA1, DA2 and DA3 operations are mainly for SFwrite operation and SFwrite operation. While all of them are related to the Erase and Program and Program-Inhibit and Read operations between the data transferring between SRAM and Flash. All of the descriptions above were based on the successful Program and Erase operations. But a way to verify if the Erase and Program operation are performed unsuccessfully is needed. Embodiments for fast detection of defect or weak bits and screening to provide their addresses would be found throughout the specification and more particularly below using a reference of FIG. 8.

Figure 8:
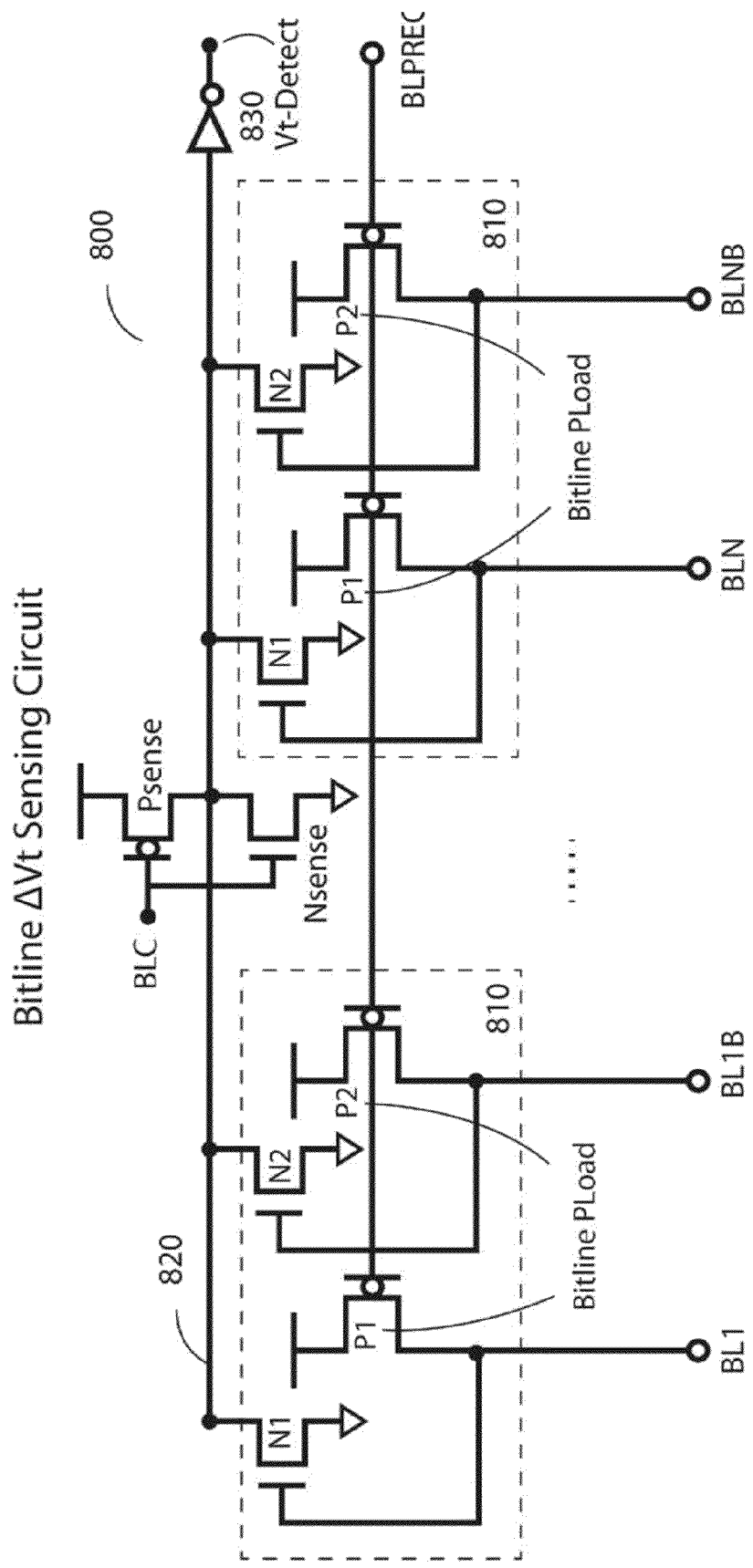
FIG. 8 is a diagram of a ΔVt-detector circuit designated as a bitline sensing circuit for NVSRAM cell according to yet another specific embodiment of the present invention.

FIG. 8 shows a bitline ΔVt sensing circuit for the operation of detecting marginal-Vt0 and marginal-Vt1 flash cells with a hope to identify their locations in the NVSRAM array according to a specific embodiment of the present invention. This diagram is merely an example, which should not unduly limit the scope of the claims herein. As shown, the bitline ΔVt sensing circuit 800 includes a Psense device coupled to an Nsense device. The Psense device is a PMOS device with its gate tied to a control signal of BLC. The source node of the Psense device is connected to a node 820 connecting via a sensing line to a plurality of NMOS device pairs N1 and N2. The 820 sensing line connects via an Inverter 830 to a node of VtDetect. The paired gates of NMOS device N1 and N2 are preferably tied to a paired BLs, i.e., one selected from BL1 and BL1B through BLN and BLNB, and are further respectively connected to a corresponding PMOS device pairs P1 and P2 whose gates are tied to a common node of BLPREC. The PMOS device pairs P1 and P2 are bitline PLoads.

For a normal SRAM operation, this bitline ΔVt sensing circuit 800 will be shut off to remain in high-impedance state without conducting any current by coupling the signal of BLPREC=BLC=VDD, thus signal of VtDetect=VDD because the Nsense device pulls node 820 to VSS.

In Marginal-Vt detection operation, BLC=VSS, thus node 820 sensing line is pre-charged to VDD, then signal of VtDetect=VSS and all BLN and BLNB are also pre-charged to VDD by coupling node BLPREC=VDD−Vtp−ΔV to increase the resistance of P1 and P2. The ΔV≤0.5V is preferred to make the P1 and P2 in smaller layout. The current flowing out from both PLoads P1 and P2 has to be much less than the currents $I_{nn}$ and $I_{PD2}$ flowing through two FStrings of each Flash cells.

Whenever a paired Flash cell, MC1 and MC2, stores the right Vt0, then $I_{PD1}>0$ and $I_{PD2}>0$. Due to the high-gain established by the drivers of paired flash strings, FString1 and Fstring2 with the paired BL and BLQ high-resistance PLoad, P1 and P2, both BLM and BLMB nodes would be pulled to near VSS (see FIG. 8). Thus all NMOS device pairs N1 and N2 would be biased into non-conduction state. Whenever all M pairs of N1 and N2 are being shut off, then node 820 sensing line will return to VDD to bring the signal of VtDetect to VSS (see FIG. 8). Conversely, as long as one NVSRAM cell's paired flash cell Vt is not at Vt0 level, the corresponding BLN or BLNB would remain at VDD to pull down the sensing line 820 to ground and make node VtDetect to VDD to notify the failure of Vt0 in a page-erase operation or a chip-erase operation. The drawback of this approach is that the locations of individual detection of weak or defective flash cells in each row or page cannot be identified.

In a specific embodiment, bit-by-bit Vt0-detection and an identified location can be achieved. Unlike the conventional NVSRAM cell having two FStrings but only one FSL line. The present NVSRAM cell structure has two separate FSLs, FSL1 and FSL2 (see FIG. 1A). After the whole chip NVSRAM erase operation, all paired flash cells are supposed to be erased to same Vt0 simultaneously within 1 ms to 20 ms, depending on the total memory density. This is done by applying a HV 20V to FWL if there is only one FWL in whole NVSRAM array, regardless of 16T or 22T, or 1S1F or 1S2F, PMOS or NMOS cell, 1-poly or 2-poly cells.

Then the first step after Erase operation is to load all SRAM data with either logic "0" or logic "1" and shut off the SRAM PLoads of PMOS devices, MP1 and MP2, in corresponding INV1 and INV2 by disconnecting the SRAM VDD line from on-chip VDD line. As a result, the searching of marginal NVSRAM bits can be performed in unit of bit, page and chip.

Next there are two approaches to detect the marginal-Vt0 cells. Since after chip erase, all Flash cells are erased to be Vt0 level which is preferably set to be −2.0V. Therefore, both FString1 and FString2 will conduct respective $I_{PD1}$ and $I_{PD2}$ with the biased condition of SG1=FWL=SG2=VDD with FSL1=FSL2=VSS. If the SRAM cell is loaded with a logic state of "0", then SQ=VSS and SQB=VDD. In this case, there would be a current flow of $I_{PD2}$ from MP2 of INV2 to and flow of $I_{PD2}$ flowing through FString2. But there would be no current flow of $I_{PU1}$ from MP1 of INV1 and flow of $I_{PD1}$ through FString1. But once current flow occurs between MP2 and FString2, there would be a voltage ratio between SRAM's MP2 device and FString2. Normally, FString2 resistance would be much higher than MP2. Thus the node of SQB would be set between VDD and VSS that also causes leakage current flow between MP1 and FString1. As a result, the initial stored state of each SRAM would end with an uncertain state and lost. Therefore, using above differential amplifiers of DA1, DA2 and DA3 would fail to detect the marginal Vt0.

In view of this drawback, a new approach according to a specific embodiment of the present invention is proposed by applying FSL1 and FSL2 with different voltages, giving a $\Delta V_{FSL}$. The value of $\Delta V_{FSL}$ can be very flexible but is preferred to be below 0.5V. This 0.5V is preferably designed to be less than the Vt level of MN1 in INV2 and MN1 in INV1.

After Erase operation, starting marginal-Vt0 detection by loading all SRAM cells with a logic "0" state in the beginning. Next, applying one of the following voltage conditions to the paired FSL1 and FSL2: a) FSL1=0.5V with FSL2=0V, b) FSL1=0V with FSL2=0.5V, and other signals for SG1, SG2, FWL, with $\Delta V_{FSL}$=0.5V. For example, SG1=SG2=VDD, but FWL=0V, and set ResVDD at a high resistance. Now, DA1 is used to detect the marginal-Vt0 cells. In case a) bias setting above, the FString2's FSL1 voltage is higher than FString1's FSL2 voltage, making $I_{PD1}$ smaller than $I_{PD2}$. As a result, all SRAM logic "0" state would be flipped into the logic "1" state if MC2's Vt0~−0.5V. For those marginal-Vt0 cells, MC2's Vt0 could be >0V (i.e., being unsuccessfully erased) then the corresponding SRAM will remain at the logic "0" state.

The next step is to read out all SRAM cells in the NVSRAM array from every location. Those locations of marginal-Vt0 cell in MC1 would be identified, thus the redundant circuit will be used to fix the failed one. The FWL voltage can also be continuously increased above 0V, until all SRAM cells are flipped to logic "1" states. The final FWL voltage provides the information of highest (unsuccessfully erased) Vt0 (>0V) in the NVSRAM array. Since DA1 gain is very high, thus the final word line voltage $V_{FWL}$ would be substantially equal to the highest Vt0 level of MC1 to be reported.

Similar to find out the marginal-Vt0 in MC1 cell, the searching of low marginal-Vt0 cells of MC2 can be continued. In this case, all SRAM cells should be loaded with logic "1" state with SQ=VDD and SQB=VSS. Then in the case b) above, the bias is set with FSL1=VSS but FSL2=0.5V. As explained in Logic "0" case, the SRAM of Logic "1" would be flipped into Logic "0" state if properly erased MC1 <0V. Then reading out all SRAM cells' data to find out which cells are not be flipped would indicate those cells are the marginal-Vt0 MC2 cells. To find out what are the true Vt0 of those failed marginal cells, the FWL voltage again can be increased to see at what FWL voltage all SRAM cells can be being flipped to "0" states. Then the highest Vt0 cells can be identified with a location to be reported.

Since the above marginal-Vt0 detecting can be performed to identify all bits, it can be used to find out if more bits in same page or column and that would make the redundant circuits utilized in more economic and scientific and fast manner. Note, $\Delta V_{FSL}$>0.5V can be used too.

Lastly, the marginal-Vt1 detection can be performed in the same manner as the marginal-Vt0 detection approach. But the steps start with programming all MC1 and MC2 in "X" state with Vt1. In other words, the Vt1 margin test starts after all flash cells are programmed into "X" state. Therefore the only difference of Vt1 and Vt0 margin test is Vt value. Vt1 is 2.0V but Vt0 is −2.0V. Therefore, FWL is not started from 0V. Instead, it starts from 2.0V with similar $\Delta V_{FSL}$=0.5V. Then the SRAM cells are loaded with "0" state with FSL2=0V but FSL1=.5V. If any MC1 Vt1 is less than 2V, then due to DA1 high-gain, the $I_{PD2}$ will start to conduct current and flip SRAM logic state from "0" state to "1" state as explained before. As a result, the marginal-Vt1 of MC2 cells can be identified and reported. The MC1 marginal-Vt1 cells can be also continued to be identified as well. As a result, the whole chip's marginal-Vt1 cells in both MC1 and MC2 can be flexibly and easily and quickly identified.

Combining reporting marginal-Vt0 and marginal-Vt1 cells in MC1 and MC2, the redundant circuit of NVSRAM cells can be economically utilized.

Figure 2:
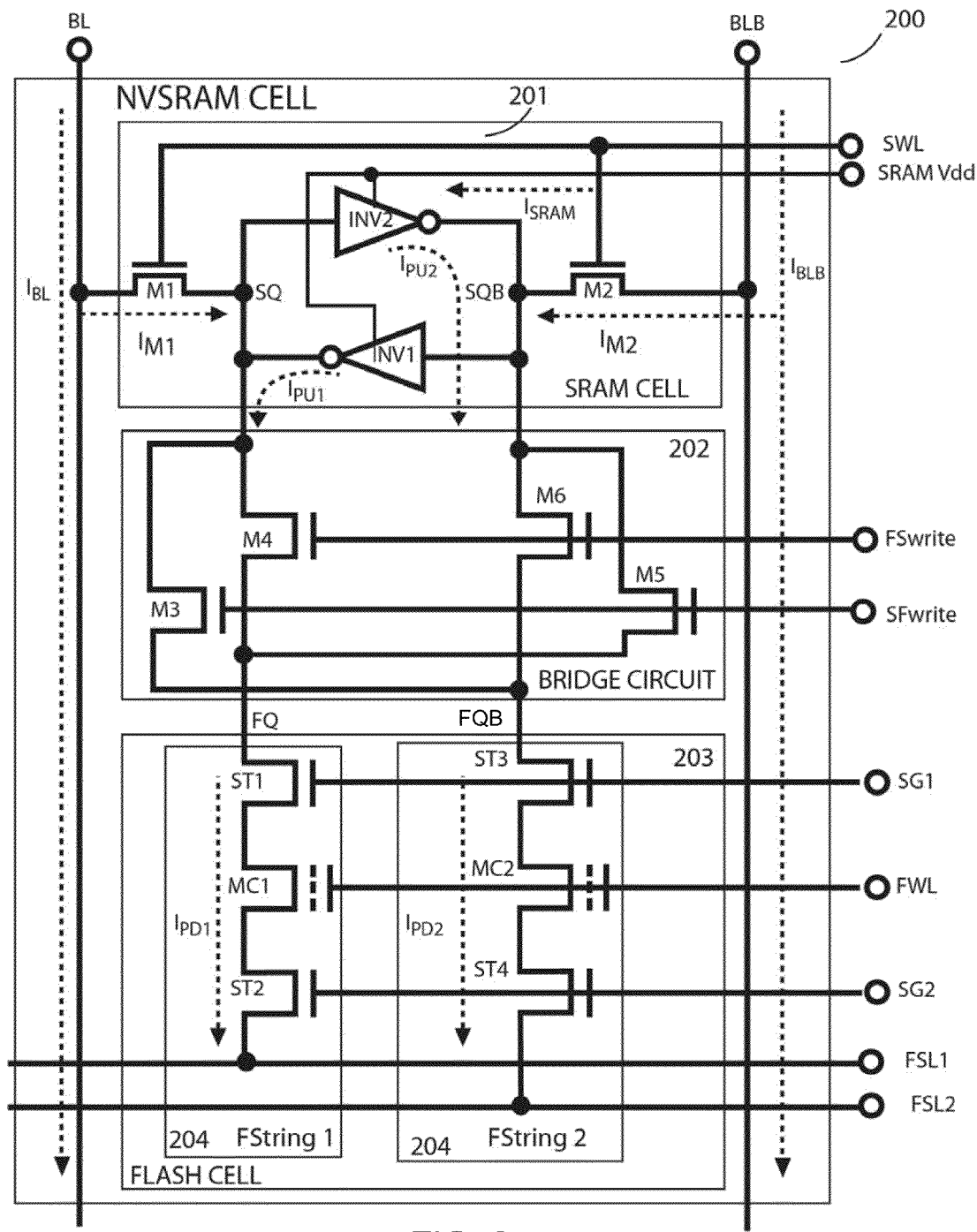
FIG. 2 is a circuit diagram of a 1-poly 16T NMOS NVSRAM cell having a common high-resistance SRAM VDD line according to an embodiment of the present invention.

Provided with the 2-poly NMOS 16T NVSRAM cell structure shown in FIG. 1A, there are several variations or alternatives for the NVSRAM cell that bears the same functionalities mentioned above. In a specific embodiment, FIG. 2 shows a 1-poly NMOS 16T NVSRAM cell circuit similar to the NVSRAM cell shown in FIG. 1A. In particular, the 1-poly NMOS 16T NVSRAM cell circuit 200 comprises one conventional LV 6T SRAM cell 201, one LV NMOS 4T Bridge circuit 202, along with one 6T HV NMOS 1-poly Flash circuit cell 203 associated with two separate FSL/ML lines. This is again a 1S1F NVSRAM cell in accordance with the present invention. The term of 1S1F means that each NVSRAM cell 200 comprises only one SRAM cell 201 coupled to one Flash cell 203 (via one Bridge circuit 202).

This 1-poly NMOS 16T NVSRAM cell 200 also has three preferred logic states of "0", "1" and "X" and one preferred set of bias condition as defined in the prior two tables shown in FIG. 1C and FIG. 1D.

One of the major differences between FIG. 1A and FIG. 2 is the values of flash cell's threshold voltage levels Vt0 and Vt1. In this 1-ploy NVSRAM cell, both Vt0 and Vt1 tends to be all positive due to the HV available on this process is only +/−7V. Thus, the FWL voltage has to be increased or boosted if necessary at low VDD operation. Other operations are same as the 2-poly NVSRAM cell (FIG. 1A) and also similar when the cell is applied in NVSRAM memory array. Thus, the detailed descriptions of its function and operations are omitted here for purpose of brevity. But this embodiment has its own advantage. In particular, the Logic-comparable 1-poly flash process uses less number of masks. Thus the cell array size is reduced for achieving certain cost reduction. While all the operations of FSwrite, SFwrite, and the Flash marginal-Vt detection are same as the one shown in FIG. 1A.

Figure 3A:
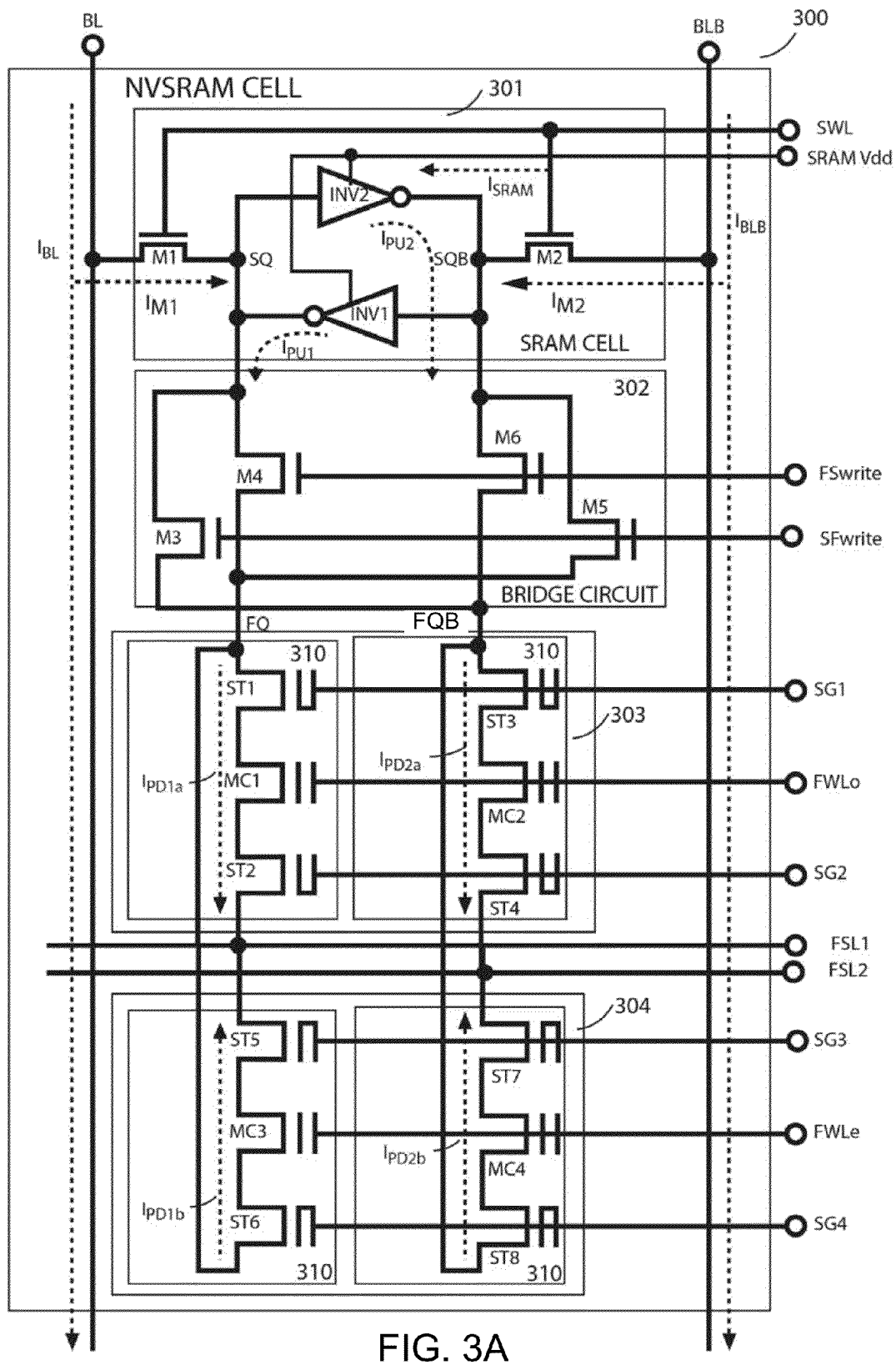
FIG. 3A is a circuit diagram of a 1S2F 2-poly 22T NMOS NVSRAM cell according to another embodiment of the present invention.

FIG. 3A shows a 2-poly NMOS 22T NVSRAM cell according to an embodiment of the present invention. As shown, the 2-poly NMOS 22T NVSRAM cell 300 is a 1S2F NVSRAM cell including one 6T SRAM cell 301 coupled to two 6T NMOS Flash cells of 303 and 304 via one 4T Bridge circuit of 302. The two 6T NMOS Flash cells are coupled in a parallel configuration to the FQ and FQB nodes and share two source nodes connecting to two separate FSL (FSL1 and FSL2) lines. The basic circuit of each flash cell 303 or 304 here is identical to the flash cell 103 shown in FIG. 1A having two 3T NMOS Flash strings 310, FString1 and FString2. Each flash cell is associated with three identically defined Logic states of "0", "1", and "X" and the preferred set of bias condition as shown in FIG. 1C and FIG. 1D respectively.

The operation of this 1S2F NVSRAM cell will be substantially the same as the operation of the 1S1F NVSRAM cell when one flash cell is enabled along with the other flash cell is disabled.

The disablement of each flash cell can be simply achieved by grounding one select transistor gate SG1 or SG4. On the contrary, the enablement of each flash cell can be achieved by coupling SG1 or SG4 to VDD. If Flash cell 303 is selected, then SG1=VDD and SG4=VSS in FSwrite and SFwrite operations. The polarity of FSwrite and SFwrite are exactly identical to the methods described above for the 16T NMOS 2-poly NVSRAM cell shown in FIG. 1A. The advantage to have two flash cells in parallel lies in the flexibility to handle SFwrite operation to "store" data from SRAM to Flash and FSwrite operation to "recall" Flash data into SRAM in practice. It provides flexibility to keep data in one flash cell while allowing the other flash cell to be erased and be ready to new "store" process. Of course, there are other alternatives, variations, and modifications. More embodiments can be found in later sections of this specification.

Figure 3B:
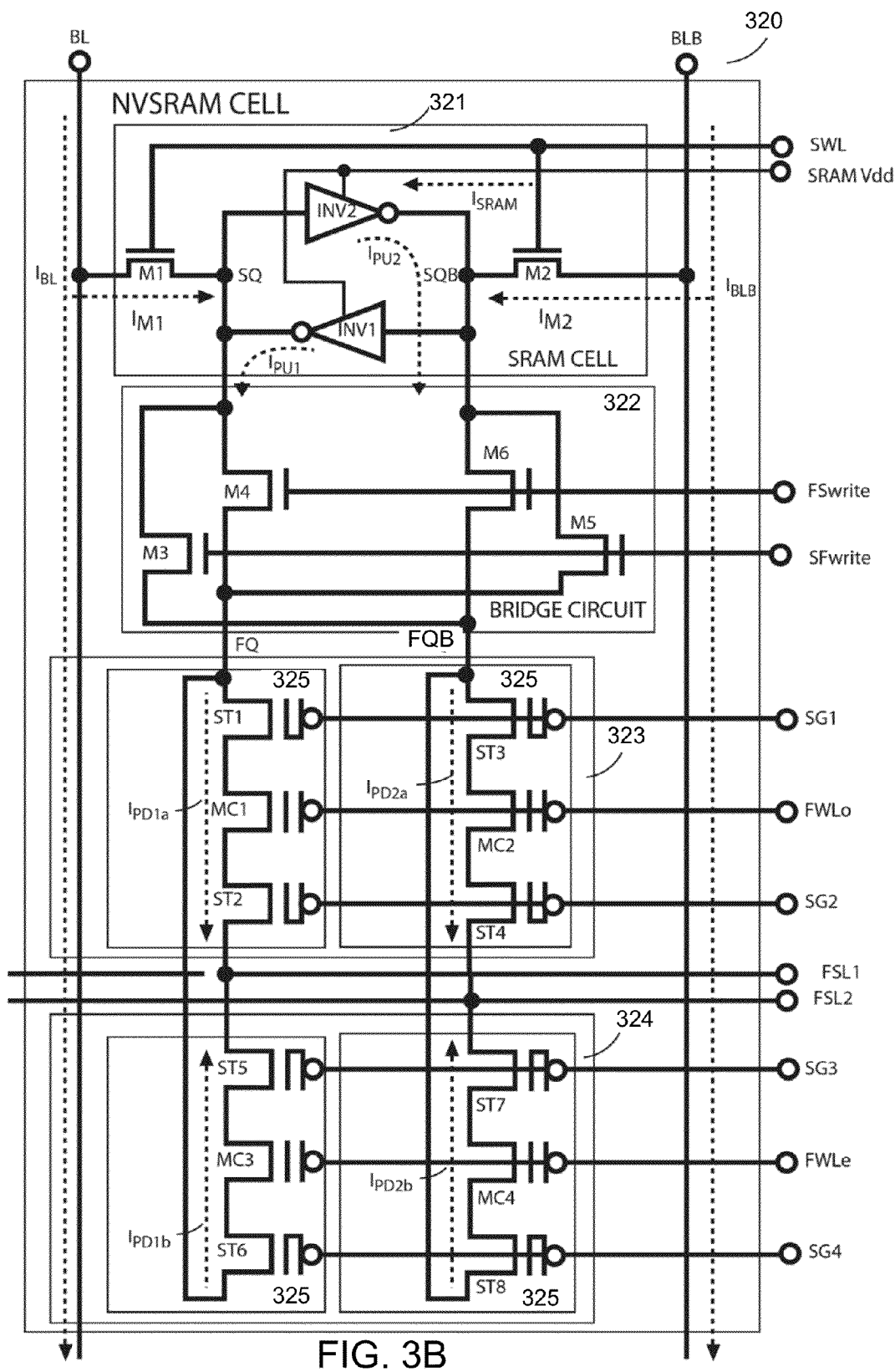
FIG. 3B is a circuit diagram of a 1S2F 2-poly 22T PMOS NVSRAM cell according to yet another embodiment of the present invention.

FIG. 3B further shows a 2-poly PMOS 22T NVSRAM cell circuit according to another embodiment of the present invention. As shown, the 2-poly PMOS 22T NVSRAM cell circuit is another 1S2F NVSRAM cell 320 that comprises one 6T LV SRAM cell 321, one 4T LV NMOS Bridge circuit 322, and two 2-poly 6T PMOS Flash cells 323 and 324 each made by two 3T PMOS FStrings 325. The two Flash cells are coupled in parallel by respectively coupling two drain terminals to the FQ and FQB nodes and two source terminals to two divided sourcelines FSL1/FSL2. Three common gates of SG1, FWLo, and SG2 are associated with the top Flash cell 323 and another three common gates of SG3, FWLe, and SG4 are associated with the bottom Flash cell, 324, in accordance with the present invention.

Each Flash cell, 323 or 324, further comprises one paired 3T PMOS Flash strings 325. This is a 1S2F PMOS 22T NVSRAM cell because it comprises one SRAM cell along with two PMOS Flash cells. The operations of this 1S2F NVSRAM cell would be substantially identical to the operation of 1S1F 16T PMOS NVSRAM cell shown in FIG. 1A when one Flash cell is disabled and the other one is enabled. Each PMOS cell also has three similar logic states of "0", "1" and "X." It is also substantially similar to the 1S2F 22T NMOS NVSRAM cell shown in FIG. 3, except that all 6 transistors in each Flash cell are replaced by PMOS transistors.

When first PMOS NVSRAM is selected, the SG1 and SG2 and FWLe would be enabled with a negative voltage. The second PMOS flash cell would be disabled by coupling a VDD to SG4 to shut off PMOS ST6 and ST8 devices. Once a PMOS flash cell is selected (enabled) the 22T PMOS NVSRAM cell becomes a 16T PMOS NVSRAM cell.

Also, in this 16T PMOS NVSRAM cell, it contains three preferred logic states of "0", "1" and "X" in accordance with three preferred Vt combinational assignments for a paired PMOS flash cells, MC1 and MC2, in a paired PMOS, 3T Flash strings 325, FString1 and FString2, as shown in FIG. 3B. The operation is kept the same as 16T NMOS NVSRAM cell except the SG1, SG2, SG3 and SG4 have to be coupled to a negative voltage to enable the PMOS ST1 to ST8 and MC1 to MC4. Thus, the detail descriptions are skipped here for brevity. Similarly, both logic "0" and "1" can be performed in one program cycle, while the "X" logic states will require similar two cycles as described previously in FIG. 1A.

Similarly, all FSwrite, SFwrite, and other marginal Vt detection functions of this PMOS 1S2F NVSRAM can be performed similar to the above 1S2F NMOS NVSRAM cell shown in FIG. 3A.

Figure 3C:
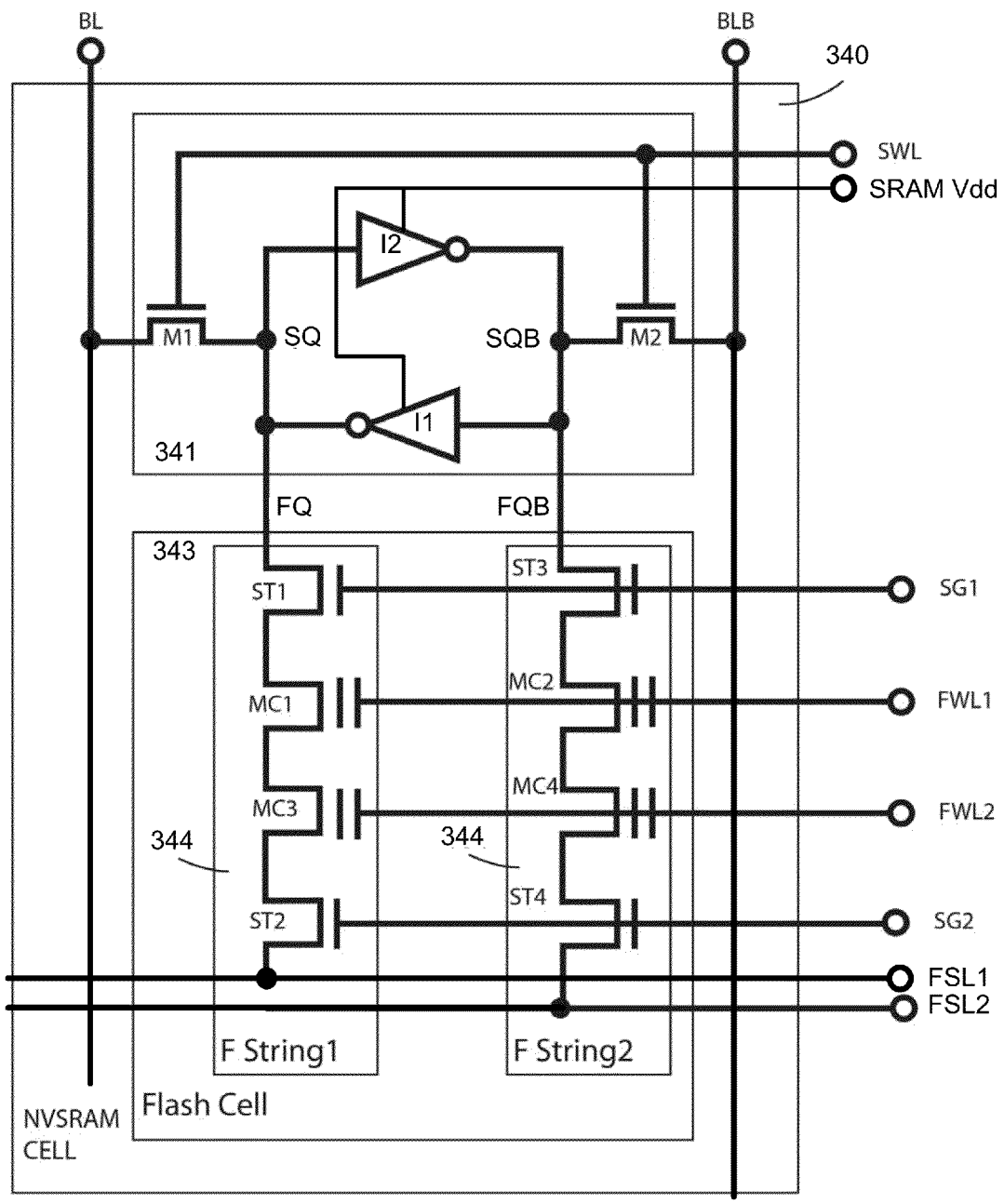
FIG. 3C is a circuit diagram of a 1S2F 2-poly NMOS 14T NVSRAM cell circuit according to still another embodiment of the present invention.

FIG. 3C is a circuit diagram of a 2-poly NMOS 14T NVSRAM cell circuit according to still another embodiment of the present invention. As shown, this 2-poly NMOS 14T NVSRAM cell 340 is another 1S2F NVSRAM cell having two pairs of Flash cells associated with each one 6T SRAM cell 341. The 6T SRAM cell 341 is substantially the same as the LV 6T SRAM cell 101 in FIG. 1A, or 301 in FIG. 3A, or 321 in FIG. 3B, with SQ and SQB paired nodes and one paired FQ and FQB input nodes coupled with a 8T 2-poly NMOS Flash circuit 343.

The 2-poly NMOS Flash circuit 343 comprises one paired 4T HV NMOS 2-poly Flash strings 344, of FString1 and FString2. Each NMOS flash string, FString 344, comprises four NMOS transistors ST1, MC1, MC3, and ST2 in FString1 or ST3, MC2, MC4, and ST4 in FString2, connected in series with four separate gate signals of SG1, FSL1, FSL2, and SG2 and two separate flash source lines FSL1 and FSL2.

The first four HV NMOS transistors (4T) include two preferred 1-poly Select transistors (2T) of ST1 and ST2 with poly2 and poly1 shorted together and two 2-poly, floating-gate type, Flash transistors (2T) of MC1 and MC3 in FString1. Similarly, the second four HV NMOS transistors (4T) include two 1-poly Select transistors (2T) of ST3 and ST4 and two 2-poly Flash transistors (2T) of MC2 and MC4 in FString2. One difference of this 1S2F NVSRAM cell from the previously proposed 1S2F NVSRAM cells is that there is no Bridge circuit in between. Another difference of this 1S2F NVSRAM cell from the previously proposed 1S1F NVSRAM cells is that there are two paired flash cell instead of just one paired flash cell.

In the 1S1F NVSRAM cell, such as the 16T NVSRAM cell 100 of FIG. 1A, during a "Store" operation, each SRAM bit's logic state is automatically written into the paired MC1 and MC2 only because only one Flash bit upon power loss. Conversely, during a "Recall" operation, the Flash bit's stored logic state in MC1 and MC2 would be automatically loaded into each SRAM bit upon power up. But In this 1S2F 14T NVSRAM cell 340, like the other 1S2F 22T NVSRAM cells (300 and 320), during a "Store" operation, each SRAM bit's logic state has option to be automatically written into either the first paired MC1 and MC2 or the second paired MC3 and MC4 only because two Flash bits are available upon power loss. Conversely, in a "Recall" operation, there is an option. Either the first 2-poly Flash bit's stored logic state in MC1 and MC2 or the second 2-poly Flash bit's stored logic state in MC3 and MC4 can be selectively and automatically loaded into each SRAM bit upon power up.

With two flash bits per one SRAM bit in this preferred 14T 2-poly NVSRAM cell structure, two old and updated SRAM states can coexist for a flexible Recall and Store operation. Thus this 14T 2-poly NVSRAM usage can achieve better performance over the counterpart of the 1S1F 2-poly NVSRAM cell to meet more advanced and dynamic applications.

Figure 3D:
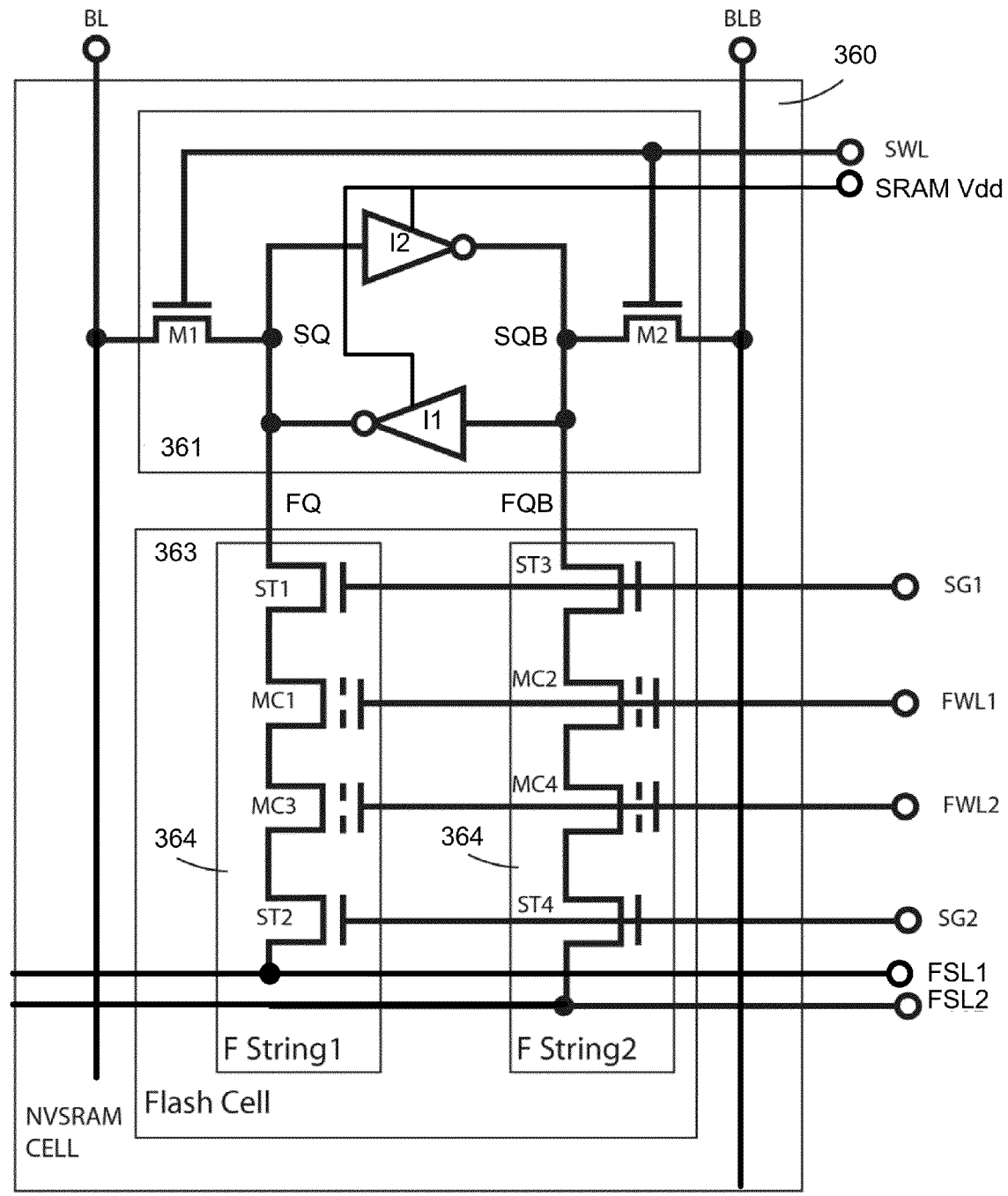
FIG. 3D is a circuit diagram of a 1S2F 1-poly 14T NVSRAM cell circuit according to yet still another embodiment of the present invention.

FIG. 3D is a circuit diagram of a 1S2F 1-poly NMOS 14T NVSRAM cell circuit according to yet still another embodiment of the present invention. As shown, this 1-poly NMOS 14T NVSRAM cell 360 is another 1S2F NVSRAM cell having two pairs of Flash cells associated with each one 6T SRAM cell 361. The 6T SRAM cell 361 is substantially the same as the LV 6T SRAM cell 101 in FIG. 1A, or 301 and 321 respectively in FIG. 3A and FIG. 3B, with SQ and SQB paired nodes and one paired FQ and FQB input nodes coupled with a 8T 1-poly NMOS Flash circuit 363. The 1-poly NMOS Flash circuit 363 comprises one paired 4T HV NMOS 1-poly Flash strings 364, of FString1 and FString2. Each NMOS flash string, FString 364, comprises four NMOS transistors ST1, MC1, MC3, and ST2 in FString1 or ST3, MC2, MC4, and ST4 in FString2, connected in series with four separate gate signals of SG1, FSL1, FSL2, and SG2 and two divided flash source lines FSL1 and FSL 2.

The first four HV NMOS transistors (4T) include two preferred 1-poly Select transistors (2T) of ST1 and ST2 without a need to short poly2 and poly1 together as FIG. 3C and two 1-poly charge-trapping type (SONOS or MONOS) Flash transistors (2T) of MC1 and MC3 in FString1. Similarly, the second four HV NMOS transistors (4T) include two 1-poly Select transistors (2T) of ST3 and ST4 and two 1-poly Flash transistors (2T) of MC2 and MC4 in NMOS FString2.

Similarly, in the 1S2F NVSRAM "Store" operation, each SRAM bit's logic state has option to be automatically written into either the first paired MC1 and MC2 or the second paired MC3 and MC4 only because two Flash bits are available upon power loss. In the 1S2F NVSRAM "Recall" operation, there is an option. Either the first 1-poly Flash bit's stored logic state in MC1 and MC2 or the second 1-poly Flash bit's stored logic state in MC3 and MC4 can be selectively and automatically loaded into each SRAM bit upon power up. With two 1-poly NMOS flash bits per one SRAM bit in this preferred 1S2F 14T 1-poly NVSRAM cell structure, two old and updated SRAM states can similarly coexist for a flexible Recall and Store operations as the one shown in FIG. 3C 14T 2-poly NMOS NVSRAM cell. Thus the 14T 1-poly NMOS NVSRAM usage can achieve better performance over a 12T 1-poly NMOS NVSRAM prior art counterpart to meet more advanced and dynamic applications.

Figure 3E:
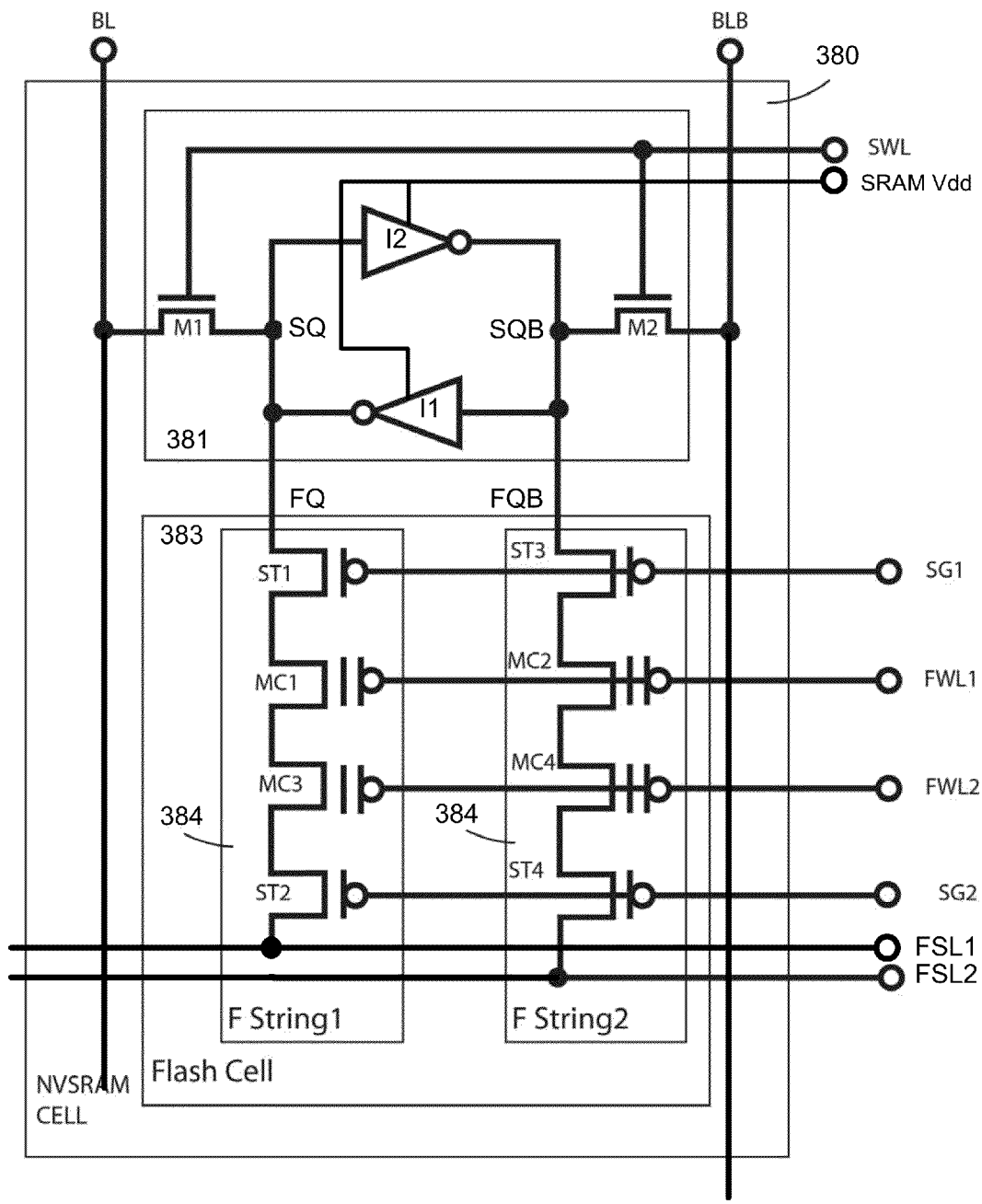
FIG. 3E is a circuit diagram of a 1S2F 2-poly PMOS 14T NVSRAM cell circuit according to still more another embodiment of the present invention.

FIG. 3E is a circuit diagram of a 1S2F 2-poly PMOS 14T NVSRAM cell circuit according to still more another embodiment of the present invention. The major difference between FIG. 3E and FIG. 3C is that the former one is a 14T NMOS 2-poly NVSRAM cell and the latter one is a 14T PMOS 2-poly NVSRAM cell. Correspondingly the control signal for PMOS floating-gate transistor should be implemented to replace those for NMOS floating-gate transistor. But, the NVSRAM functions should be substantially the same. The details biased conditions of all key operations of the 1S2F 14T NVSRAM cells are illustrated below as examples for applying the present invention.

1) SRAM operation: This is a LV VDD operation.
  a) Flash biased conditions: SG1=VSS, FSL1=FSL2=SG2=FSL1=FSL2=X
  b) SRAM biased condition SWL=VDD (selected row) but SWL=VSS (unselected rows).

Under the above preferably biased conditions, the two flash bits are totally out of circuit. In other words, FString1 and FString2 are in high-impedance state to each SRAM's output nodes of SQ and SQB.

2) MC1 and MC2 FN-channel erase biased conditions: This is a +HV operation.
  a) Flash biased conditions: SG1=VSS, FSL1=VNN, FSL2≥Vt1 +ΔVt, SG2=VDD, FSL1=FSL2=VSS, where ΔVt ≥0.5V preferably.
  b) SRAM biased conditions: SWL=VSS or "X", "X" means "Don't-care."

In this set up, MC1 channel is held at VSS through MC3 and ST2 to FSL in FString1 and MC2 channel is also held at VSS through MC4 and ST4 to FSL but the common gate FSL1=VNN which is around −15V to −18V. As a result, the electrons in the floating gate of MC1 and MC2 cells would be expelled out and thus both Vts would be pulled down to Vt0 with a preferred value of −2.0V. The erase time in spec is set with 1 ms to 10 ms, depending on the flash cell's coupling ratio from Poly2 to Poly1.

During the MC1 and MC2 erase operation, no voltage inputs of SQ and SQB from each SRAM cell to the paired flash inputs of FQ and FQB of Flash is required. As a result, each SRAM's Read and Write operations and each Flash erase operations can be conducted simultaneously as long as VNN pump, VDD and the related control logics are stable and available.

3) NMOS MC1 and MC2 FN-channel Program and Program-Inhibit biased conditions.
  a) Flash biased conditions: SG1=VDD, FSL1=VPP, FSL2=VDDNSS/0.5VPP, SG2=VSS, FSL1=FSL2=VDD to reduce the voltage punch-stress across $V_{DS}$ of ST2 and ST4 by VDD.
  b) SRAM biased conditions: SWL=VSS with a desired SRAM logic.

When SRAM's is set to be "0" state, then SQ=VSS and SQB=VDD. Conversely, When SRAM's is set to be "1" state, then SQ=VDD and SQB=VSS. Under SRAM's "0" state condition, the MC1 would get programmed to Vt1, while MC2's Vt would be program-inhibited, thus stays at Vt0, which is an erased Vt state. By contrast, under SRAM's "1" state condition, the MC2 would get programmed to Vt1, while MC1's Vt would be program-inhibited, thus stays at Vt0, which is an erased Vt state. The FSL2 voltage can be any value from VSS to 0.5VPP during FN-channel program on FSL1. The higher FSL2 would help the boost SBPI (Self-Boosting-Program-Inhibit) voltage in MC2 channel but would get gate disturbance on MC3 and MC4 bits that would degrade the P/E endurance cycles of MC3 and MC4.

In this set up, the initial channel voltage of MC1 is held at VSS through ST1 to SQ=VSS but MC2=VDD−Vt through ST3 and SQB=VDD and SG1=VDD. Next, the common gate FSL1 is connected to VPP which is around +15V to +18V. As a result, the electrons in the channels of MC1 transistor would be injected into the floating-gate and thus Vt would be increased to Vt1 with a preferred value of +2.0V.

But the electrons in the channels of MC2 transistor would be inhibited injecting into MC2's floating-gate and thus Vt would remain Vt0 with a preferred value of −2.0V. This is referred as SBPI method. The Program and Program-Inhibit time is set around 1 ms to 10 ms, depending on the MC1's and MC2's coupling ratio from Poly2 control-gate to poly1 floating-gate.

4) MC3 and MC4 FN-channel erase biased conditions: This is a −HV operation like the erase on MC1 and MC2.
  a) Flash biased conditions: SG1=VSS, FSL1=X, FSL2=VNN, SG2=VDD, FSL1=FSL2=VSS, X=VDD or VSS.
  b) SRAM biased conditions: SWL=VSS or "X".

In this set up, the channels of MC3 and MC4 are both held at VSS but the common gate FSL2 is VNN which is around −15V to −18V. As a result, the electrons in the floating gates of MC1 and MC2 cells would be expelled out into P-substrate and thus both Vts would be pulled down to Vt0. The erase time is set around 1 ms to 10 mS, depending on the flash cell's coupling ratio from Poly2 to Poly1.

Note, the first flash bit (MC1 and MC2 ) and the second flash bit (MC3 and MC4) can be erased simultaneously with a set of preferred biased conditions of FSL1=FSL2=VNN and SG2=VDD, FSL1=FSL2=VSS and SG1=VSS with a same erase time, 1 ms to 10 ms.

5) MC3 and MC4 FN-channel program biased conditions: This is a +HV operation.
  a) Flash biased conditions: SG1=VDD, FSL1≥Vt1 +ΔVt, FSL2=VPP, SG2=VSS, FSL1=FSL2=VDD
  b) When SRAM's is set to be "0" state, then SQ=VSS and SQB=VDD. Conversely, When SRAM's is set to be "1" state, then SQ=VDD and SQB=VSS.

Under SRAM's "0" state condition, the MC3 would get program to Vt1, while MC4's Vt would be program-inhibited, thus stays at Vt0, which is an erased Vt.

By contrast, under SRAM's "1" state condition, the MC4 would get programmed to Vt1, while MC3's Vt would be program-inhibited, thus staying at Vt0, which is an erased Vt. The FSL1 voltage can be any value from VSS to 0.5VPP during FN-channel program on FSL2. The higher FSL1 would help the boost SBPI (Self-Boosting-Program-Inhibit) voltage in MC2 channel but would get gate disturbance on MC1 and MC2 bits which would degrade the P/E endurance cycles of MC1 and MC2.

The Program and Program-Inhibit time is set around 1 ms to 10 ms, depending on the MC1's and MC2's coupling ratio from Poly2 control-gate to Poly1 floating-gate.

6) Recall operation1: It is a LV operation to load each Flash logic state into each SRAM cell upon power-on cycle. It is also called FSwrite in this invention. Assuming the first Flash bit of MC1 and MC2 transistors are selected for a Recall operation with MC1=Vt0 and MC2=Vt1:
  a) Flash biased conditions: SG1=VDD, FSL1=VDD, FSL2≥Vt1 +ΔVt, SG2=VDD, FSL1=FSL2=VDD. In this case, MC3 and MC4 act as a pass-gate for the FString.
  b) SRAM biased conditions: SWL=VSS and the common VSS lines of Inverters of I1 and I2 is preferably connected to a high-resistance device to allow the weak pull-up on SQ node of SRAM by a 4T FString1 with a power from FSL1 because of MC1=Vt0 and MC2=Vt1. The FString2 may also conduct a pull-up current from FSL2 on node SQB if FSL2 VDD is higher than Vt1 of MC2. But due to the relatively stronger pull-up on FString1 over FString2, this finally the SRAM logic would be set to "1" state because SQ=VDD and SQB=VSS.

On the contrary, if the Flash bit of MC1 and MC2 transistors are stored with "1" state, then the SRAM will be set to "1" state so that SQ=VDD and SQB=VSS.

7) Recall operation2: It is a LV operation to load each Flash logic state into each SRAM cell upon power-on cycle. It is also called as FSwrite of this invention. Assuming the first Flash bit of MC3 and MC4 transistors are selected for Recall with MC3=Vt0 and MC4=Vt1:
  c) Flash biased conditions: SG1=VDD, FSL1=VDD, FSL1≥Vt1 +ΔVt, SG2=VDD, FSL1=FSL2=VDD. In this case, MC1 and MC2 act as a pass-gate for the FString.
  d) SRAM biased conditions: SWL=VSS and initial SQ=SQB=VSS. The common VSS lines of Inverters of I1 and I2 is preferably connected to a high-resistance device to allow the weak pull-up on SQ node of SRAM by a 4T FString1 with power from FSL1 because of MC3=Vt0 and MC4=Vt1. The FString2 may also conduct a pull-up current from FSL2 on node SQB if FSL2 VDD which is higher than Vt1 of MC4. But due to the relatively stronger pull-up on FString1 over FString2, the SRAM logic would be set to "1" state because SQ=VDD and SQB=VSS.

On the contrary, if the Flash bit of MC3 and MC4 transistors are stored with "1" state, then the SRAM will be set to "1" state so that SQ=VDD and SQB=VSS.

For other 14T NVSRAM cells, the operation would be similar to the NMOS 2-poly 14T NVSRAM cell explained above. The differences are that the gate voltages in Recall and Store LV operations are opposite between PMOS (FIG. 3E) and NMOS (FIG. 3C) 14T NVSRAM cells. For PMOS, SG1, FSL1, FSL2 and SG2 would be coupled to negative gate voltages. One of the SQ and SQB nodes would be pulled-down to VSS when FSL1=FSL2=VSS.

8) Recall from MC1 and MC2 PMOS transistors with a logic "0" state: a LV PMOS NVSRAM operation.
  a) SRAM biased condition: SWL=VSS set with initial SQ=SQB=X The reason of X for SQ and SQB is because the PMOS NVSRAM is set to low by FStrings. Thus it does not to be reset to VSS for both SQ and SQB initially to get ready for the charge-up by FString from FSLs in NMOS NVSRAM cell.
  b) Flash biased conditions: SG1=VSS, FSL1=VSS, FSL2≤−Vt1 −ΔVt, FSL1=FSL2=VSS. MC1=Vt0=−2V and MC2=Vt1=2V.
  After A successful Recall, the SRAM would be set into "0" state with SQ=VSS and SQB=VDD. Note, FSL1 or FSL2 is connected to VSS in PMOS NVSRAM cell, while in NMOS NVSRAM cell, the FSL1=FSL2=VDD.

9) Recall from MC1 and MC2 PMOS transistors with a logic "1" state: a LV PMOS NVSRAM operation.
  a) SRAM biased condition: SWL=VSS set with initial SQ=SQB=X
  b) Flash biased conditions: SG1=VSS, FSL1=VSS, FSL2≤−Vt1 −ΔVt, FSL1=FSL2=VSS. MC2=Vt0=−2V and MC1=Vt1=+2V.

After a successful Recall, the SRAM would be set into "1" state with SQ=VDD and SQB=VSS. Note, FSL1 or FSL2 is connected to VSS in PMOS NVSRAM cell, while in NMOS NVSRAM cell, the FSL1=FSL2=VDD.

10) Recall from MC3 and MC4 PMOS transistors with a logic "0" state: a LV PMOS NVSRAM operation.
  a) SRAM biased condition: SWL=VSS set with initial SQ=SQB=X with the same reason because FSL1=FSL2=VSS.
  b) Flash biased conditions: SG1=VSS, FSL2=VSS, FSL1<−Vt1 −ΔVt,3 FSL1=FSL2=VSS. MC3=Vt0=−2V and MC4=Vt1=2V.
  After a successful Recall, the SRAM would be set into "0" state with SQ=VSS and SQB=VDD.
  c) If Flash logic state is "1", then SRAM cell is set SQ=VDD and SQB=VSS after Recall.

11) PMOS 14T NVSRAM Store operation: Assuming the FN-channel Program and Program-Inhibit biased conditions are used to perform on first PMOS flash bit made of MC1 and MC2.
  a) PMOS Flash biased conditions: SG1=VSS, FSL1=VPP, FSL2=VDDNSS/0.5VPP, SG2=VDD, FSL1=FSL2=VDD to reduce the voltage punch-stress across $V_{DS}$ of ST2 and ST4 by VDD.
  b) SRAM biased conditions: SWL=VSS with a desired SRAM logic.

When SRAM's is set to be "0" state, then SQ=VSS and SQB=VDD. Conversely, When SRAM's is set to be "1" state, then SQ=VDD and SQB=VSS. Under SRAM's "0" state condition, the MC1 would get programmed to Vt1, while MC2's Vt would be program-inhibited, thus staying at Vt0, which is an erased Vt. By contrast, under SRAM's "1" state condition, the MC2 would get programmed to Vt1, while MC1's Vt would be program-inhibited, thus staying at Vt0, which is an erased Vt. The FSL2 voltage can be any value from VSS to 0.5VPP during FN-channel program on FSL1. The higher FSL2 would help the boost SBPI (Self-Boosting-Program-Inhibit) voltage in MC2 channel but would get gate disturbance on MC3 and MC4 bits that would degrade the P/E endurance cycles of MC3 and MC4.

In this set up, the initial channel voltage of MC1 is held at VSS through ST1 to SQ=VSS but MC2=VDD–Vt through ST3 and SQB=VDD and SG1=VDD. Next, the common gate FSL1 is connected to VPP which is around +15V to +18V. As a result, the electrons in the channels of MC1 transistor would be injected into the floating-gate and thus Vt would be reduced to Vt0 with a preferred value of −2.0V.

But the electrons in the channels of MC2 transistor would be inhibited injecting into MC2's floating-gate and thus Vt would remain Vt1 with a preferred value of +2.0V. This is referred as SBPI method. Note, for PMOS NVSRAM's initial erased Vt state is Vt1 as oppose to Vt0 in a NMOS NVSRAM cell. The Program and Program-Inhibit time is set around 1 ms to 10 ms, depending on the MC1's and MC2's coupling ratio from Poly2 control-gate to Poly1 floating-gate.

12) For Store on MC3 and MC4, the operation conditions would be the similar to PMOS MC1 and MC2.
 a) PMOS Flash biased conditions: SG1=VSS, FSL2=VPP, FSL1=VDDNSS/0.5VPP, SG2=VDD, FSL1=FSL2=VDD to reduce the voltage punch-stress across $V_{DS}$ of ST2 and ST4 by VDD.
 b) SRAM biased conditions: SWL=VSS with a desired SRAM logic.

13) For 1-poly 14T NVSRAM cell's three operations would be identical to the 2-poly 14T NVSRAM cell with the voltage differences in VPP and VNN. In a 1-poly NVSRAM cell, the VPP is typically reduced below +10V and VNN −10V. Other biased conditions of SG1, SG2, FSL and FSL1 and FSL2 would remain the same. Thus the detailed descriptions are skipped for keeping brevity.

In a preferred embodiment, a 14T NVSRAM cell of the present invention comprises one SRAM cell and two Flash cells. It is known to those skilled in the art that the number of Flash cells can be increased to more than two and is still in the same scope covered by this application. For example, a preferred embodiment of a 16T NVSRAM cell of the present invention comprises one SRAM cell and two Flash cells. Furthermore, a 12+[(N−12)/2]T NVSRAM cell would comprise one SRAM and N flash cells, where N is a even positive integer.

Figure 4A:
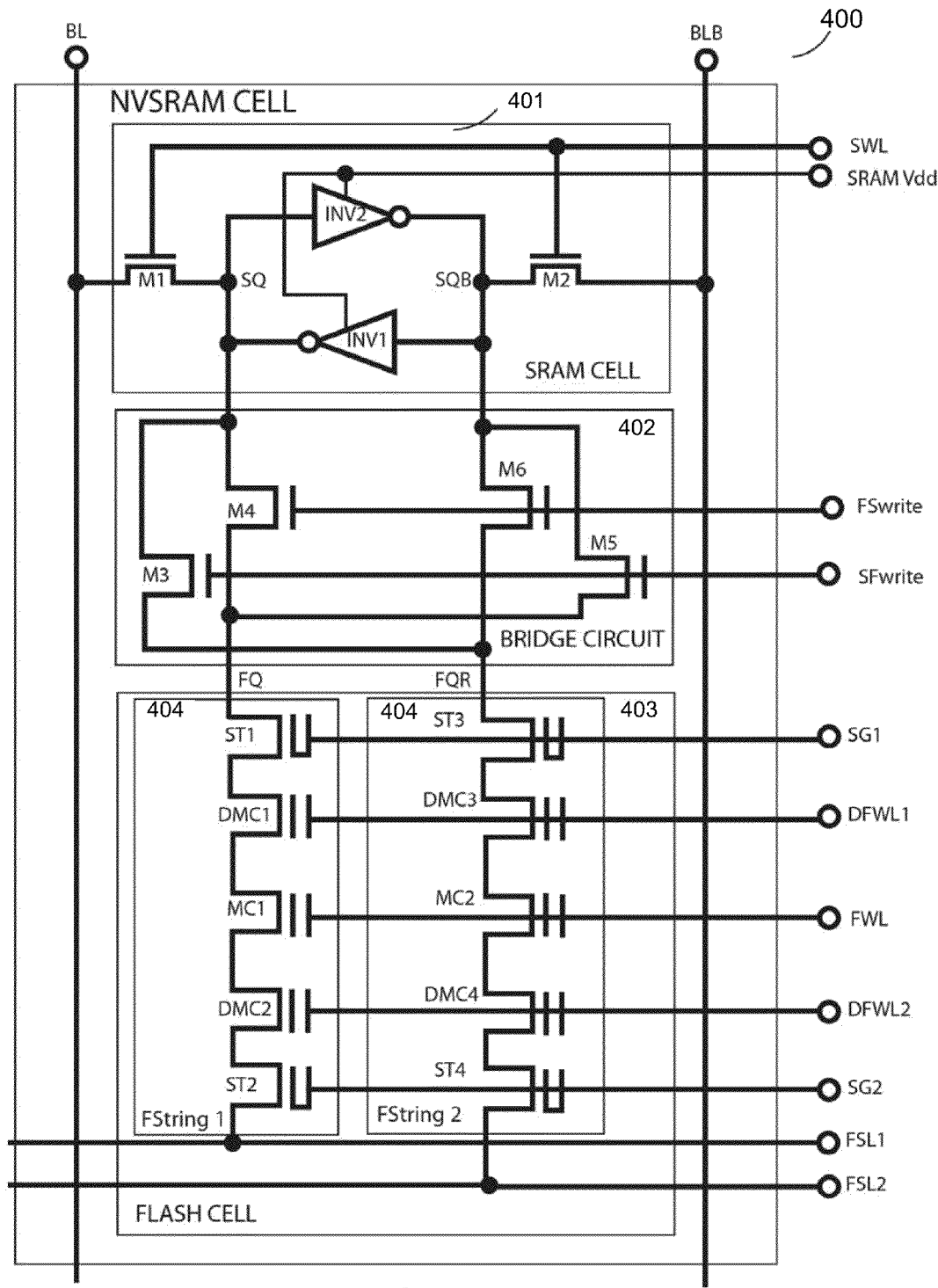
FIG. 4A is a circuit diagram of a 2-poly NMOS 20T NVSRAM cell circuit with two pairs of dummy flash cells according to an embodiment of the present invention.

FIG. 4A is a circuit diagram of a 2-poly NMOS 20T NVS-RAM cell circuit with two pairs of dummy flash cells according to a specific embodiment of the present invention. As shown, the 2-poly NMOS 20T NVSRAM cell 400 comprises one 16T NVSRAM cell with four more dummy MC cells such as DMC1 and DMC2 added in FString1 404, as well as DMC3 and DMC4 added in FString2 404. The gates of DMC1 and DMC3 are tied to DFSL1, while the gates of DMC2 and DMC4 are tied to DFSL2. The 16T NVSRAM cell is substantially the same as the cell 100 described in FIG. 1A. The 2-poly NMOS 20T NVSRAM cell 400 includes a 6T LV SRAM cell 401 coupled via a Bridge circuit 402 to the flash cell 403. The flash cell 403 is made of two 5T strings 404, FString1 and FString2, as mentioned above.

In the embodiment, adding four dummy MC flash cells of DMC1, DMC2, DMC3 and DMC4 is to prevent the gate-induced hot electrons generated from ST1, ST2, ST3 and ST4 leaking into the formal flash cells MC1 and MC2 during the HV SFwrite's FN-channel Program and Program-Inhibit (SBPI) operations. Other LV operations such as FSwrite and HV erase operation would not be effected.

For example, the erase operation of all DMC cells with a DFSL1 and DFSL2=VNN voltage like the VNN voltage explained in FIG. 1a along with SG2=VDD, FWL=VDD (>Vt1), SG1=VSS, FSL1=FSL2=VSS. DMC1, DMC2, DMC3, DMC4 and MC1 and MC2 can be erased simultaneously with FWL=DFSL1=DFSL2=VNN and ST1=VSS, ST2=VDD, FSL1=FSL2=VSS.

For SFwrite operation under this NVSRAM cell structure, it is to selectively write one MC1 and MC2 cell only according to the SRAM's logic state. In this 20T NVSRAM cell, all DMC cells of MDMC1, DMC2, DMC3 and DMC4, are preferably not programmed. In other words, only MC1 and MC2 are selectively programmed. Therefore, all DMC cells are preferably in Vt0 erased state.

The SFwrite operation can start by disconnecting SRAM Vdd power from each SRAM cell simultaneously by turning off the MOS-resistor that is connected to the SRAM Vdd power line in each row. This step is avoid any DC leakage from each STAM cell's paired nodes of SQ and SQB to two FStrings's paired nodes of FSL1 and FSL2 through the Bridge circuit 402. If after power-on period, the SG1 is automatically set to be VSS initially to cut off the leakage path between each SRAM's SQ and SQB nodes and FSL1 and FSL2, then this step can be skipped.

Then SFwrite operation sets SG1=VSS, DFSL1=DFSL2=SG2=VDD, FWL=VSS and SG2=VSS, FSL1=FSL2=VDD. This step is to set up the initial voltages on the channels of MC1 and MC2 flash cells prior to starting the SFwrite's FN tunneling program.

Next, the operation loads each SRAM with one of the preferred known logic state such as "0" or "1". Assuming the "0" logic state is loaded into all SRAM cells. Thus SQ=0V and SQB=VDD.

Further SFwrite operation changes SG1=VDD and FWL=VDD but keeps DFSL1=DFSL2=FSL1=FSL2=VDD and SFwrite=VDD but FSwrite=VSS. Since all dummy DMC cells' Vt are Vt0, thus the VDD–Vt and VSS would respectively passed to MC1 and MC2 through M3 and M5 with SFwrite=VDD without a problem.

In the next step, SFwrite Program operation on MC2 but Program-Inhibit operation on MC1 is performed with a pre-determined time of 1 ms or more. The MC 1 channel needs to be coupled from its initial 1.0V to a desired Inhibit voltage ≥7V if the MC1 coupling charges are sufficient to be distributed among the top active drain node and source node and its channel region. This is done by ramping the FWL voltage from initial VDD to a positive HV, ranging from 15V to 20V while keeping dummy word lines unchanged at VDD, depending on the coupling ratio from the gates to channels of MC1 and MC2 flash cells. After SFwrite operation, the MC1 Vt would not be changed and remains at its initial Vt0 state, while MC2 cell would be programmed to Vt1 which is preferably set to be ≥2.0V. Note, in a specific embodiment, the channel length of the MC1 and MC2 have been increased drastically to generate more coupling HV charges in the channels of MC1 and MC2 so that the preferred SBPI voltage can be higher in MC1 cell. The channel length increased follows the rule to be 3-fold of the gate spacing between MC-ST1 and MC-ST2.

To finish the SFwrite operation, in HV SBPI discharge period, the bias is set as FWL=VDD, SG1=VDD, SG2=VSS, FSL1=FSL2=VSS, SFwrite=VDD, and FSwrite=VSS. The Program-Inhibit voltage in MC1 would be discharged to SQB=VDD and SQ=VSS. In other words, the MC1 and MC2 channel voltages will be set back to their initial "0" logic state prior to the SBPI operation. The reason to set SG2=VSS is to avoid the DC current flow from the VDD SQ through M3 of the Bridge circuit, 402, and through FString2, 403, to FSL2=VSS.

Initially, both FSL1 and FSL2 are preferably coupled to VDD first to have better protection over the punch-through between ST1 and ST2 during the SBPI operation because the voltage drop across the channels of ST2 (7V) and FSL1 (3V) and ST1 (7V) and FQ(2.2V) are reduced by 3V and 2.2V respectively. At lower VDD 1.8V, the voltage drop across ST1, ST2, ST3 and ST4 would become worse. As a result, the channel lengths of these four ST devices have to be increased accordingly.

But FSL1=FSL2=VSS is still okay if the channel length are long enough to avoid 7V punch-through for ST1, ST2, ST3 and ST4 transistors.

When programming any SRAM's logic states to a paired MC flash cells, a HV of VPP of +15V to +20V is applied to the common FWL gate with FSL1=FSL2=VDD initially. As a result, one flash's channel is held at 0V with another flash's channel is coupled to an Inhibit voltage ≥7V from initial VDD−Vt. A low-current FN-channel tunneling effect would be induced between the Poly2 control-gate tied to FWL and the poly1 floating-gate on the flash cell with channel held at 0V. Gate-induced electrons are likely injected into the cell's floating-gate from the cell's channel of one of MC1 and MC2. But for those MC1 and MC2 channel voltage being coupled to a value ≥7V, then the FN tunneling effect will get inhibited, thus the Vt remains at its initial state of Vt0, which is the erased Vt with a preferred value ≤−2.0V. This Program-Inhibit scheme is called the SBPI, Self-Boosted-Program-Inhibit.

In order to interrupt the undesired injection of these electrons into the floating gates, the added devices are inserted to protect MC1 and MC2 from capturing these hot electrons. During the SFwrite's Program and SBPI operation, the gates of DFSL1 and DFSL2 are coupled to VDD to attract the electrons, thus negligible electrons would fly to MC1 and MC2. As a result, after repeated program and erase cycles, the program-Inhibit flash cells would get less stress, thus the advantage of 1M P/E endurance cycles has more chance to be achieved. The disadvantage of 20T NVSRAM over 16T NVSRAM is the larger cell size with more complex the control circuit.

Figure 4B:
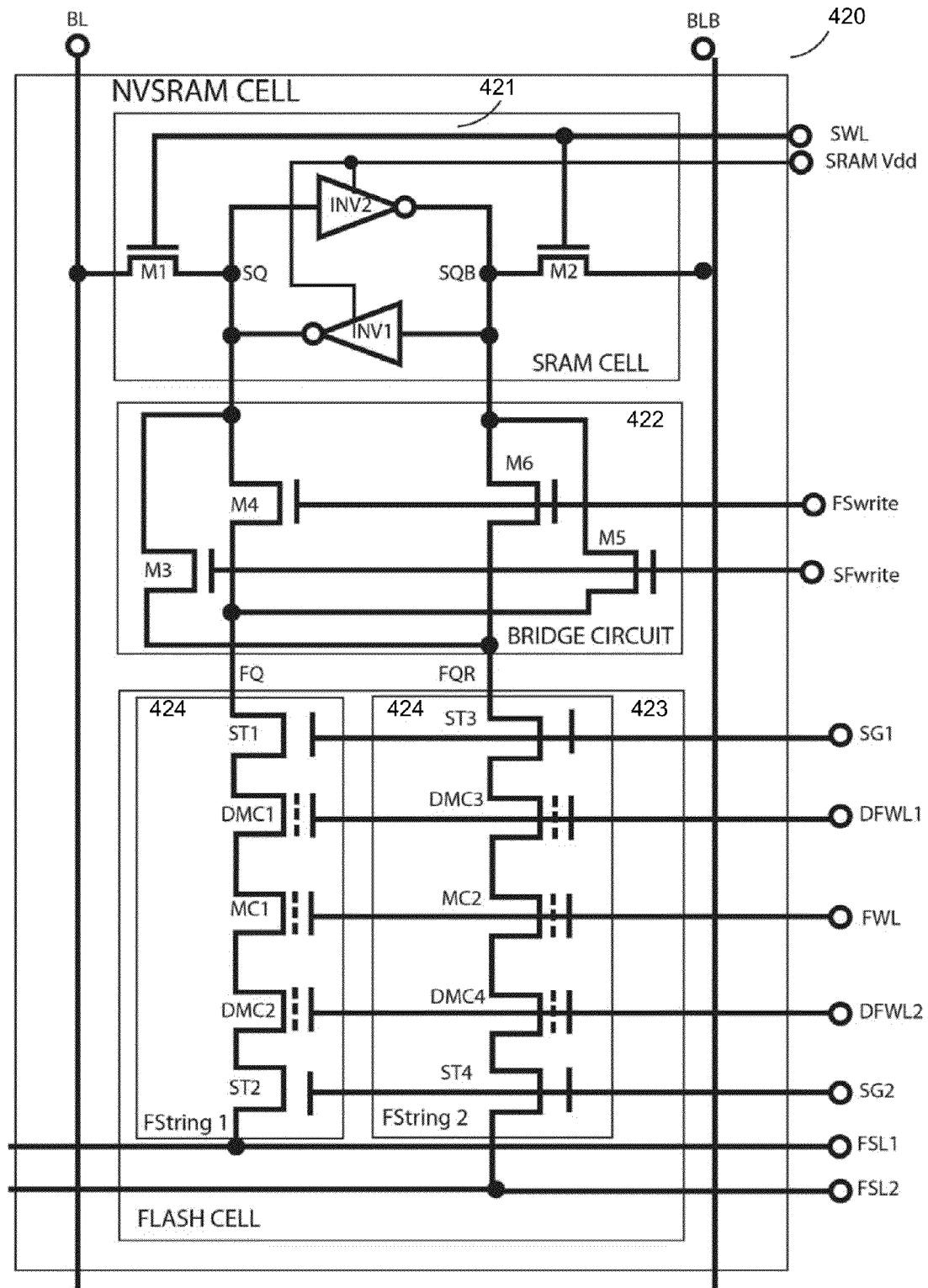
FIG. 4B is a circuit diagram of a 1-poly NMOS 20T NVSRAM cell circuit with two pairs of dummy flash cells according to an embodiment of the present invention.

FIG. 4B is a circuit diagram of a 1-poly NMOS 20T NVSRAM cell circuit with two pairs of dummy flash cells according to an embodiment of the present invention. As shown, the 20T NVSRAM cell 420 is substantially similar to the 20T NVSRAM cell 400 but the flash cell 423 is NMOS, 1-poly Charge-trapping MONOS or SONOS flash device having two 5T Flash strings 424. All the operations of this 1-poly NVSRAM device are same as the 2-poly 20T NVSRAM counterpart as shown in FIG. 4A.

The only difference between FIG. 4B and FIG. 4A is the voltage setting for Erase and SFwrite operation. Since the cell 420 in FIG. 4B uses a 1-poly NMOS device 423, thus the HV used would be lower than the HV used in 2-poly NVSRAM shown in FIG. 4A. The 1-poly NVSRAM cell 420 uses +/−7V for program and erase respectively, while the 2-poly NVSRAM cell 400 uses +/−VPP and VNN with a value ranging 15V to 20V.

Figure 4C:
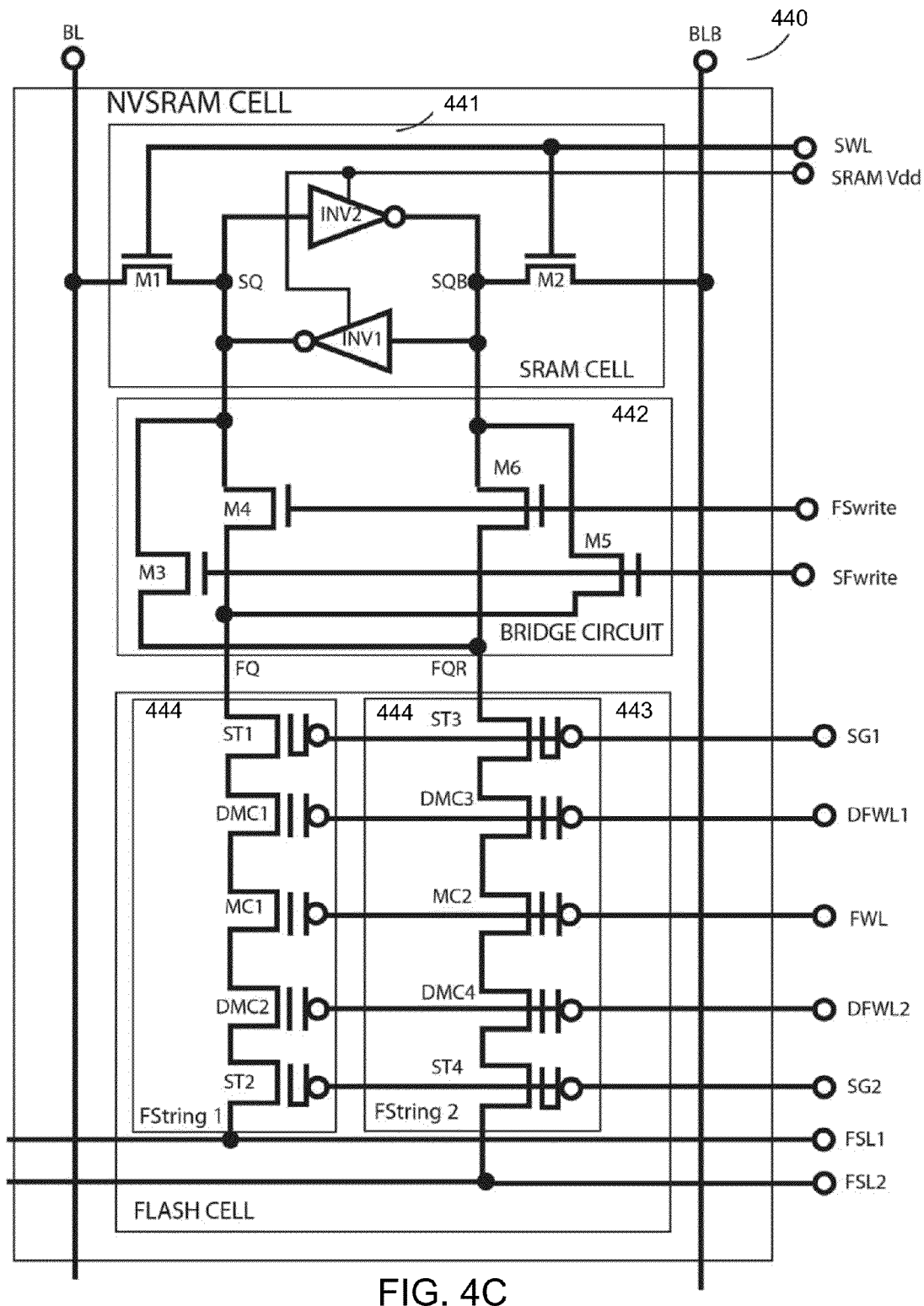
FIG. 4C is a circuit diagram of a 2-poly PMOS 20T NVSRAM cell circuit with two pairs of dummy flash cells according to an embodiment of the present invention.

FIG. 4C is a circuit diagram of a 2-poly PMOS 20T NVSRAM cell circuit with two pairs of dummy flash cells according to an embodiment of the present invention. As shown, the 2-poly PMOS 20T NVSRAM cell 440 is substantially the same as the 20T NVSRAM cell 400 shown in FIG. 4A except that the flash cell is PMOS 2-poly floating-gate flash device 443. The Flash cell 443 comprises two PMOS Fstrings 444.

Each FString 444 further comprises all five PMOS devices in series. These five devices include two PMOS Select devices such as ST1 and ST2 and three PMOS flash cells one is regular PMOS flash cell MC1 and the other two dummy PMOS flash cells such as DMC1 and DMC2 for PMOS FString1. Similarly, another five devices include two PMOS Select devices such as ST3 and ST4 and three PMOS flash cells one is regular PMOS flash cell MC2 and the other two dummy PMOS flash cells such as DMC3 and DMC4l for PMOS FString2.

All the operations of this 2-poly 20T PMOS NVSRAM device 440 are same as the 2-poly 20T NMOS NVSRAM counterpart 400 as shown in FIG. 4A. The only difference between FIG. 4C and FIG. 4A is the negative voltage used for SG1, SG2, DFSL1 and DFSL2, and FWL during FSwrite and SFwrite operations. Although FIG. 4C is a 2-poly PMOS device, the HV needed for SFwrite and erase operation are identical to the HV used in FIG. 4A.

Figure 5:
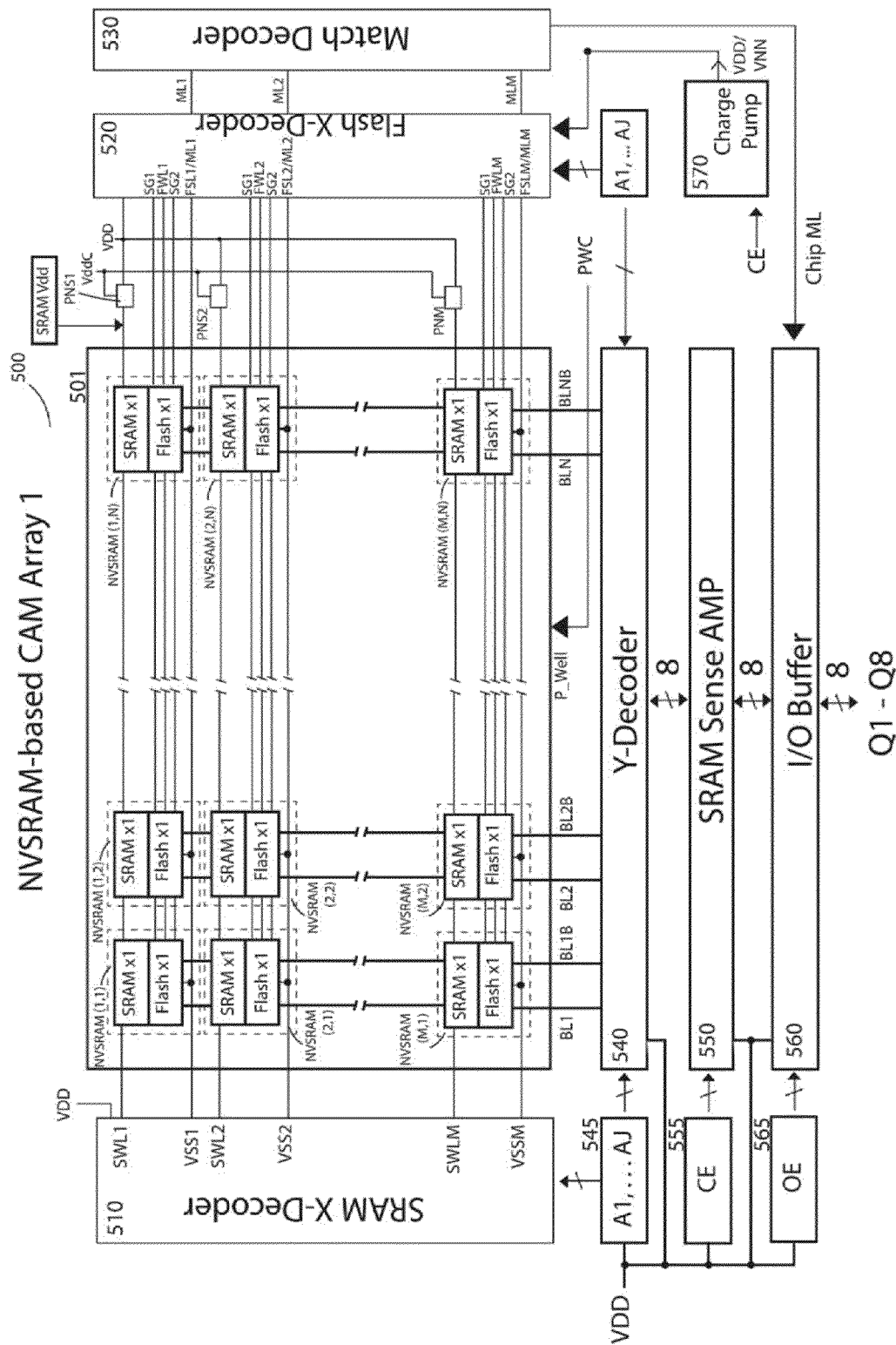
FIG. 5 is a chip circuit of a NVSRAM memory array made of the NVSRAM cells of the present invention integrated with other circuit blocks including SRAM-Decoder, Flash X-Decoder, and Y-Decoder, SRAM Sense Amplifier, I/O buffer, Match-decoder, and CE, OE Buffer as well as Address Buffer according to an alternative embodiment of the present invention.

All the proposed cell architectures for the NVSRAM cells above would be used to arrange into multiple pages to form a NVSRAM memory array in application. FIG. 5 shows a chip circuit of a preferred NVSRAM memory array 500 made of a plurality of the NVSRAM cells of one embodiment coupled with other circuits blocks including SRAM-Decoder 510, Flash X-Decoder 520, and Y-Decoder 540, SRAM sense Amplifier 550, I/O Buffer 560, and Match-decoder, 530, CE Buffer 555, OE Buffer 565, as well as the Address Buffer 545 according to an alternative embodiment of the present invention. This circuit provides a super fast detecting capability on those marginal-Vt or defective-Vt NVSRAM cells in unit of one page and even the whole chip. This can be explained further below with reference the bitline ΔVt sensing circuit shown in FIG. 8 below.

Figure 6:
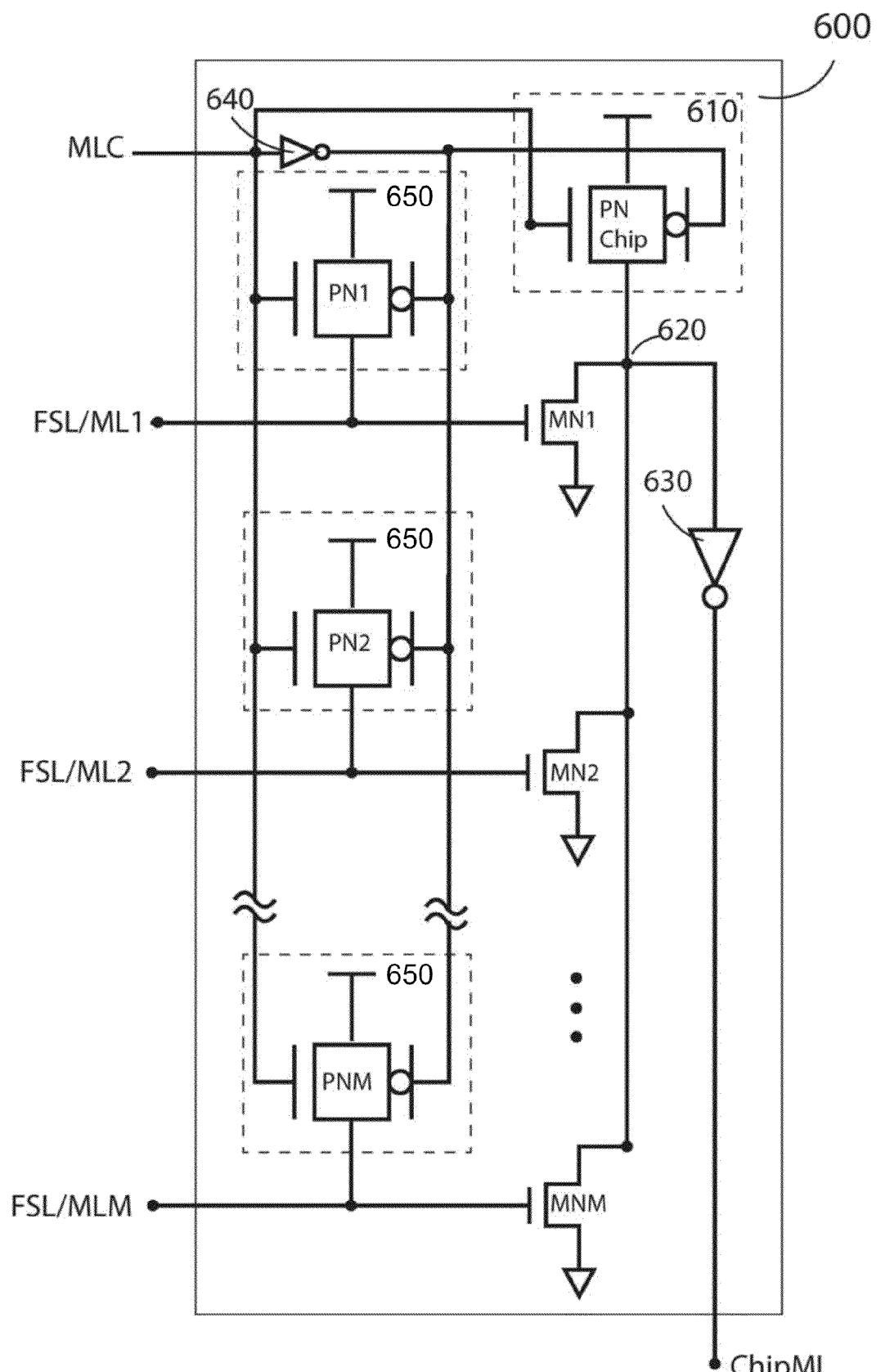
FIG. 6 is a preferred low-power ΔVt-detector circuit made of a plurality of PN paired switch devices configured as a pull-up load resistor per flash source line with N-type gate tied to general MLC signal and P-type gate tied to a complementary MLCB signal according to a specific embodiment of the present invention.

FIG. 6 is a preferred low-power ΔVt-detector circuit made of a plurality of PN paired switch devices configured as a pull-up load resistor per flash source line with N-type gate tied to general MLC signal and P-type gate tied to a complementary MLCB signal according to a specific embodiment of the present invention. This diagram is merely an example, which should not unduly limit the scope of the claims herein. As shown, the low-power ΔVt-detector circuit 600 is made of a plurality of PN paired switch devices, PNM 650. Each PNM device 650 is configured as a pull-up load resistor per FSLM sensing line with its Ngate tied to a general MLC signal and its Pgate tied to MLCB which is the output node of Inverter 640.

In normal operation, all PNM devices 650 are disabled by grounding MLC such as $V_{MLC}$=0V. But in Chip marginal-ΔVt detecting operation, all PNM devices 650 are enabled by the condition of $V_{MLC}$=VDD. The reason that Chip marginal-ΔVt operating can be performed because all M FSL lines are coupled to M gates of all MNM NMOS devices that are configured into NOR-type detector with a pull-up load that is made of another PN-paired device, PNChip 610, at node 620. The output node of this detector through an Inverter 630 is ChipML. The condition of ChipML goes high only when at least FSLM line is being pulled low by at least one single NVSRAM cell conducting the $I_{PD}$ current flow from each FSL line to SRAM's node SQ or SQB at VSS voltage.

Figure 7:
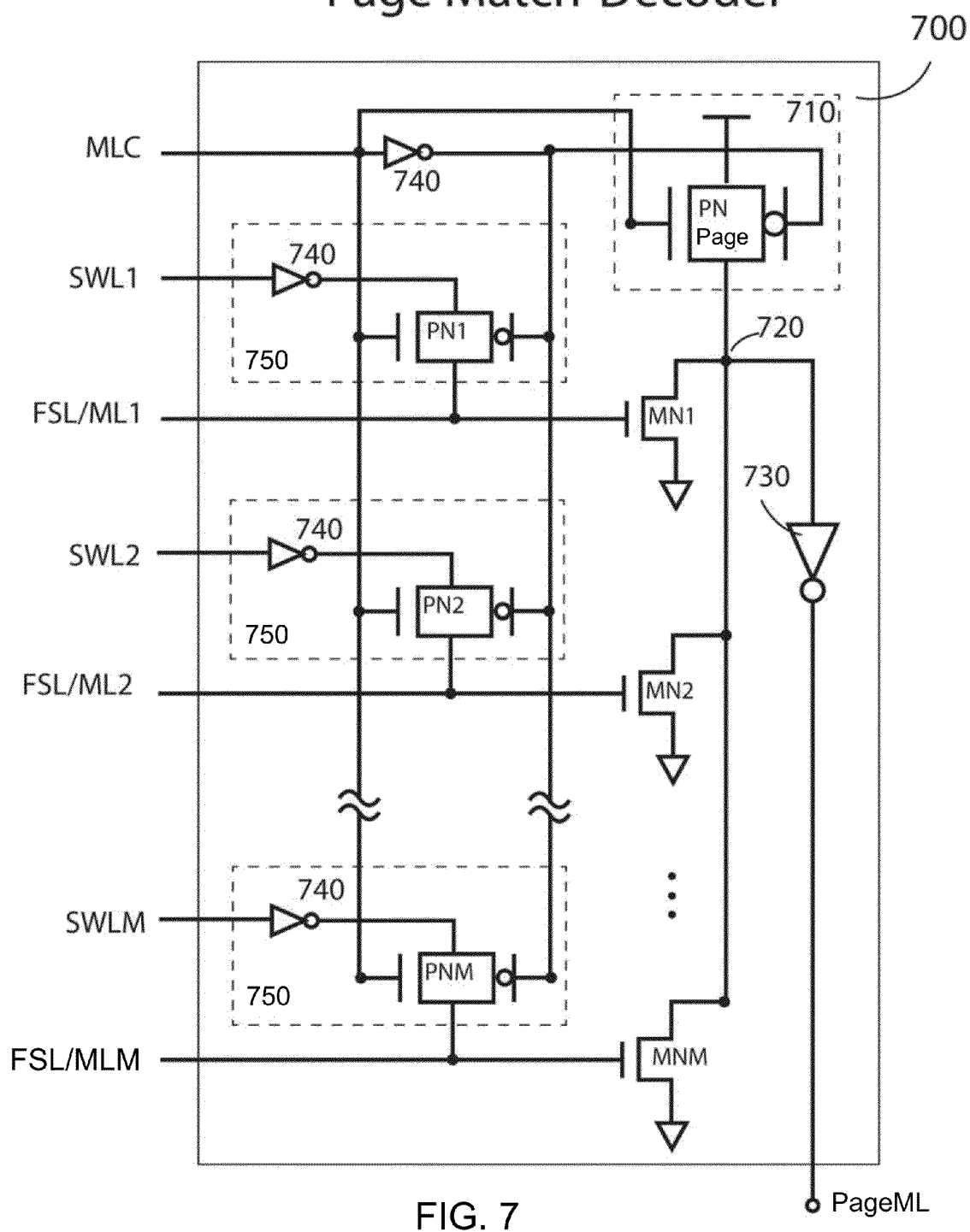
FIG. 7 is a preferred low-power ΔVt-detector circuit made of a plurality of PN paired switch devices plus Invertors with each drain node connected to corresponding SRAM word line as a power line according to another specific embodiment of the present invention.

FIG. 7 is a preferred low-power ΔVt-detector circuit made of a plurality of P-N paired switch devices plus Invertors with each drain node connected to corresponding SRAM word line as a power line according to another specific embodiment of the present invention. This diagram is merely an example, which should not unduly limit the scope of the claims herein.

As shown, the low-power ΔVt-detector circuit 700 is made of a plurality of PN-paired devices 750 with each drain node connected to each corresponding SWLM line. The SWLM acts as a power line output from an Inverter 740 to each PN-paired device 750. Each PN-paired device 750 is configured as a pull-up load resistor per FSLM sensing line with its N-gate tied to a general MLC signal and its P-gate tied to MLCB which is also an output node of a separate Inverter 740.

In normal operation, only one out of M PN-paired devices is connected to VDD through the selected SWL line and is then pre-charged to VDD level before the ΔVt detection in each selected row is performed. This circuit is designated for performing a page marginal-ΔVt detection because all M FSL lines are coupled to M gates of all MNM NMOS devices that are configured into NOR-type detector with a pull-up load that is made of another PN-paired device, PNPage 710, at node 720. The output node of this detector via another Inverter 730 is PageML. The condition of PageML goes high only when at least FSLM line is being pulled low by at least one single NVSRAM cell conducting the $I_{PD}$ current flow from each FSL line to SRAM's node SQ or SQB at VSS voltage.

Referring to FIG. 8, it shows another embodiment of a ΔVt-detector circuit that can be used for detecting the Vt0 and Vt1 of NVSRAM paired cell. This approach is different from that in FIG. 6 using FSL/ML as a sensing line. Instead, this embodiment connects N PN paired LV load devices 810. Each includes a pair of PMOS devices P1 and P2 and a pair of NMOS devices N1 and N2 respectively connected to a plurality pairs of BL and BLB lines of each SRAM cells. The NMOS devices N1 and N2 have their gates tied to BL and BLB respectively. Similarly, the drain of P1 and P2 devices are also connected to BL and BLB. The N1 and N2 are the sensing devices and are configured into NOR-type sensing scheme with one common output at node 820 as a common sensing line and its opposite output of VtDetect node of the whole M×N NVSRAM matrix array (FIG. 5). The PLoad is turned on by grounding common gate BLPREC. And the 820 sensing line of this ΔVt-detector circuit is pre-charged to VDD by grounding BLC gate of the Psense device before the ΔVt sensing in BL starts.

Referring to the architectures proposed for the novel NVS-RAM cells above in FIG. 1A, FIG. 2, FIGS. 3A-3E, and FIGS. 4A-4C, the principle of channel length decision of MC1 and MC2 are usually made of the minimum pitch of 1λ and the poly-gate spacing between MC-ST1 or MC-ST2 are laid with a minimum pitch of 1λ. But in this preferred 16T NMOS NVSRAM cell, the channel length of MC is preferably made of 3-fold of poly-gate spacing, where MC is either MC1 or MC2 with the same channel length. With MC channel length increase, the SBPI HV increase can be realized by increasing the gate coupling ratio without any need of other circuit changes. The increase of the Program-Inhibit voltage in the channel regions of the non-selected flash cells still shares the same WL with the selected programmed cells. The SBPI voltage increase in the flash floating channel region would thus effectively decreases the voltage drop across the flash's tunnel-oxide layer. As a result, the non-selected flash cells would not get programmed or would be inhibited from FN-channel programming. As a result, the program yield would be increased and die cost would be reduced.

Figure 9A:
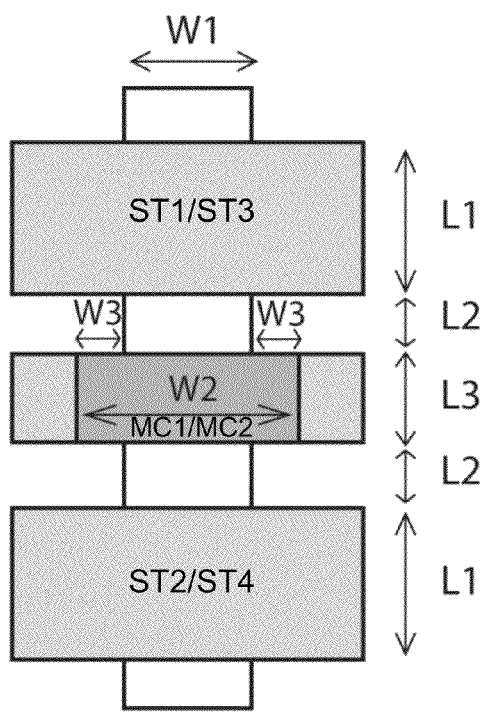
FIG. 9A is an exemplary 2-poly layout of a 3T FString cell with a defined flash channel length in a prior art.

FIG. 9A is an exemplary 2-poly layout of a 3T FString cell with a defined flash channel length in a prior art. Presenting this conventional layout is merely used as a part of inventive process for comparing embodiments of the present invention. As shown, an exemplary 2-poly transistor layout of each 3T FString cell, regardless of PMOS string or NMOS string. The Select transistors ST1/ST3 or ST2/ST4 are HV devices and are placed on top and bottom of the layout respectively with a large channel length of identical L1. The Flash cell, MC1 or MC2 are placed in the middle of the FString layout with a channel length of L3 and are separated from the Select transistors by a spacing L2. L3 is typically smaller than L1. The pitch sizes of L3 and L2 are typically made of smallest pitch of 1λ for size reduction. For example, if the Flash technology node is made of 45 nm, then L2=L3=1%=45 nm. Common active region has a width W1. Flash control gate has a wing width W2 having an additional spacing W3 over the active region width W1.

The reason to use the smallest pitch of L3 for flash cell's channel length is because the voltage drop between MC1 drain node and source node are identical during the FN-channel Erase and SFwrite operations. For example, during SBPI operation, the MC cell's drain and source at 7V if it is the non-selected program cell and is 0V if it is the selected program cell. In any case, both drain and source nodes of MC1 and MC2 are identical, thus the minimum channel length can be used in respective FString1 and FString2.

Unlike MC1 and LC2 using 1λ channel length, the HV devices of ST1, ST2, ST3 and ST4 have to use a much larger channel length of L1 to avoid the 7V $V_{DS}$ punch-through issue induced by the SBPI scheme during the SFwrite operation. But in this invention, the source node of ST2 or ST4 is coupled to VDD. Thus the $V_{ds}$ drop across ST2 and ST4 are reduced by VDD, which is $V_{DS}$=7V-VDD. If VDD is 3V, then $V_{DS}$=4V of ST2 and ST4 during the SFwrite SBPI operation. Thus the decision of L1 for ST2 and ST4 is decided by $V_{DS}$ to sustain the HV of 4V without any leakage from one of the drain nodes of ST2 and ST4 to the one of the source nodes of FSL1 or FSL2 because only ONE is coupled to 7V of the paired M1 and MC2 flash cells during SFwrite operation. Similarly, only one of SQ and is coupled to VDD during the SFwrite operation. Thus only one of St1 and ST3 would endure the $V_{DS}$ of 7V-VDD, which is 4V if VDD=3V.

As a result, all ST1 and ST2 or ST3 and ST4 will endure the identical 4V $V_{ds}$ drop if the SBPI voltage of 7V is induced in the MC channel during SFwrite operation. Therefore, all ST1, ST2, ST3 and ST4 need to have a larger but same channel length of L1. Practically, the L1 channel length is kept at ≥90 nm for no leakage from MC1 channel to SQ and FS1 or MC2 channel to SQB and FSL2.

When SBPI scheme is used in Flash cell channel region, the ramp of VPP on the FWL would boost the MC channel to a high voltage. The flash cell's channel is full of the induced charges but will be soon distributed with active areas of the top and bottom source and drain regions of each Program-Inhibit MC cell. If the FWL HV and coupling ratio are not sufficient high plus the MC channel region is smallest (1λ× W1), then the SBPI voltage will be less than 7V. In worst-case, it may be below 5V. As a result, the SBPI method would fail, thus the MC flash cell would get the FWL wordline HV disturbed. The MC's Vt cannot stay at the erased Vt of Vt0. The Vt0 would be gradually increased to an undesired value above 0V. Thus the margin of ΔVt=Vt1−Vt0 would be too small, and the Logic state of the paired Flash cells, MC1 and MC2, would be difficult to be sensed correctly during the FSwrite operation. Thus the SFwrite operation would be failed for the NVSRAM cell under the conventional layout shown in FIG. 9A.

Figure 9B:
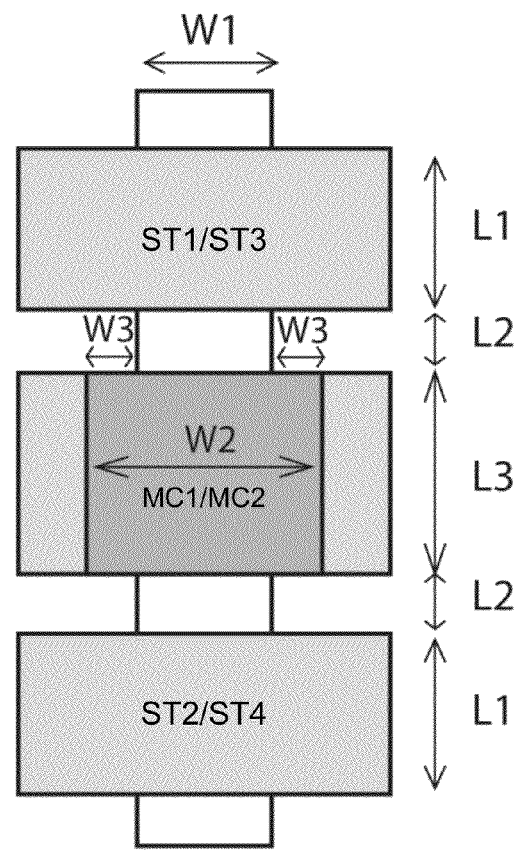
FIG. 9B is an exemplary 2-poly channel-field layout of a 3T FString cell with an enlarged flash channel length according to a specific embodiment of the present invention.

In view of above potential SBPI failure, the present invention discloses a simple but very effective method to induce more HV SBPI charges in non-selected program Flash channel so that the SBPI would not fail. FIG. 9B is an exemplary 2-poly channel-field layout of a 3T FString cell with an enlarged flash channel length according to a specific embodiment of the present invention. As shown, for substantially the same 3T Flash string, the channel length of the MC1 or MC2 flash cell has been increased to a larger L3 but preferably keep other layout rules such as W1, L1 and L2 of each 3T FString no changes. In a preferred embodiment, the MC1 and MC2 channel length L3 is selected to be 2 times of the cell gap L2.

Because flash cell channel length increases, then the overlapping area of L3 Poly and W1 active region is increased in the same scale of 2 times. Thus, the coupling effect is increased by 2 times. Thus the induced coupling charges are increased by 2 times as well. Since L2 spacing between ST1 and ST2 to MC gate area are not changed, thus the SBPI voltage would be increased in accordance with the following equation:

$$\Delta V_{SBPI} = VPP \times \text{Ratio} \times L3/(2L2+L3), \text{ with } VPP=18V, \text{Ratio}=0.6$$

Thus in prior art, L3=L2, $\Delta V_{SBPI1}$=VPP×Ratio×(1/3)= 3.6V with initial VDD−Vt=3V−0.7V=2.3V, resulting in $V_{SBPI1}$=2.3V+3.6V=5.9V.

In the specific embodiment of the present invention, L3=2L2, then $V_{SBPI2}$=VPP×Ratio×(2/4)+2.3V=2.3V+ 5.4V=7.7V. Thus $\Delta V_{SBPI}$=$V_{SBPI2}$−$V_{SBPI1}$=7.7V−5.9V=1.8V.

The FString SBPI simulation results (to be seen in FIG. 11) confirm that the initial voltage of VDD−Vt in MC channel is 1.0V denoted as waveform 1 in the chart 1000 and VDD=1.8V is denoted as waveform 2, assuming that Vt=0.8V and VPP=14V. The simulation results are:

The SBPI voltage=5.7V, (waveform 4) under a condition of L3=L2

The SBPI voltage=7.2V, (waveform 5) under a condition of L3=2×L2

The SBPI voltage=8.0V, (waveform 6) under a condition of L3=3×L2

It shows the $V_{SBPI}$ is increased proportional to the increase in MC's channel Length of L3.

In the 2-poly flash cell layout, the poly1 floating-gate extends out on both left and right fields of Flash channel area with a wing width of W3. In 1-poly SONOS or MOLOS charge-trapping flash cell structure, W3=0 because no poly1 layer. The top and bottom 1-poly Select transistors are formed at the overlapping area made by Poly2 and Active layers with a short between Poly2-Control-gate and Poly1-floating gate layers. The channel widths of these three devices are W1 and the channel length of top and bottom Select transistor is kept the same with L1, which is large to avoid the Flash cell channel punch-through effect during the 7V SBPI operation. The channel length of MC flash transistor can be made of 1λ because there is no program punch-through concern. Since the MC flash transistor channel length is made of 1λ, thus the length of 3T string is shorter.

FIG. 9B further shows another exemplary 2-poly layout of each 3T FString cell with a larger channel length of L3 for flash cell MC, regardless of PMOS string or NMOS string. In each 3T FString, other transistors of top and bottom Select transistors are kept identical with same channel length of L1 and Spacing L2 and width W1. In such manner, the flash cell's coupling area from poly2-gate to poly1-floating gate of each flash cell has been increased, thus the SBPI coupling is improved.

FIG. 10A is an exemplary 2-poly layout of a 5T FString cell with a normal flash channel length in a prior art. Again, presenting the prior art layout here is merely as part of inventive process. As shown, one 5T FString layout (based on FIG. 4A) with a minimum channel length of 1λ for DMC1, MC1, and DMC2 or for DMC3, MC2, and DMC4 if the induced SBPI HV charges are sufficient from ½ VPP DFSL1 and DFSL2 and full VPP on FWL. Note, during the FSwrtite operation, the gate signals of DFSL1 and DFSL2 are coupled to ½ of VPP to help induce HV charges in the channels of DMC cells. In this prior art layout, L2=L3=L4=L5 = L5=L7=L8=1λ, but L1=L9≥90 nm.

Again, the drawback of potential SBPI operation failure due to poor coupling ratio from poly2-gate to poly1-floating gate of each flash cell can be corrected by specifically increasing flash cell's channel length while keeping those dummy cells channel lengths unchanged. FIG. 10B is an exemplary 2-poly channel-field layout of a 5T FString cell with an enlarged flash channel length and normal dummy flash channel lengths according to a specific embodiment of the present invention. As shown, one of preferred 5T FString layout according to an embodiment of the present invention is provided with a minimum channel length of 1λ for DMC1 and DMC2 or for DMC3 but an enlarged channel length of L5. In this case, the preferred flash channel length L5=2×(L2+L3+L4) if L2=L3=L4=L6=L7=L8. All gate signals DFWL1 and DFSL2 are tied to VDD during the FSwrite operation but ½ of VPP during the SFwriting operation.

Figure 11:
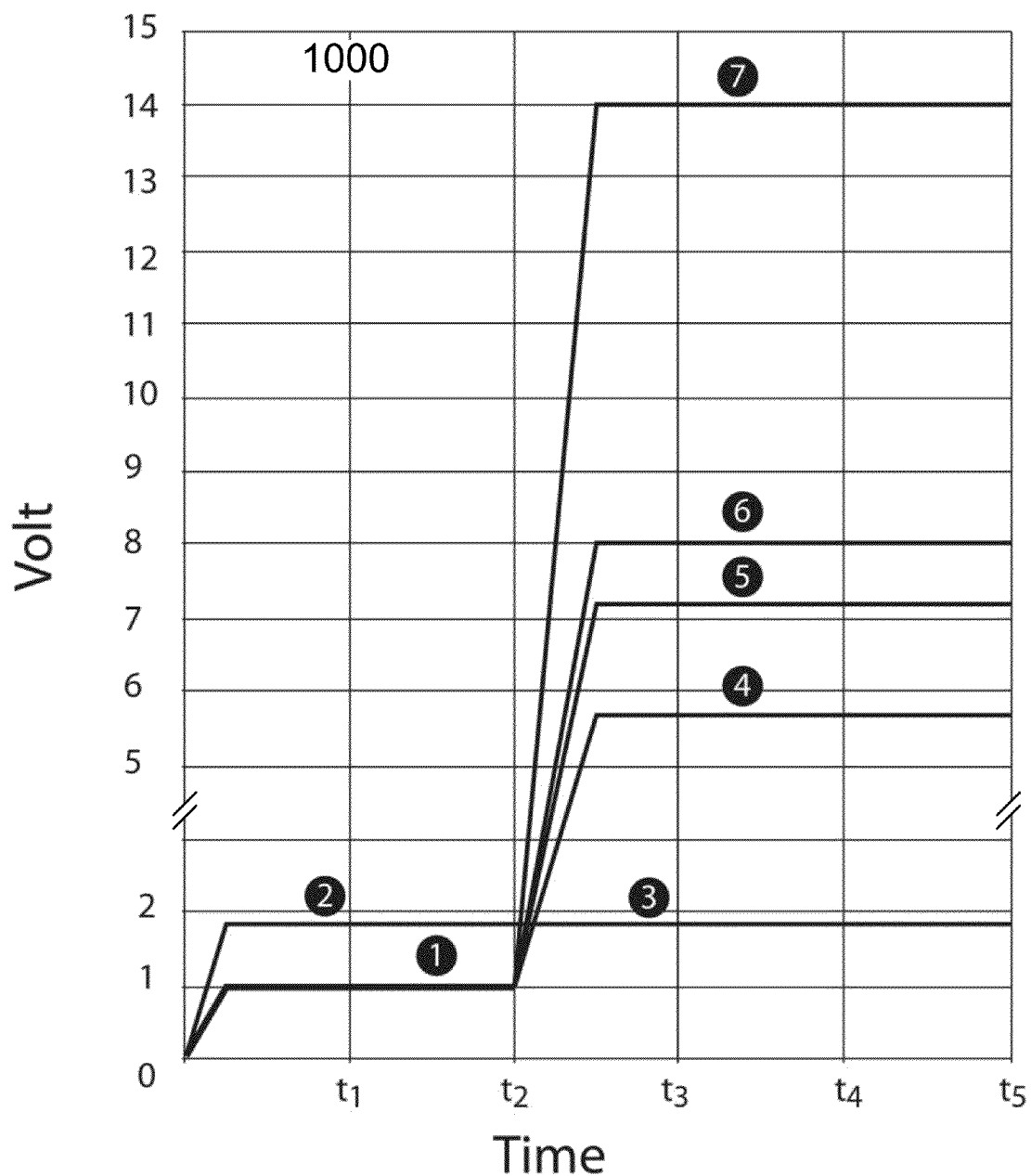
FIG. 11 is a diagram showing simulation results in a 3T flash cell's channel region generated by SBPI scheme operation performed in different channel lengths of a 2-poly flash cell according to a specific embodiment of the present invention.

FIG. 11 is a diagram showing simulation results in a 3T flash cell's channel region generated by SBPI scheme operation performed in different channel lengths of a 2-poly flash cell according to a specific embodiment of the present invention. This diagram is merely an example, which should not unduly limit the scope of the claims herein. As shown, the chart 1000 shows a simulated SBPI voltage generated using various channel length for 2-poly flash cells under certain operation conditions of programming voltage VPP and designated flash cell threshold voltage level Vt. Time axis indicates a start of programming operation at t2 with initial channel voltage VDD−Vt=1.0V assumed that VDD=1.8V and Vt=0.8V.

After the increase MC flash cell's channel length, one disadvantage is the resistance of MC1 or MC2 is also increased accordingly. For example, if MC's channel length is increased by two times, then the MC's resistance is also increased two times. As a result, it would increase the difficulty to write the Flash logic state into each corresponding SRAM. In other words, the higher chance of failed FSwrite operation. The increase in MC's channel length has improved the SFwrite operation but conversely the MC's channel length increase degrades the FSwrite operation. The reason of FSwrite degradation is because the FString's resistance is increased so that it is electrically weaker to pull down the SRAM's SQ or SQB to ground.

In view of that drawback to FSwrite, a resistance increase in PMOS load of SRAM's two Inverters INV1 and INV2 is needed. But any resistance increase for the paired PMOS load of two Inverters would increase the layout size which is not desired. Embodiments of the present invention as described in FIG. 1A, FIG. 1B, FIGS. 5, 6, and 8, to add a resistor ResVDD with high resistance value to connect to the common SRAM VDD power line connected to each SRAM cell. Therefore, the effective layout of each SRAM cell size would not be increased while at the same time the enlarged Flash cell channel length effectively increase the coupling area for improving Program and SBPI Program-Inhibit operation of the NVSRAM cell and array provided in the present invention.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A Nonvolatile SRAM (NVSRAM) cell with marginal threshold level detection, the NVSRAM cell comprising:
   a SRAM cell comprising a first inverter having a first output node and a second inverter having a second output node, the first output node and the second output node being coupled to a first word line and two bit lines respectively via a first access transistor and a second access transistor, the first inverter and the second inverter being respectively associated with a first current and a second current sharing a common power line configured to add an adjustable resistor;
   a first Flash cell comprising a first string having at least a first flash transistor sandwiched by a first select transistor and a second select transistor connected in series from a first drain terminal to a first source terminal, and comprising a second string having a second flash transistor sandwiched by a third select transistor and a fourth select transistor connected in series from a second drain terminal to a second source terminal, the first select transistor and the third select transistor being commonly gated by a first select control signal, the second select transistor and the fourth select transistor being commonly gated by a second select control signal, the first flash transistor and the second flash transistor having their gates commonly coupled to a second word line signal to control a third current through the first string from the first drain terminal to the first source terminal and a fourth current through the second string from the second drain terminal to the second source terminal, the first source terminal and the second source terminal being respectively coupled to a first source line and a second source line;
   wherein the first drain terminal and the second drain terminal of the first Flash cell are coupled to either the first output node or the second output node of the SRAM cell to form a differential amplifier having one paired driver device made by the first string and the second string of the first Flash cell and one paired load device made by the first inverter and the second inverter of the SRAM cell, the second word line being configured to provide one paired input of the differential amplifier for yielding one paired output respectively to the first output node and the second output node, the adjustable resistor being configured to be substantially larger than an effective resistance of either the first string or the second string for providing a greater than 3:1 ratio between a largest one of the third current and the fourth current over a largest one of the first current and the second current when writing a first logic state associated with a combination of two threshold levels of the first flash transistor and the second flash transistor into a second logic state associated with a combination of either a VSS=0V or a low-voltage VDD level at the first output node and the second output node.

2. The NVSRAM cell of claim 1 further comprising a Bridge device including a first, second, third, and fourth LV transistor for connecting the first output node and the second output node of the SRAM cell respectively through two cross routes to the first drain terminal and the second drain terminal of the Flash cell, wherein the first and the third LV transistors are commonly gated by a FSwrite control line and the second and the fourth LV transistors are commonly gated by a SFwrite control line; wherein the first and the second LV transistors have a first common drain node connected to the first output node of the SRAM cell; the second and the third LV transistors have a first common source node connected to the first drain terminal of the first Flash cell; wherein the third and the fourth LV transistors have a second common drain node connected to the second output node of the SRAM cell; the first and the fourth LV transistors have a second common source node connected to the second drain terminal of the first Flash cell.

3. The NVSRAM cell of claim 2 wherein the adjustable resistor being configured to be substantially larger than an effective resistance of either the first string plus one of the second LV transistor and the third LV transistor in the Bridge circuit or the second string plus one of the first LV transistor and the fourth LV transistor for having a greater than 3:1 ratio between a largest one of the third current and the fourth current over a largest one of the first current and the second current when writing a first logic state of the first Flash cell into a second logic state of the SRAM cell.

4. The NVSRAM cell of claim 1 wherein the adjustable resistor comprises a PN-paired circuit made of a PMOS transistor coupled with a NMOS transistor connected between the common power line and an on-chip VDD line, wherein the PMOS transistor is associated with a first ratio between a first channel width and a first channel length, the NMOS transistor is associated with a second ratio between a second channel width and a second channel length, the first ratio and the second ratio being configured to be substantially smaller than 1/10.

5. The NVSRAM cell of claim 1 wherein the adjustable resistor comprises a PN-paired circuit made of a PMOS transistor coupled with a NMOS transistor connected between the common power line and an on-chip VDD line, wherein the PMOS transistor is biased to be in a bare on-state with a gate-to-source voltage difference by 0.5V or smaller and the NMOS transistor is biased to be in an off-state.

6. The NVSRAM cell of claim 1 wherein the first Flash cell is subjected to a detection operation for determining the first flash transistor in the first Flash cell having a marginally-erased threshold level after an erase operation,
   wherein the detection operation includes
      loading the SRAM cell with a logic state "0" by setting the first output node at VSS=0V and the second output node at VDD,
      applying 0V voltage to the second word line,
      tuning the adjustable resistor to high resistance compared to an effective resistance of the second string,
      coupling the first source line to 0.5V and the second source line to VSS,
      determining the first flash transistor having an erased threshold level at least smaller than –0.5V if the SRAM cell logic state "0" is flipped to "1" state due to the fourth current through the second flash transistor is greater than the third current through the first flash transistor; and
      determining the first flash transistor having a marginally-erased threshold level at least equal to 0V if the SRAM cell logic state remains at "0".

7. The NVSRAM cell of claim 6 wherein the detection operation further comprises increasing the voltage above 0V applied to the second word line to a final value such that the SRAM cell logic state is flipped to "1" and the final value corresponds to a true threshold level of the first flash transistor that is marginally erased and is just identified.

8. The NVSRAM cell of claim 6 wherein the first Flash cell is further subjected to a detection operation for determining the second flash transistor in the first Flash cell having a marginally-erased threshold level after the erase operation,
- wherein the detection operation includes
- loading the SRAM cell with a logic state "1" by setting the first output node at VDD and the second output node at VSS=0V,
- applying 0V voltage to the second word line,
- tuning the adjustable resistor to high resistance compared to an effective resistance of the second string,
- coupling the first source line to VSS and the second source line to 0.5V,
- determining the second flash transistor having an erased threshold level at least smaller than 0V if the SRAM cell logic state "1" is flipped to "0" state due to the third current through the first flash transistor is greater than the fourth current through the second flash transistor; and
- determining the second flash transistor having a marginally-erased threshold level at least greater than 0V if the SRAM cell logic state remains at "1".

9. The NVSRAM cell of claim 6 wherein the detection operation comprises setting the first source line and the second source line with a voltage difference greater than 0.5V.

10. The NVSRAM cell of claim 1 wherein the first Flash cell is subjected to a detection operation for determining the second flash transistor in the first Flash cell having a marginally-programmed threshold level after programming the first flash transistor and the second flash transistor in "X" state so that both threshold levels are supposed to be at a same designated value of 2V,
- wherein the detection operation includes
- loading the SRAM cell with a logic state "0" by setting the first output node at VSS=0V and the second output node at VDD,
- applying 2V voltage to the second word line,
- tuning the adjustable resistor to high resistance compared to an effective resistance of the second string,
- coupling the first source line to 0.5V and the second source line to VSS,
- determining the second flash transistor having a marginally-programmed threshold level at least smaller than 2V if the SRAM cell logic state "0" is flipped to "1" state due to the fourth current through the second flash transistor is greater than the third current through the first flash transistor.

11. The NVSRAM cell of claim 1 wherein the first Flash cell is subjected to a detection operation for determining the first flash transistor in the first Flash cell having a marginally-programmed threshold level after programming the first flash transistor and the second flash transistor in "X" state so that both threshold levels are supposed to be at a same designated value of 2V,
- wherein the detection operation includes
- loading the SRAM cell with a logic state "1" by setting the first output node at VDD and the second output node at VSS=0V,
- applying 2V voltage to the second word line,
- tuning the adjustable resistor to high resistance compared to an effective resistance of the second string,
- coupling the first source line to VSS and the second source line to 0.5V,
- determining the first flash transistor to have a marginally-programmed threshold level at least smaller than 2V if the SRAM cell logic state "1" is flipped to "0" state due to the third current through the first flash transistor is greater than the fourth current through the second flash transistor.

12. The NVSRAM cell of claim 1 wherein each of the first flash transistor and the second flash transistor is one transistor selected from a 2-poly NMOS high-voltage floating-gate transistor, a 1-poly charge-trapping type (SONOS or MONOS) high-voltage transistor, a 2-poly PMOS high-voltage floating-gate transistor, and is associated with a channel threshold level that is assigned to −2.0V for an erased state and to +2.0V for a programmed state.

13. The NVSRAM cell of claim 1 further comprising a second Flash cell including two flash strings substantially identical to the first string and the second string in the first Flash cell, the two flash strings having a pair of top select transistors commonly gated by a third select control signal, a pair of flash transistors commonly gated by a third word line, and a pair of bottom select transistors commonly gated by a fourth select control signal.

14. The NVSRAM cell of claim 13 wherein the first Flash cell and the second Flash cell are coupled to the SRAM cell in parallel by sharing the first/second drain terminal and the first/second source terminal but having separate word line control to respective pair of flash transistors, allowing alternative erase operation and program operation.

15. The NVSRAM cell of claim 14 wherein either the first or second Flash cell is disabled by grounding the first or fourth select control signal and enabled by coupling the first or fourth select control signal to VDD, thereby allowing the SRAM cell logic data stored in the first output node and the second output node to be programmed into a paired flash transistors in the enabled one Flash cell or allowing the logic state stored in the paired flash transistors in the enabled one Flash cell to be recalled into the SRAM cell.

16. The NVSRAM cell of claim 1 wherein each of the first string and the second string includes two dummy flash transistors respectively gated by two dummy word lines so that the first/second flash transistor is respectively sandwiched between the two dummy flash transistors.

17. The NVSRAM cell of claim 16 wherein the NVSRAM cell is subjected to a flash erase operation by
- setting the first select control signal to VSS=0V and the second select control signal to VDD;
- setting the first source line and the second source line to VSS;
- applying a high negative voltage VNN to the second word line and the two dummy word lines to erase all dummy flash transistors and the first flash transistor and the second flash transistor in the first Flash cell.

18. The NVSRAM cell of claim 16 wherein the NVSRAM cell is subjected to a programming operation from the SRAM cell to the first Flash cell by
- disconnecting the common power line from the adjustable resistor;
- setting the first select control signal to VSS=0V and the second select control signal to VDD;
- initializing channel threshold levels of the first flash transistor and the second flash transistor by setting the two dummy word lines to VDD, the second word line to VSS, the first select control signal to VSS=0V, the second select control signal to VDD, the first and second source lines to VDD;
- loading the SRAM cell with a logic state "0" by setting the first output node to VSS and the second output node to VDD;
- changing the first select control voltage to VDD and the second word line from VDD to a positive high voltage VPP so that the first flash transistor is inhibited by a coupling voltage to maintain its initial threshold level while the second flash transistor is programmed to raise its initial threshold level at a negative value to a programmed threshold level at a positive value.

19. The NVSRAM cell of claim 16 wherein each of the first string and the second string including a flash transistor sandwiched by two dummy flash transistors between two select transistors connected in series further comprises a 5-transistor string cell layout configured to set a first channel length of the flash transistor being at least larger a combined length of drain and source N+junction areas between the flash transistor and the select transistors respectively extended by the two dummy flash transistors having a minimum pitch size, and to set a second channel length of each select transistor at 90 nm or greater.

20. The NVSRAM cell of claim 1 wherein each of the first string and the second string of the first Flash cell comprises a 3-transistor cell layout of a flash transistor between two select transistors connected in series, the cell layout being configured to set a first channel length of the flash transistor being at least larger than a combined length of drain and source N+junction areas between the flash transistor and a corresponding one select transistor, and to set a second channel length of each select transistor being selected to be 90 nm or greater.

21. A 14-transistor NVSRAM cell for flexible recall and store operations, the 14T NVSRAM cell comprising:
a SRAM cell comprising a first inverter associated with a first data node and a second inverter associated with a second data node, the first data node and the second data node being coupled to a first word line and two complementary bit lines respectively via a first access transistor and a second access transistor;
a Flash cell comprising a first string from a first drain terminal to a first source terminal and a second string from a second drain terminal to a second source terminal, the first string having a first select transistor, a first flash transistor, a second flash transistor, and a second select transistor connected in series, the second string having a third select transistor, a third flash transistor, a fourth flash transistor, and a fourth select transistor connected in series, the first flash transistor and the third flash transistor being commonly gated by a second word line signal, the second flash transistor and the fourth flash transistor being commonly gated by a third word line, the first select transistor and the third select transistor being commonly gated by a first select control signal, the second select transistor and the fourth select transistor being commonly gated by a second select control signal, the first source terminal and the second source terminal being respectively coupled to a first source line and a second source line;
wherein the first drain terminal and the second drain terminal of the Flash cell are respectively coupled to the first data node or the second data node of the SRAM cell, a first pair of the first flash transistor and the third flash transistor and a second pair of the second flash transistor and the fourth flash transistor are alternatively erased and programmed for storing either an old logic data or an updated logic data associated with a combination of two voltage levels at the first data node and the second data node of the SRAM cell during both a Store operation and a Recall operation.

22. The 14T NVSRAM cell of claim 21 wherein each of the first flash transistor the second flash transistor, the third flash transistor, and the fourth flash transistor is a 2-poly NMOS high-voltage floating-gate transistor associated with a channel threshold level that is assigned to Vt0=−2.0V for an erased state and to Vt1=+2.0V for a programmed state.

23. The 14T NVSRAM cell of claim 22 wherein the Flash cell is subjected to an erase operation for erasing only the first pair of the first flash transistor and the third flash transistor under a bias condition of
setting the first select control signal to VSS=0V and the second select control signal to VDD;
setting the first source line and the second source line to VSS;
setting the first word line to VSS or a 'don't care' state;
setting the second word line to a negative voltage level VNN ranging from −15 to −18V; and
setting the third word line to be greater than Vt1 plus a 0.5V margin;
wherein the threshold levels of the first flash transistor and the third flash transistor are assigned to an erased level Vt0=−2.0V while wherein the threshold levels of the second flash transistor and the fourth flash transistor remain unchanged.

24. The 14T NVSRAM cell of claim 22 wherein the Flash cell is subjected to an erase operation for erasing only the second pair of the second flash transistor and the fourth flash transistor under a bias condition of
setting the first select control signal to VSS=0V and the second select control signal to VDD;
setting the first source line and the second source line to VSS;
setting the first word line to VSS;
setting the second word line to either VDD or VSS; and
setting the third word line to a negative voltage level VNN ranging from −15V to −18V;
wherein the threshold levels of the second flash transistor and the fourth flash transistor are assigned to an erased level Vt0=−2.0V while the threshold levels of the first flash transistor and the third flash transistor remain unchanged.

25. The 14T NVSRAM cell of claim 22 wherein the Store operation comprises a high-voltage operation for programming only the first pair of the first flash transistor and the third flash transistor under a bias condition of
setting the first select control signal to VDD and the second select control signal to VSS=0V;
setting the first source line and the second source line to VDD;
setting the first word line to VSS with a loaded SRAM logic state "0" by setting the first data node to VSS and the second data node to VDD;
setting the second word line to a high positive level VPP ranging from 15V to 18V;
setting the third word line to any value selected from VSS, VDD, and 0.5VPP;
wherein the first flash transistor is programmed to Vt1 level while the second flash transistor is program-inhibited to stay at Vt0 level.

26. The 14T NVSRAM cell of claim 22 wherein the Store operation comprises a high-voltage operation for programming only the second pair of the second flash transistor and the fourth flash transistor under a bias condition of
setting the first select control signal to VDD and the second select control signal to VSS=0V;
setting the first source line and the second source line to VDD;
setting the first word line to VSS with a loaded SRAM logic state "0" by setting the first data node to VSS and the second data node to VDD;
setting the second word line to a voltage greater than Vt1 plus a 0.5V margin;

setting the third word line to a positive level VPP ranging from 15V to 18V;

wherein the second flash transistor is programmed to Vt1 level while the fourth flash transistor is program-inhibited to stay at Vt0 level.

27. The 14T NVSRAM cell of claim 22 wherein the Recall operation comprises a low-voltage operation to load a logic state "0" corresponding to a threshold level vt0 assigned to the first flash transistor and Vt1 assigned to the third flash transistor of the Flash cell into the SRAM cell upon a power-on cycle under a bias condition of setting the first select control signal and the second select control signal to VDD;

setting the first source line and the second source line to VDD;

setting the first word line to VSS=0V;

setting the second word line to VDD and the third word line to a voltage greater than Vt1 plus a 0.5V margin;

wherein the SRAM cell is set at logic state "1" as the first data node is set to VDD and the second data node is set to VSS due to a higher current pulling up from the first source line through the first string than that from the second source line through the second string.

28. The 14T NVSRAM cell of claim 22 wherein the Recall operation comprises a low-voltage operation to load a logic state "0" corresponding to a threshold level vt0 assigned to the second flash transistor and Vt1 assigned to the fourth flash transistor of the Flash cell into the SRAM cell upon a power-on cycle under a bias condition of setting the first select control signal and the second select control signal to VDD;

setting the first source line and the second source line to VDD;

setting the first word line to VSS=0V;

setting the second word line to VDD and the third word line to a voltage greater than Vt1 plus a 0.5V margin;

wherein the SRAM cell is set at logic state "1" as the first data node is set to VDD and the second data node is set to VSS due to a higher current pulling-up from the first source line through the first string than that from the second source line through the second string.

29. The 14T NVSRAM cell of claim 21 wherein each of the first flash transistor the second flash transistor, the third flash transistor, and the fourth flash transistor is a 1-poly charge-trapping type (SONOS or MONOS) high-voltage transistor associated with a channel threshold level that is assigned to Vt0=−2.0V for an erased state and to Vt1=−2.0V for a programmed state.

30. The 14T NVSRAM cell of claim 29 wherein the Flash cell is subjected to an erase operation for erasing only the first pair of the first flash transistor and the third flash transistor under a bias condition of setting the first select control signal to VSS=0V and the second select control signal to VDD;

setting the first source line and the second source line to VSS;

setting the first word line to VSS;

setting the second word line to a negative voltage level VNN of about −10V; and setting the third word line to be greater than Vt1 plus a 0.5V margin;

wherein the threshold levels of the first flash transistor and the third flash transistor are assigned to an erased level Vt0=−2.0V while wherein the threshold levels of the second flash transistor and the fourth flash transistor remain unchanged.

31. The 14T NVSRAM cell of claim 29 wherein the Recall operation comprises a low-voltage operation to load a logic state "0" corresponding to a threshold level vt0 assigned to the second flash transistor and Vt1 assigned to the fourth flash transistor of the Flash cell into the SRAM cell upon a power-on cycle under a bias condition of setting the first select control signal to VSS;

setting the first source line and the second source line to VSS=0V;

setting the first word line to VSS;

setting the second word line to a voltage smaller than −Vt1 minus a 0.5V margin and the third word line to VSS;

wherein the SRAM cell is set at logic state "0" as the first data node is set to VSS and the second data node is set to VDD due to a higher current pulling-down from the first source line through the first string than that from the second source line through the second string.

32. The 14T NVSRAM cell of claim 29 wherein the Store operation comprises a high-voltage operation for programming only the first pair of the first flash transistor and the third flash transistor under a bias condition of setting the first select control signal to VSS=0V and the second select control signal to VDD;

setting the first source line and the second source line to VDD;

setting the first word line to VSS with a loaded SRAM logic state "0" by setting the first data node to VSS and the second data node to VDD;

setting the second word line to a positive level VPP of about 10V;

setting the third word line to any voltage selected from VDD, VSS, and 0.5VPP;

wherein the first flash transistor is programmed to Vt1 level while the third flash transistor is program-inhibited to stay at Vt0 level.

33. The 14T NVSRAM cell of claim 21 wherein each of the first flash transistor the second flash transistor, the third flash transistor, and the fourth flash transistor is a 2-poly PMOS high-voltage floating-gate transistor associated with a channel threshold level that is assigned to Vt0=−2.0V for an erased state and to Vt1=+2.0V for a programmed state.

34. The 14T NVSRAM cell of claim 33 wherein the Recall operation comprises a low-voltage operation to load a logic state "0" corresponding to a threshold level vt0 assigned to the first flash transistor and Vt1 assigned to the third flash transistor of the Flash cell into the SRAM cell upon a power-on cycle under a bias condition of setting the first select control signal to VSS;

setting the first source line and the second source line to VSS=0V;

setting the first word line to VSS;

setting the second word line to VSS and the third word line to a voltage smaller than −Vt1 minus a 0.5V margin;

wherein the SRAM cell is set at logic state "0" as the first data node is set to VSS and the second data node is set to VDD due to a higher current pulling-down from the first source line through the first string than that from the second source line through the second string.

35. The 14T NVSRAM cell of claim 33 wherein the Recall operation comprises a low-voltage operation to load a logic state "0" corresponding to a threshold level vt0 assigned to the second flash transistor and Vt1 assigned to the fourth flash transistor of the Flash cell into the SRAM cell upon a power-on cycle under a bias condition of setting the first select control signal to VSS;

setting the first source line and the second source line to VSS=0V;

setting the first word line to VSS;
setting the second word line to a voltage smaller than –Vt1 minus a 0.5V margin and the third word line to VSS;
wherein the SRAM cell is set at logic state "0" as the first data node is set to VSS and the second data node is set to VDD due to a higher current pulling-down from the first source line through the first string than that from the second source line through the second string.

36. The 14T NVSRAM cell of claim 33 wherein the Store operation comprises a high-voltage operation for programming only the first pair of the first flash transistor and the third flash transistor under a bias condition of
setting the first select control signal to VSS=0V and the second select control signal to VDD;
setting the first source line and the second source line to VDD;
setting the first word line to VSS with a loaded SRAM logic state "0" by setting the first data node to VSS and the second data node to VDD;
setting the second word line to a positive level VPP ranging from 15V to 18V;
setting the third word line to any voltage selected from VDD, VSS, and 0.5VPP;
wherein the first flash transistor is programmed to Vt1 level while the third flash transistor is program-inhibited to stay at Vt0 level.

37. The 14T NVSRAM cell of claim 33 wherein the Store operation comprises a high-voltage operation for programming only the second pair of the second flash transistor and the fourth flash transistor under a bias condition of
setting the first select control signal to VSS=0V and the second select control signal to VDD;
setting the first source line and the second source line to VDD;
setting the first word line to VSS with a loaded SRAM logic state "0" by setting the first data node to VSS and the second data node to VDD;
setting the third word line to a positive level VPP ranging from 15V to 18V;
setting the second word line to any voltage selected from VDD, VSS, and 0.5VPP;
wherein the second flash transistor is programmed to Vt1 level while the fourth flash transistor is program-inhibited to stay at Vt0 level.

38. A NVSRAM chip capable of flexibly detecting defect bits in the unit of bit, page, and chip, the NVSRAM chip comprising,
an NVSRAM memory array formed by MxN NVSRAM cells in a matrix of M rows and N columns, each NVSRAM cell comprising a SRAM cell coupled to a Flash cell having two flash strings corresponding to a pair of flash transistors, each row forming a page commonly associated with a SRAM word line and a VSS ground line, a SRAM Vdd power line, a pair of select gate controls, a Flash word line, and a Flash source line dividable to connect respectively to the two flash strings in each Flash cell in each NVSRAM cell, each column being coupled with a pair bit lines coupled respectively to a first output node and a second output node of each SRAM cell in each NVSRAM cell;
a SRAM X-decoder coupled with the NVSRAM memory array from X-direction to provide per each row a decoding signal to the SRAM word line and a grounding line;
a Flash X-decoder coupled with the NVSRAM memory array from X-direction to provide per each row a variable signal for the Flash word line, control signals for the pair of select gate controls, and one or two bias levels to the dividable Flash source line, and to provide an on-chip VDD power supply configured to couple with each SRAM Vdd power line via a PN-paired device as an adjustable resistor;
a Match decoder coupled to the Flash X-decoder for further providing a match signal per each row sent through the Flash source line to each NVSRAM cell;
a Y-decoder configured to provides per column a pair of decoding bits for the pair of bit lines;
a SRAM sense amplifier;
an I/O buffer device;
a CE buffer device;
an OE buffer device; and
an Address buffer;
wherein the NVSRAM memory array is subjected to a flash status verification operation configured for flexibly detecting defect bits of one or more flash transistors and screening out low marginal threshold level cells in the whole NVSRAM memory array.

39. The NVSRAM chip of claim 38 wherein the NVSRAM cell comprises,
a SRAM cell comprising a first inverter having a first output node and a second inverter having a second output node, the first output node and the second output node being coupled to the SRAM word line and the pair of bit lines respectively via a first access transistor and a second access transistor, the first inverter and the second inverter being respectively associated with a first current and a second current sharing a common SRAM Vdd power line configured to add an adjustable resistor;
a first Flash cell comprising a first string having at least a first flash transistor sandwiched by a first select transistor and a second select transistor connected in series from the first drain terminal to a first source terminal, and comprising a second string having at least a second flash transistor sandwiched by a third select transistor and a fourth select transistor connected in series from a second drain terminal to a second source terminal, the first select transistor and the third select transistor being commonly gated by a first select gate control signal, the second select transistor and the fourth select transistor being commonly gated by a second select gate control signal, the first flash transistor and the second flash transistor having their gates commonly coupled to the flash word line to control a third current through the first string from the first drain terminal to the first source terminal and a fourth current through the second string from the second drain terminal to the second source terminal, the first source terminal and the second source terminal being respectively coupled to a first source line and a second source line; and
a Bridge circuit including a first, second, third, and fourth LV transistor for connecting the first output node and the second output node of the SRAM cell respectively through two cross routes to the first drain terminal and the second drain terminal of the Flash cell, wherein the first and the third LV transistors are commonly gated by a FSwrite control line and the second and the fourth LV transistors are commonly gated by a SFwrite control line; wherein the first and the second LV transistors have a first common drain node connected to the first output node of the SRAM cell; the second and the third LV transistors have a first common source node connected to the first drain terminal of the first Flash cell; wherein the third and the fourth LV transistors have a second common drain node connected to the second output node of the SRAM cell; the first and the fourth LV transistors have a second common source node connected to the second drain terminal of the first Flash cell.

40. The NVSRAM chip of claim 39 further comprising a second Flash cell coupled with the first Flash cell in parallel sharing the SRAM cell, the Bridge circuit, and the first source line and the second source line, the second Flash cell being substantially identical to the first Flash cell and being subjected to an alternative enabling and disabling to allow just one Flash cell to be erased and programmed from the SRAM cell at any one time.

41. The NVSRAM chip of claim 39 wherein each flash transistor in the first Flash cell is one type of transistor selected from a 2-poly NMOS high-voltage floating-gate transistor, a 1-poly charge-trapping type (SONOS or MONOS) high-voltage transistor, a 2-poly PMOS high-voltage floating-gate transistor, and is associated with a channel threshold level that is assigned to $Vt0=-2.0V$ for an erased state and to $Vt1=+2.0V$ for a programmed state.

42. The NVSRAM chip of claim 38 wherein the flash status verification operation including a marginal Vt0 detection for the first flash transistor and the second flash transistor in the first Flash cell in each NVSRAM cell selected from a page of the NVSRAM memory array after the first flash transistor and the second flash transistor are subjected to an erase operation, the marginal Vt0 detection is performed by
    loading logic state "0" to the SRAM cell of each NVSRAM cell in the page by setting the corresponding first output node at VSS=0V and the corresponding second output node at VDD;
    applying FSwrite control line to VDD, SFwrite control line to VSS;
    applying 0V voltage to the flash word line corresponding to the selected page;
    tuning the corresponding adjustable resistor to high resistance compared to an effective resistance of the second string;
    coupling the corresponding first source line to 0.5V and the corresponding second source line to VSS;
    determining the corresponding first flash transistor having an erased Vt0 threshold level at least smaller than −0.5V if the SRAM cell logic state "0" is flipped to "1" state;
    determining the corresponding first flash transistor having a marginally-erased Vt0 threshold level at least equal to 0V if the SRAM cell logic state remains at "0";
    increasing voltage applied to the flash word line to a final value such that all SRAM cells' logic states are flipped to "1" except one SRAM cell, thereby determining that the true marginal Vt0 threshold level of the first flash transistor associated to said one SRAM cell equals to the final value and that an Address in the selected page of the NVSRAM memory array is just identified.

43. The NVSRAM chip of claim 42 wherein the marginal Vt0 detection is further performed by
    loading a logic state "1" to the SRAM cell of each NVSRAM cell by setting the corresponding first output node at VDD and the corresponding second output node at VSS;
    applying FSwrite control line to VDD, SFwrite control line to VSS;
    applying 0V voltage to the flash word line corresponding to the selected page;
    tuning the corresponding adjustable resistor to high resistance compared to an effective resistance of the second string;
    coupling the corresponding first source line to 0V and the corresponding second source line to 0.5V;
    determining the second flash transistor having an erased Vt0 threshold level at least smaller than 0V if the SRAM cell logic state "1" is flipped to "0" state;
    determining the second flash transistor having a marginally-erased Vt0 threshold level at least greater than 0V if the SRAM cell logic state remains at "1";
    increasing voltage applied to the flash word line to a final value such that all SRAM cells' logic states are flipped to "0" except one SRAM cell, thereby determining that the true marginal Vt0 threshold level of the second flash transistor associated to said one SRAM cell equals to the final value and that an Address in the selected page of the NVSRAM memory array is just identified.

44. The NVSRAM chip of claim 38 wherein the flash status verification operation including a marginal Vt1 detection for the first flash transistor and the second flash transistor in the first Flash cell in each NVSRAM cell selected from a page of the NVSRAM memory array after the first Flash cell are subjected to a programming operation to be an "X" state with both the first flash transistor and the second flash transistor being assigned to a same Vt1 threshold level, the marginal Vt1 detection is performed by
    loading a logic state "0" to the SRAM cell of each NVSRAM cell in the page by setting the first output node at VSS=0V and the second output node at VDD;
    applying FSwrite control line to VDD, SFwrite control line to VSS;
    applying 2V voltage to the flash word line corresponding to the page,
    tuning the adjustable resistor to high resistance compared to an effective resistance of the second string,
    coupling the first source line to 0.5V and the second source line to VSS;
    determining the second flash transistor having a marginally-programmed Vt1 threshold level at least smaller than 2V if the SRAM cell logic state "0" is flipped to "1" state;
    decreasing flash word line voltage from 2V such as all SRAM cells' logic states are flipped to "1" except one SRAM cell, thereby determining that the true marginal Vt1 threshold level of the second flash transistor associated to said one SRAM cell equals to the final value and that an Address in the selected page of the NVSRAM memory array is just identified.

45. The NVSRAM chip of claim 44 wherein the marginal Vt1 detection is further performed by
    loading a logic state "1" to the SRAM cell of each NVSRAM cell in the page by setting the first output node at VDD and the second output node at VSS=0V;
    applying FSwrite control line to VDD, SFwrite control line to VSS;
    applying 2V voltage to the second word line;
    tuning the adjustable resistor to high resistance compared to an effective resistance of the second string;
    coupling the first source line to VSS and the second source line to 0.5V,
    determining the first flash transistor to have a marginally-programmed Vt1 threshold level at least smaller than 2V if the SRAM cell logic state "1" is flipped to "0" state;
    decreasing flash word line voltage from 2V such as all SRAM cells' logic states are flipped to "0" except one SRAM cell, thereby determining that the true marginal Vt1 threshold level of the first flash transistor associated to said one SRAM cell equals to the final value and that an Address in the selected page of the NVSRAM memory array is just identified.

46. The NVSRAM chip of claim 38 wherein the Flash X-decoder is configured to provide at least two separate groups of Flash word lines, each group of Flash word lines including M word lines plus 2M dummy word lines corresponding to a same density of SRAM in the NVSRAM memory array.

47. The NVSRAM chip of claim 38 wherein the NVSRAM cell comprises,
- a SRAM cell comprising a first inverter associated with a first data node and a second inverter associated with a second data node, the first data node and the second data node being coupled to a first word line and two complementary bit lines respectively via a first access transistor and a second access transistor;
- a Flash cell comprising a first string from a first drain terminal to a first source terminal and a second string from a second drain terminal to a second source terminal, the first string having a first select transistor, a first flash transistor, a second flash transistor, and a second select transistor connected in series, the second string having a third select transistor, a third flash transistor, a fourth flash transistor, and a fourth select transistor connected in series, the first flash transistor and the third flash transistor being commonly gated by a second word line signal, the second flash transistor and the fourth flash transistor being commonly gated by a third word line, the first select transistor and the third select transistor being commonly gated by a first select control signal, the second select transistor and the fourth select transistor being commonly gated by a second select control signal, the first source terminal and the second source terminal being respectively coupled to a first source line and a second source line;
- wherein each flash transistor in the Flash cell is one type of transistor selected from a 2-poly NMOS high-voltage floating-gate transistor, a 1-poly charge-trapping type (SONOS or MONOS) high-voltage transistor, a 2-poly PMOS high-voltage floating-gate transistor, and is associated with a channel threshold level that is assigned to Vt0=−2.0V for an erased state and to Vt1=+2.0V for a programmed state.

* * * * *